(12) United States Patent
Sakurai et al.

(10) Patent No.: US 6,354,922 B1
(45) Date of Patent: Mar. 12, 2002

(54) POLISHING APPARATUS

(75) Inventors: Kunihiko Sakurai; Tetsuji Togawa; Nobuyuki Takada; Satoshi Wakabayashi; Kenichiro Saito; Masahiko Sekimoto; Takuji Hayama; Daisuke Koga, all of Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/476,905

(22) Filed: Jan. 3, 2000

(30) Foreign Application Priority Data

Aug. 20, 1999 (JP) .......................................... 11-233983

(51) Int. Cl.[7] ................................................ B24B 7/22
(52) U.S. Cl. ........................... 451/67; 451/288; 451/73
(58) Field of Search ............................. 451/41, 65, 66, 451/67, 73, 287, 288, 290, 5

(56) References Cited

U.S. PATENT DOCUMENTS

| | | | |
|---|---|---|---|
| 3,659,386 A | | 5/1972 | Goetz et al. |
| 3,906,678 A | | 9/1975 | Roth |
| 3,913,271 A | | 10/1975 | Boettcher |
| 4,141,180 A | * | 2/1979 | Gill, Jr. et al. ............... 451/67 |
| 4,680,893 A | | 7/1987 | Cronkhite et al. |
| 5,232,875 A | | 8/1993 | Tuttle et al. |
| 5,329,732 A | | 7/1994 | Karlsrud et al. |
| 5,551,986 A | | 9/1996 | Jain |
| 5,554,064 A | | 9/1996 | Brievogel et al |
| 5,562,524 A | | 10/1996 | Gill, Jr. |
| 5,616,063 A | | 4/1997 | Okumura et al. |
| 5,618,227 A | | 4/1997 | Tsutsumi et al. |
| 5,649,854 A | | 7/1997 | Gill, Jr. |
| 5,655,954 A | * | 8/1997 | Oishi et al. ................... 451/67 |
| 5,679,059 A | * | 10/1997 | Nishi et al. ............. 451/290 X |
| 5,718,618 A | | 2/1998 | Guckel et al. |
| 5,738,574 A | * | 4/1998 | Tolles et al. ................. 451/288 |
| 5,827,110 A | * | 10/1998 | Yajima et al. ............ 451/67 X |
| 5,830,045 A | * | 11/1998 | Togawa et al. ............. 451/288 |
| 5,885,138 A | | 3/1999 | Okumura et al. |
| 5,893,795 A | * | 4/1999 | Perlov et al. ................ 451/288 |
| 5,897,426 A | | 4/1999 | Somekh |
| 5,989,107 A | | 11/1999 | Shimizu et al. |
| 6,036,582 A | | 3/2000 | Aizawa et al. |
| 6,062,954 A | | 5/2000 | Izumi |
| 6,156,124 A | | 12/2000 | Tobin |
| 6,180,020 B1 | | 1/2001 | Moriyama et al. |

FOREIGN PATENT DOCUMENTS

| | | |
|---|---|---|
| DE | 197634 | 4/1908 |
| EP | 0 517 594 | 12/1992 |
| EP | 0 684 634 | 11/1995 |
| EP | 807 492 A2 | 11/1997 |
| EP | 874 309 A1 | 10/1998 |

(List continued on next page.)

OTHER PUBLICATIONS

U.S. Patent Application No. 09/301,718, filed Apr. 4, 1999, entitled "Method and Apparatus For Polishing Workpiece", by Noburu Shimizu et al., located in Group Art Unit 3723.

(List continued on next page.)

Primary Examiner—Joseph J. Hail, III
Assistant Examiner—Anthony Ojini
(74) Attorney, Agent, or Firm—Wenderoth, Lind & Ponack, L.L.P.

(57) ABSTRACT

A polishing apparatus is used for polishing a workpiece such as a semiconductor wafer to a flat mirror finish. The polishing apparatus comprises a turntable having a polishing surface, a top ring for holding a workpiece and pressing the workpiece against the polishing surface to polish the workpiece, at least three cleaning apparatuses for cleaning polished workpieces, and a transfer structure for transferring the polished workpieces between at least three cleaning apparatuses. The transfer structure comprises a plurality of robots and is capable of changing transfer routes between the three cleaning apparatuses.

29 Claims, 48 Drawing Sheets

FOREIGN PATENT DOCUMENTS

| | | |
|---|---|---|
| JP | 64-42823 | 2/1989 |
| JP | 2-208931 | 8/1990 |
| JP | 2-267950 | 11/1990 |
| JP | 4-69147 | 3/1992 |
| JP | 5-74749 | 3/1993 |
| JP | 5-285807 | 11/1993 |
| JP | 7-135192 | 1/1995 |
| JP | 8-64562 | 3/1996 |
| JP | 9-232257 | 9/1997 |
| JP | 10-256201 | 9/1998 |
| WO | 82/03038 | 9/1982 |
| WO | 96/36459 | 11/1996 |
| WO | 97/10613 | 3/1997 |

OTHER PUBLICATIONS

Kaitoh Tei et al., "Planarization of Device Wafer with Fixed Abrasive Particles (Second Report)" —Planarization Working Characteristics with Fine Silica Grindstone —, from the Japan Society for Precision Engineering.

U.S. Patent Application No. 09/663,417, filed Sep. 15, 2000, entitled "Polishing Apparatus", by Kunihiko Sakurai et al., located in Group Art Unit 3723.

U.S. Patent Application No. 09/341,882, filed Sep. 8, 1999, entitled "Polishing Apparatus", by Seiji Katsuoka et al., located in Group Art Unit 3723.

U.S. Patent Application No. 09/518,958, filed Mar. 3, 2000, entitled "Polishing Aparatus", by Kunihiko Sakurai et al., located in Group Art Unit 3723.

* cited by examiner-

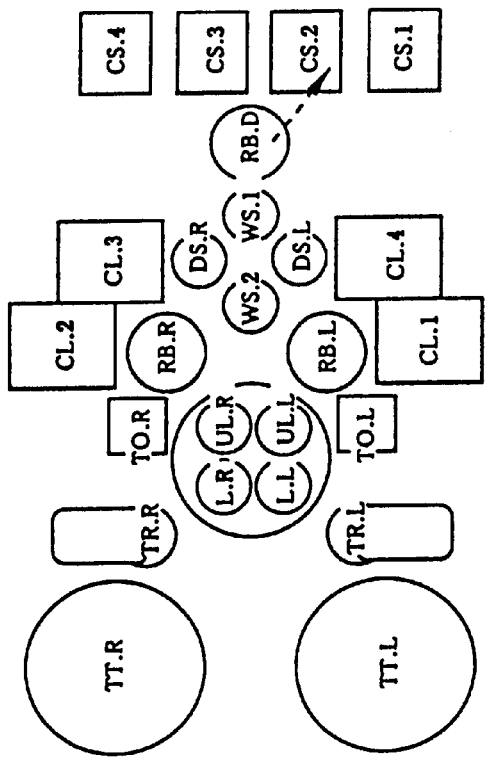
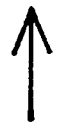
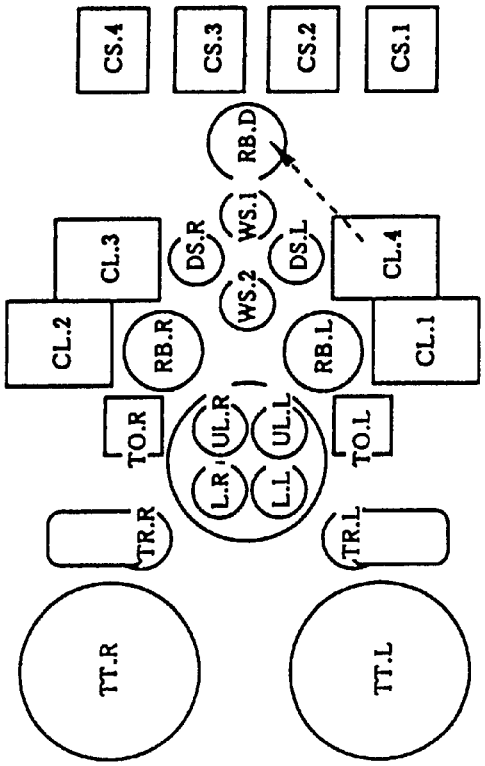
FIG. 14

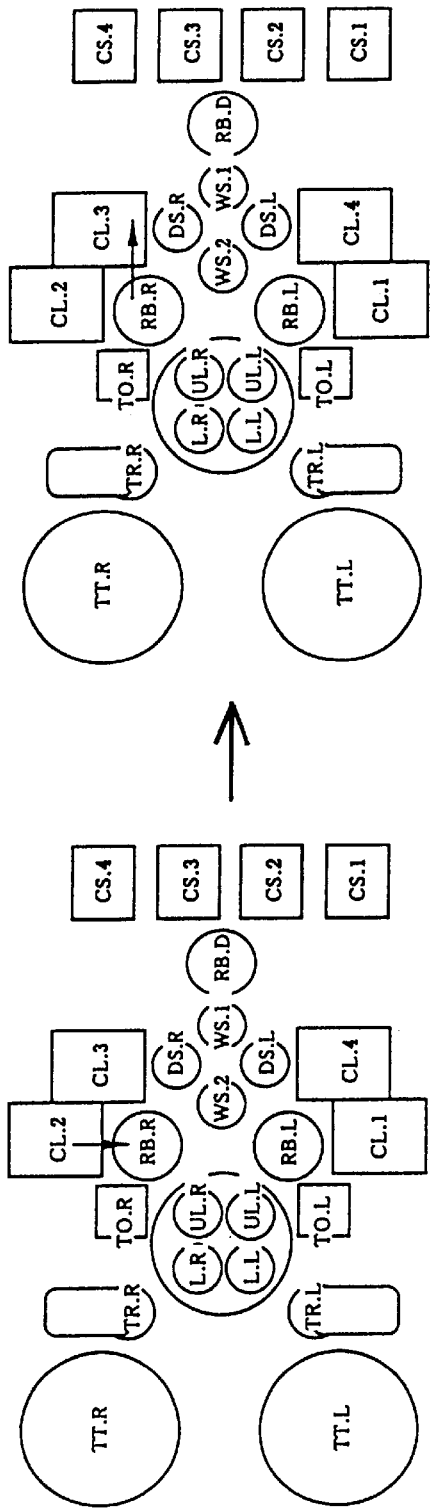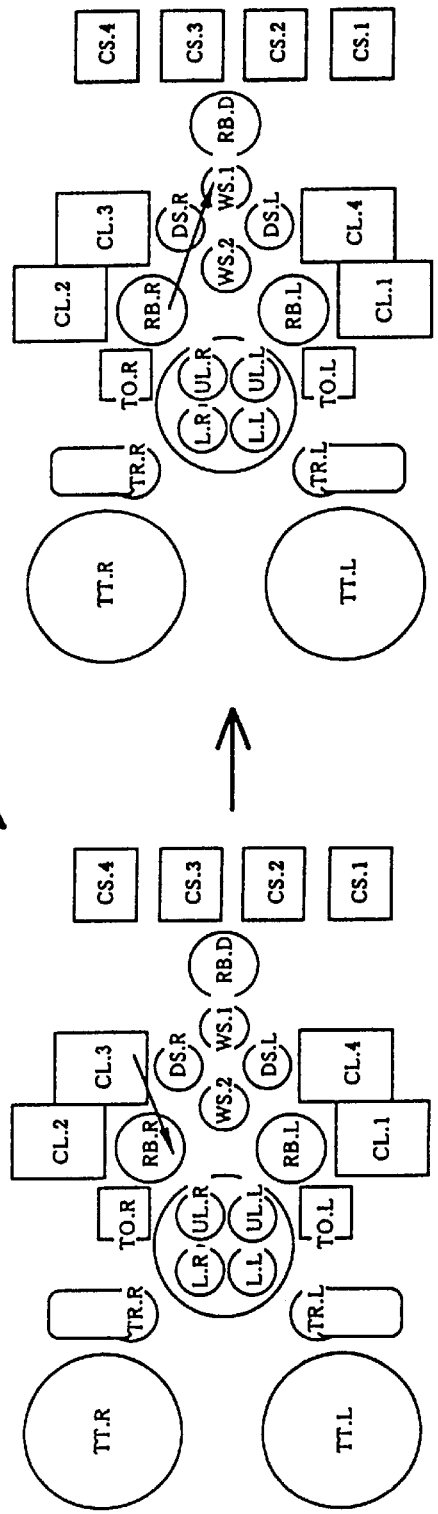
FIG. 21

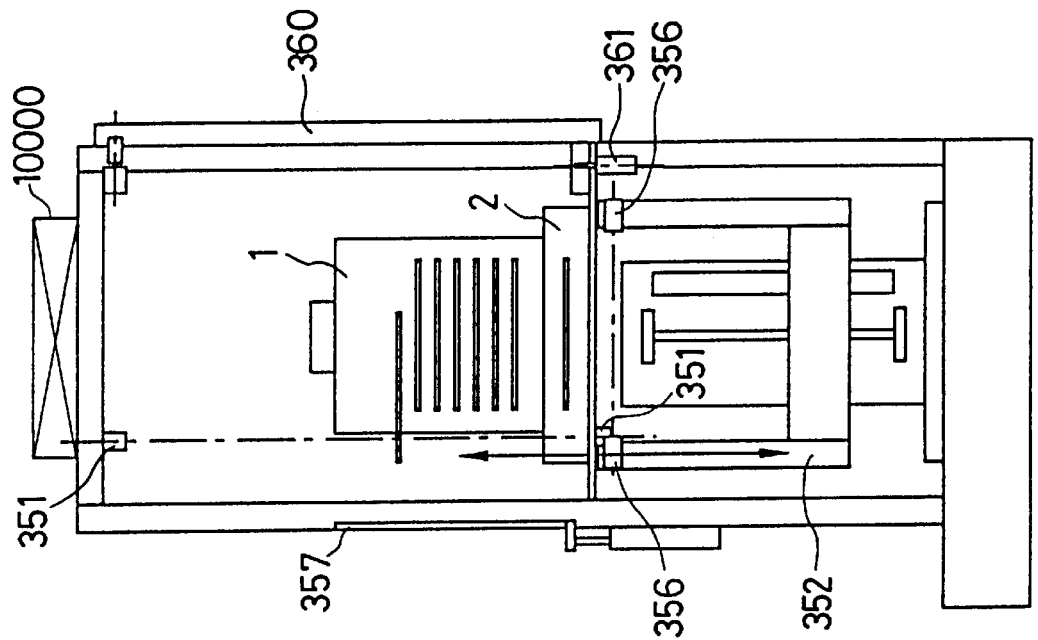
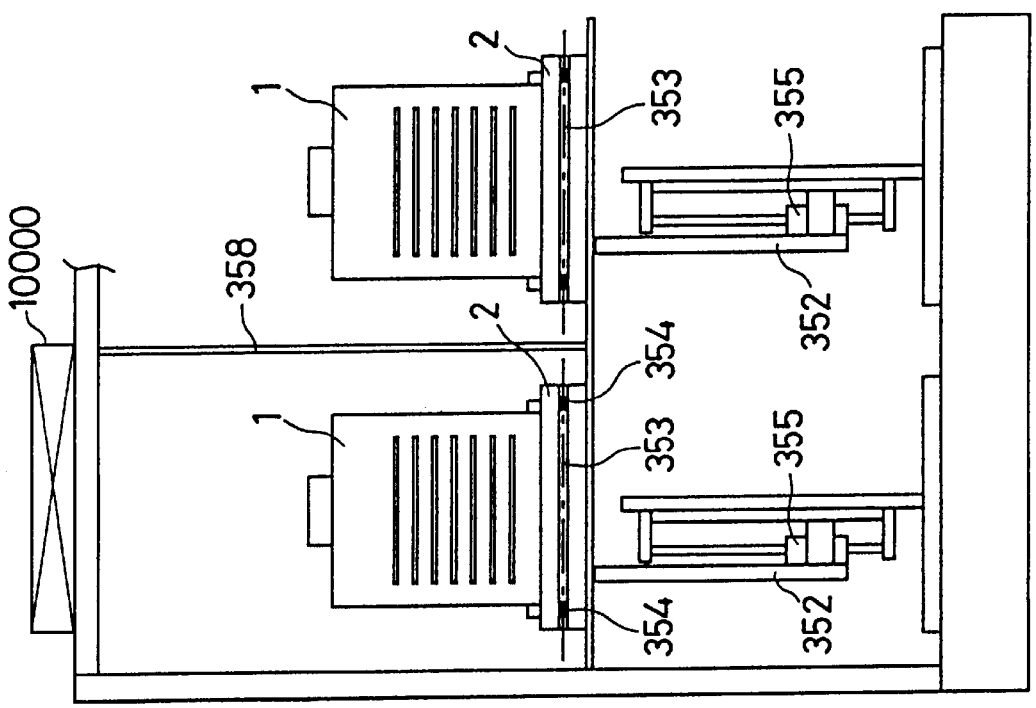

F I G. 25
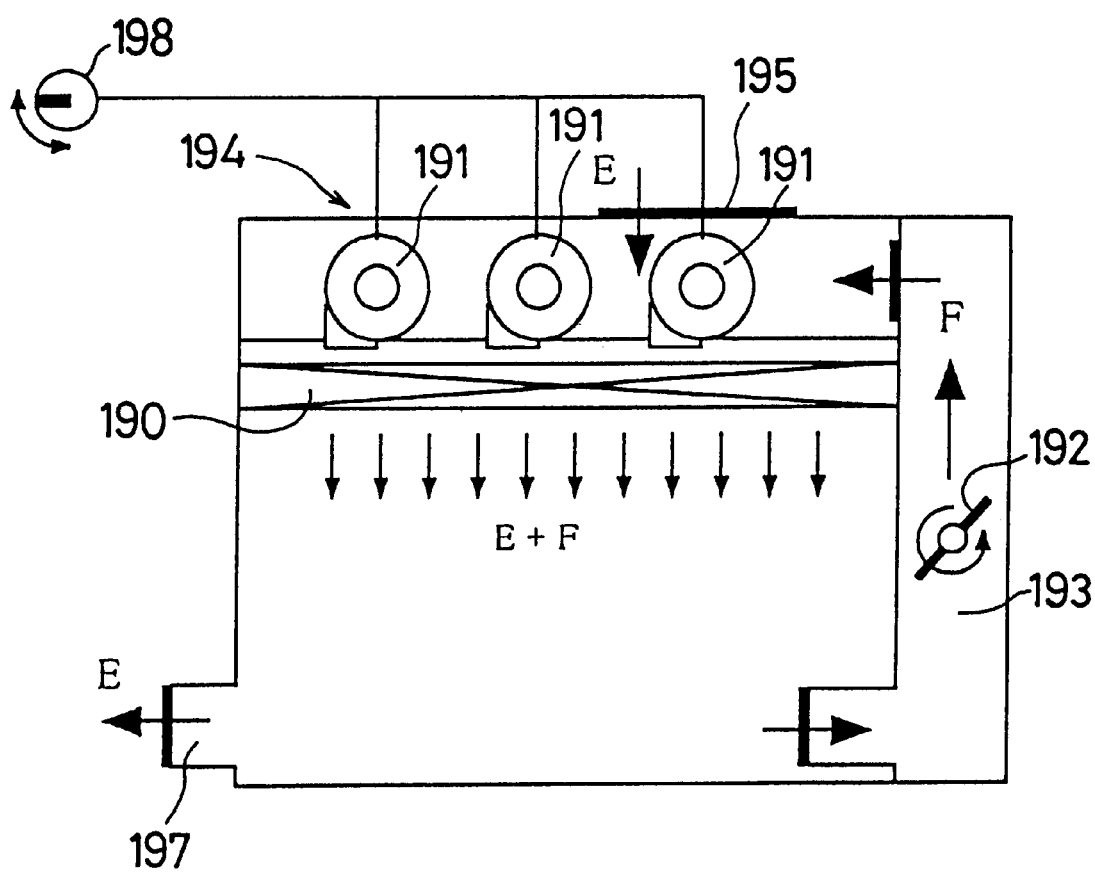

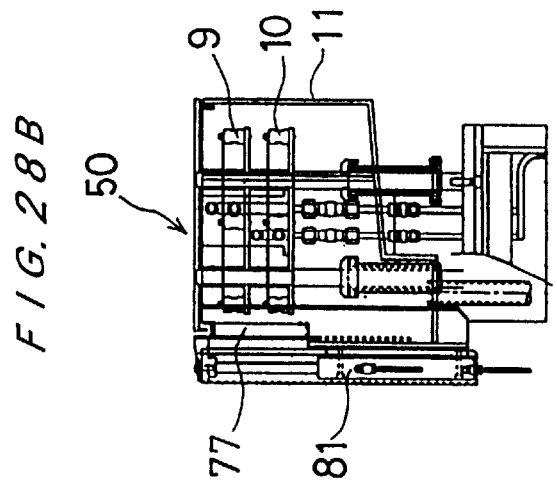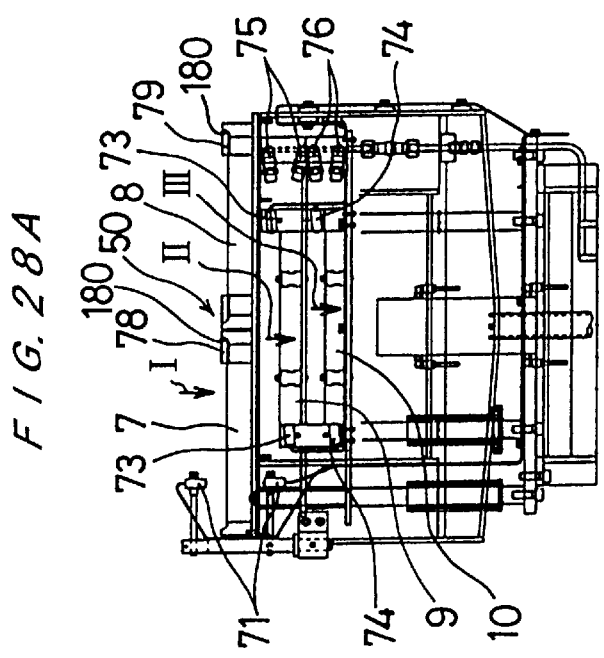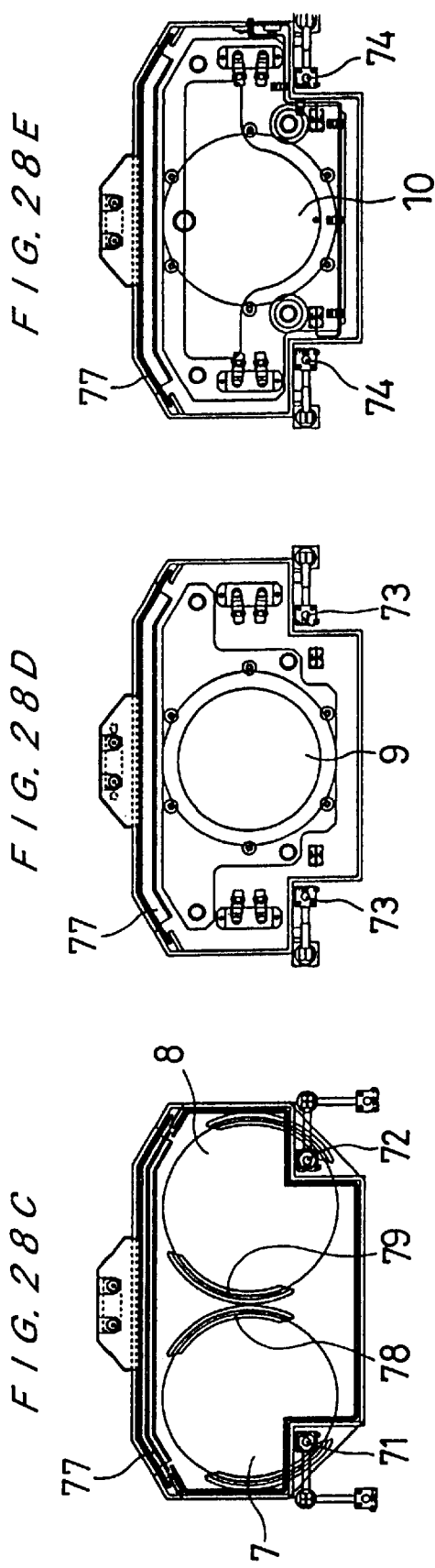

F I G. 31
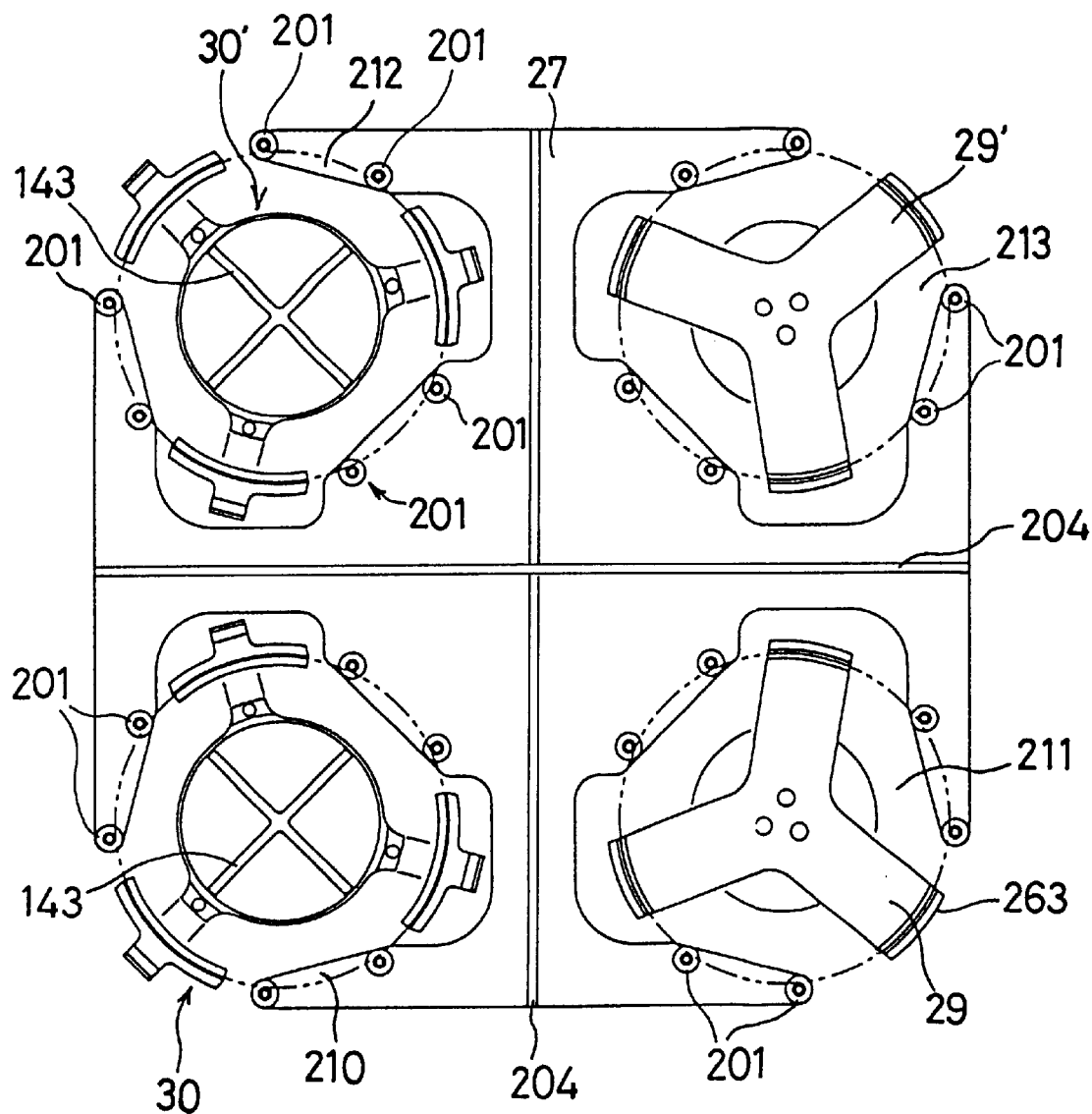

F I G. 44A
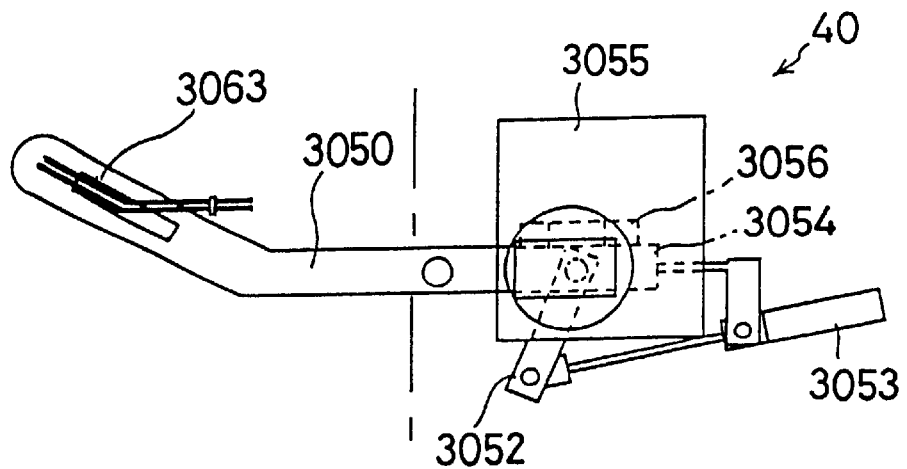
F I G. 44B
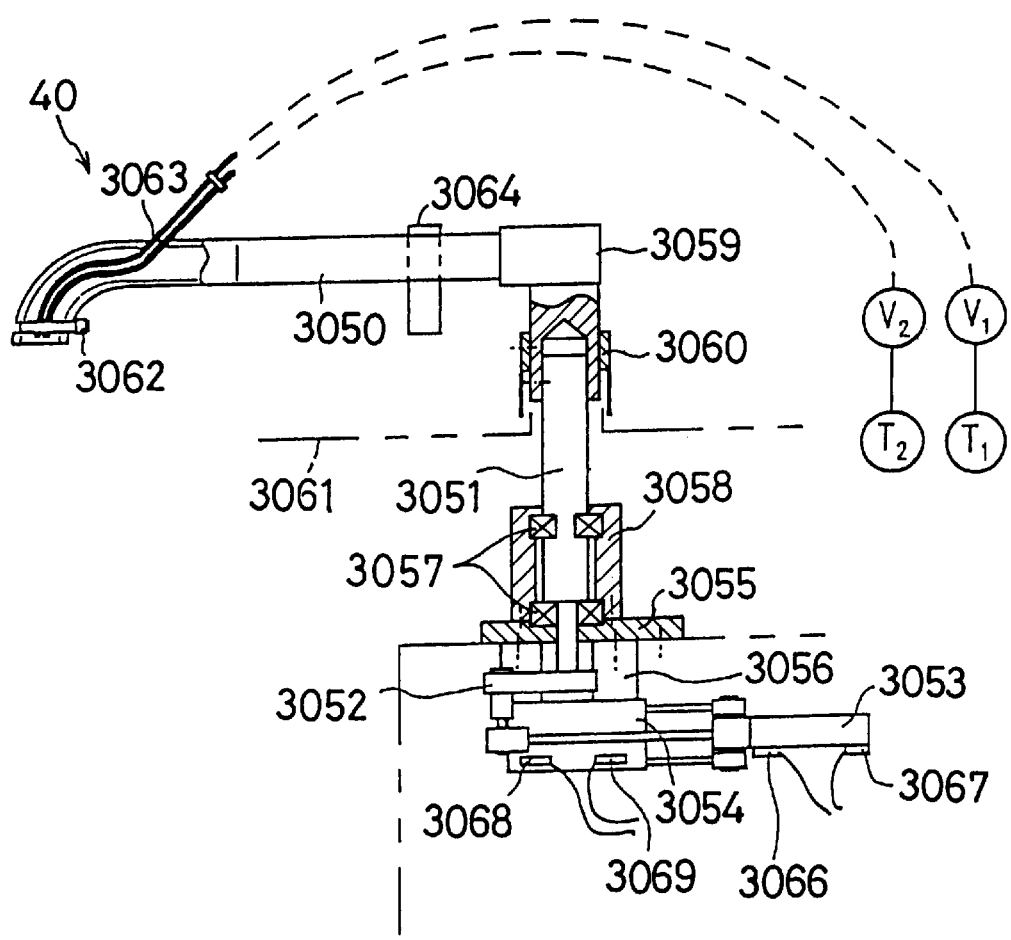

F I G. 45
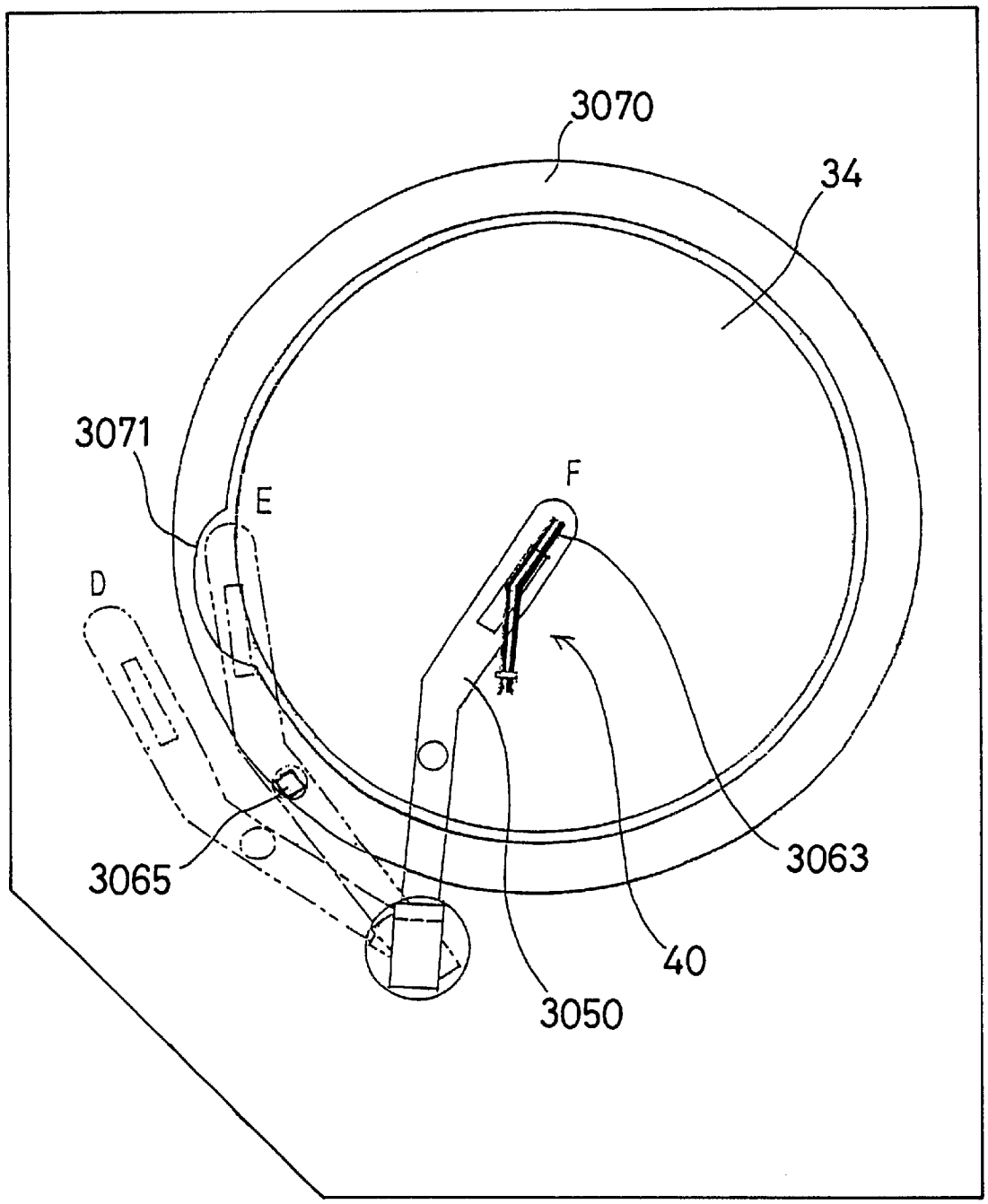

POLISHING APPARATUS

BACKGROUND OF THE INVENTION

1. Field of the Invention

The present invention relates to a polishing apparatus for polishing a workpiece such as a semiconductor wafer to a flat mirror finish, and more particularly to a polishing apparatus having a cleaning apparatus for cleaning a polished workpiece.

2. Description of the Related Art

In semiconductor device manufacturing processes, semiconductor wafers are polished to a flat mirror finish in a semiconductor wafer fabrication process, and layers formed on semiconductor devices are polished to a flat mirror finish in a semiconductor device fabrication process. These polishing processes in the semiconductor wafer fabrication process and the semiconductor device fabrication process are performed by a polishing apparatus.

Conventionally, such a polishing apparatus has been designed as a dedicated polishing apparatus having a single function of polishing semiconductor wafers. The semiconductor wafers which have been polished by the polishing apparatus are transported to a next cleaning process by a movable container in which they are immersed in water to keep them from drying during transportation. However, the cleaning process tends to impair the cleanliness of a clean room, and the polished semiconductor wafers need to be transported by an operator or a manually operated transportation means. Further, a large installation space is required for two kinds of apparatuses comprising the polishing apparatus and a cleaning apparatus that is used to carry out the subsequent cleaning process.

In an effort to make the polishing process clean and reduce the installation space of the apparatus, there has been developed a polishing apparatus which performs both a polishing process and a cleaning process and which is of a dry-in and dry-out type for introducing semiconductor wafers therein in a dry condition and removing polished and cleaned semiconductor wafers therefrom in a dry condition. However, the dry-in and dry-out type polishing apparatus has a lower processing capability per unit time and unit installation area than the conventional dedicated polishing apparatus having a single function of polishing the semiconductor wafers. A polishing apparatus designed for solving the above problem has been proposed by Japanese patent application No. 11-59522, and offers many advantages over the conventional dedicated polishing apparatus.

The dry-in and dry-out type polishing apparatus has two cleaning apparatuses operable based on two different cleaning methods for cleaning semiconductor wafers which have been polished, in order to increase the processing capability per unit installation area. Such two cleaning apparatuses clean a semiconductor wafer in two stages, and are installed in a smaller installation area with minimum cleaning functions. However, as recent semiconductor devices have smaller circuit elements and finer interconnections in integrated patterns, there has been a demand for removing polished semiconductor wafers from the polishing apparatus in a higher level of cleanness, and therefore the cleaning stages for cleaning the polished semiconductor wafers have increased from two stages to three stages to meet such a demand. Specifically, such three cleaning stages include a process of removing fine particles attached to the polished semiconductor wafer, a process of removing metal ions attached to the polished semiconductor wafer, and a process of drying the clean polished semiconductor wafer. In some cases, two or more types of metal ions attached to the polished semiconductor wafer are removed by different chemicals supplied thereto, with the result that a total of four stages are involved in cleaning the polished semiconductor wafer. The four cleaning stages may be performed by respective four cleaning apparatuses, or two stages of the four cleaning stages may be performed by one of three cleaning apparatuses.

If three or more cleaning stages are carried out by two cleaning apparatuses, then two cleaning stages are performed by at least one cleaning apparatus, whose processing capability is thus reduced per unit time. If three or more cleaning apparatuses are provided in a row in a polishing apparatus, then the polishing apparatus becomes large in size, and has a reduced processing capability per unit time. Either one of these arrangements is detrimental to the advantages offered by the concept in Japanese patent application No. 11-59522.

SUMMARY OF THE INVENTION

It is therefore an object of the present invention to provide a polishing apparatus which can be used as a dry-in and dry-out type polishing apparatus, has a high processing capability per unit time and unit installation area, has three or more cleaning stages in a cleaning process, and is capable of making semiconductor wafers cleaner to meet requirements for smaller circuit elements and finer interconnections on semiconductor devices.

A further object of the present invention is to provide a polishing apparatus which can be used as the dry-in and dry-out type polishing apparatus and is capable of greatly increasing a processing capability of workpieces such as semiconductor wafers per unit time and unit area.

To achieve the above objects, according to a first apparatus comprising a turntable having a polishing surface, a top ring for holding a workpiece and pressing the workpiece against the polishing surface to polish the workpiece, at least three cleaning apparatuses for cleaning polished workpieces, and a transfer structure for transferring the polished workpieces between the at least three cleaning apparatuses. The transfer structure is capable of changing transfer routes between the at least three cleaning apparatuses. The transfer structure comprises a plurality of robots.

According to the present invention, the polishing apparatus can change transfer routes to comply with the required cleaning processes for maintaining a desired number of cleaning stages depending on various polishing processes without reducing the processing capability per unit installation area, and also to shorten the processing time of each of the cleaning processes by assigning the cleaning process which needs a long period of time to at least two cleaning apparatuses, thereby increasing the number of processed workpieces per unit time, i.e., throughput.

According to a second aspect of the present invention, there is provided a polishing apparatus comprising a plurality of turntables having respective polishing surfaces, a plurality of top rings for holding workpieces and pressing the workpieces against the polishing surfaces to polish the workpieces, a rotary transporter disposed in a position which can be accessed by the top rings and having a plurality of portions positioned on a predetermined circumference from a center of rotation of the rotary transporter for holding the workpieces, the rotary transporter being capable of replacing the workpieces placed at the portions, a pusher for transferring the workpieces between the rotary transporter and the top rings, and a reversing device for transferring the workpieces to and from the rotary transporter and reversing the workpieces.

It is possible to shorten the time required to transfer a work piece to be polished, such as a semiconductor wafer, to the top ring, for thereby greatly increasing the number of processed workpieces per unit time, i.e., throughput.

According to a third aspect of the present invention, there is provided a polishing apparatus comprising a polishing section for polishing a workpiece, a cleaning section for cleaning a polished workpiece, and a reversing device for reversing a workpiece to be polished and a polished workpiece. The polishing section is arranged to polish a workpiece while a surface thereof being polished is directed downwardly, and the cleaning section is arranged to clean said polished workpiece while a polished surface thereof is directed upwardly.

In the cleaning processes, the polished surfaces of workpieces can be processed while the polished surfaces are being directed upwardly.

According to a fourth aspect of the present invention, there is provided a polishing apparatus comprising a turntable having a polishing surface, a top ring for holding a workpiece and pressing the workpiece against the polishing surface to polish the workpiece, a plurality of cleaning apparatuses for cleaning polished workpieces, and a workpiece station having workpiece supports for holding workpieces in a standby state while the workpieces are cleaned in a plurality of stages through the cleaning apparatuses.

Inasmuch as polished workpieces can wait while being processed in cleaning processes, a plurality of cleaning processes having different processing times can be performed parallel to each other on a plurality of polished workpieces.

According to a fifth aspect of the present invention, there is provided a polishing apparatus comprising a loading and unloading section for supplying a workpiece to be polished and receiving a polished workpiece, a polishing section for polishing the workpiece, and a cleaning section for cleaning the polished workpiece. Chambers separated by partitions have respective openings for allowing the workpiece to pass therethrough. The loading and unloading section, the polishing section, and the cleaning section are housed in the chambers.

Since the chambers in which the cleanliness of the atmosphere is different from one another are separated by the partitions, the atmosphere in a contaminated chamber is prevented from flowing into a clean chamber and hence from lowering the cleanliness in the clean chamber.

According to a sixth aspect of the present invention, there is provided a polishing apparatus comprising a plurality of turntables having respective polishing surfaces, a plurality of top rings for holding workpieces and pressing the workpieces against the polishing surfaces to polish the workpieces, a plurality of cleaning apparatuses for cleaning polished workpieces, and a transfer structure for transferring the workpieces. The polishing surfaces include a polishing surface for primarily polishing the workpiece and a polishing surface for finish polishing the workpiece.

The polishing surface for polishing the workpiece to produce a polished surface at a higher polishing rate and the polishing surface for polishing the workpiece to produce a finer polished surface in the finish manner at a lower polishing rate are combined with each other to efficiently polish the workpiece to produce a well polished surface thereof.

According to a seventh aspect of the present invention, there is provided a polishing apparatus comprising a loading and unloading section for supplying a workpiece to be polished and receiving a polished workpiece, a turntable having a polishing surface, a top ring for holding a workpiece and pressing the workpiece against the polishing surface to polish the workpiece, at least three cleaning apparatuses for cleaning polished workpiece, at least two of the three cleaning apparatuses having an identical cleaning function, and a transfer structure for transferring the workpieces.

Of the three cleaning apparatuses, at least two of the cleaning apparatuses have identical cleaning modules. Consequently, cleaning processes which need to be performed over a long period of time can be carried out by two or more cleaning apparatuses, i.e., a cycle time can be distributed, to increase the number of processed workpieces per unit time, i.e., throughput.

The above and other objects, features, and advantages of the present invention will become apparent from the following description when taken in conjunction with the accompanying drawings, which illustrate preferred embodiments of the present invention by way of example.

BRIEF DESCRIPTION OF THE DRAWINGS

FIG. 14 is a diagram illustrative of the other process of polishing a semiconductor wafer with the polishing apparatus shown in FIG. 1;

FIG. 21 is a diagram illustrative of the still other process of polishing a semiconductor wafer with the polishing apparatus shown in FIG. 1;

FIGS. 23A and 23B are front and side elevational views of a loading and unloading section;

FIG. 25 is a schematic diagram showing air flows in a cleaning chamber;

FIG. 28A is a front elevational view of a wafer station;

FIG. 28B is a side elevational view of the wafer station;

FIG. 28C is a view of the wafer station as viewed in the direction indicated by the arrow I;

FIG. 28D is a view of the wafer station as viewed in the direction indicated by the arrow II;

FIG. 28E is a view of the wafer station as viewed in the direction indicated by the arrow III;

FIG. 31 is a plan view of a rotary transporter;

FIG. 44A is a plan view of an abrasive liquid supply nozzle;

FIG. 44B is a side elevational view, partly in cross section, of the abrasive liquid supply nozzle;

FIG. 45 is a plan view showing the position of the abrasive liquid supply nozzle with respect to a turntable;

DETAILED DESCRIPTION OF THE PREFERRED EMBODIMENTS

A polishing apparatus according to an embodiment of the present invention will be described below with reference to drawings.

Figure 1:
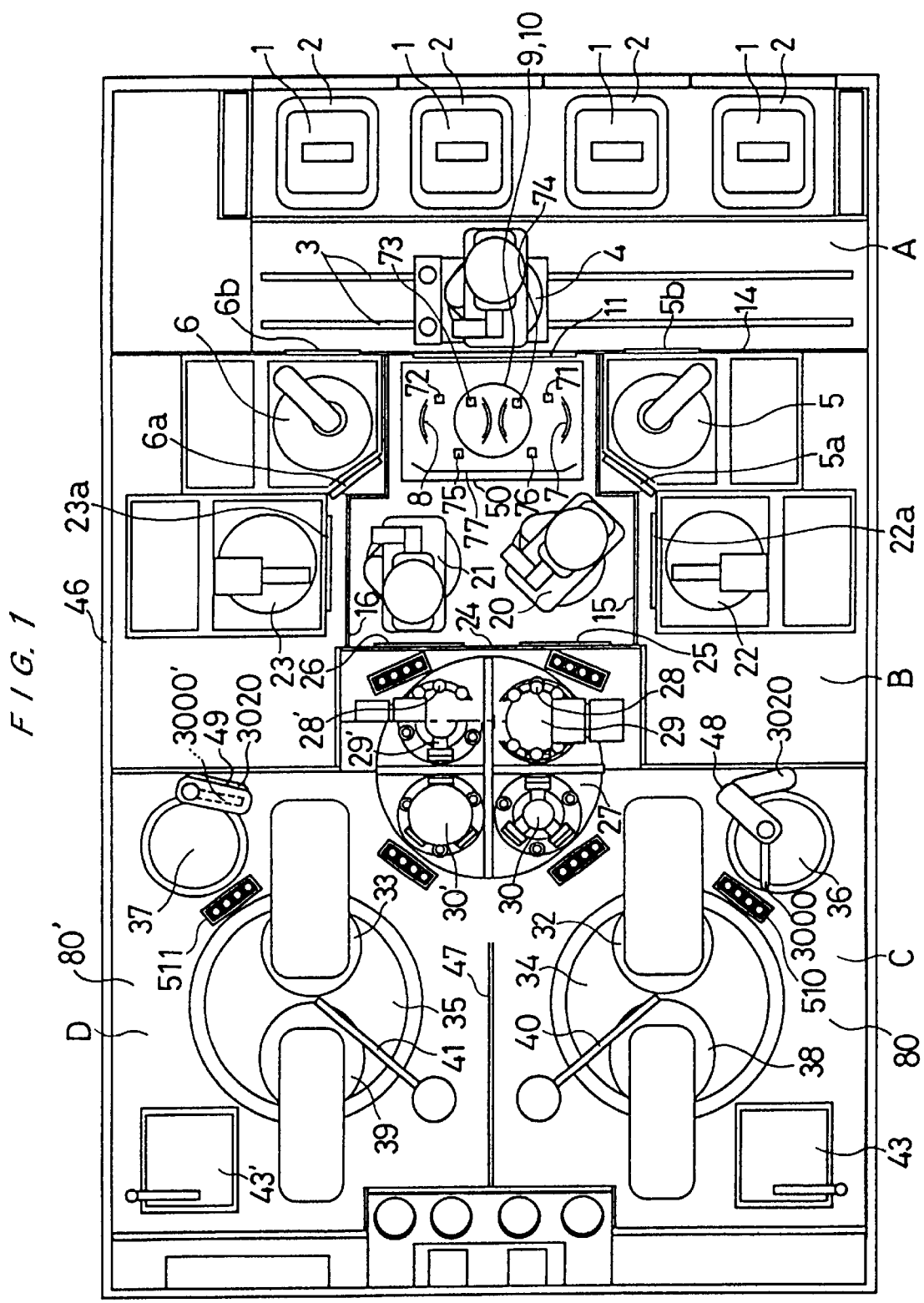
FIG. 1 is a plan view showing a layout of various components of a polishing apparatus according to the present invention.

FIG. 1 shows a layout of various components of a polishing apparatus according to the embodiment of the present invention. As shown in FIG. 1, a polishing apparatus according to the present invention comprises four load-unload stages 2 each for placing a wafer cassette 1 which accommodates a plurality of semiconductor wafers. The load-unload stage 2 may have a mechanism for raising and lowering the wafer cassette 1. A transfer robot 4 having two hands is provided on rails 3 so that the transfer robot 4 can move along the rails 3 and access the respective wafer cassettes 1 on the respective load-unload stages 2.

The transfer robot 4 has two hands which are located in a vertically spaced relationship, and the lower hand is used only for taking out a semiconductor wafer from the wafer cassette 1 and the upper hand is used only for returning the semiconductor wafer to the wafer cassette 1. This arrangement allows that a clean semiconductor wafer which has been cleaned is placed at an upper side and is not contaminated. The lower hand is a vacuum attraction-type hand for holding a semiconductor wafer under vacuum, and the upper hand is a recess support-type hand for supporting a peripheral edge of a semiconductor wafer by a recess formed on the hand. The vacuum attraction-type hand can hold a semiconductor wafer and transport the semiconductor wafer even if the semiconductor wafer is not located at a normal position in the wafer cassette due to a slight displacement, and the recess support-type hand can transport a semiconductor wafer while keeping the semiconductor wafer clean because dust is not collected unlike the vacuum attraction-type hand.

Two cleaning apparatuses 5 and 6 are disposed at the opposite side of the wafer cassettes 1 with respect to the rails 3 of the transfer robot 4. The cleaning apparatuses 5 and 6 are disposed at positions that can be accessed by the hands of the transfer robot 4. Between the two cleaning apparatuses 5 and 6 and at a position that can be accessed by the transfer robot 4, there is provided a wafer station 50 having four wafer supports 7, 8, 9 and 10. The cleaning apparatuses 5 and 6 have a spin-dry mechanism for drying a semiconductor wafer by spinning the semiconductor wafer at a high speed, and hence the two-stage cleaning or three-stage cleaning of the semiconductor wafer can be conducted without replacing any cleaning module.

An area B in which the cleaning apparatuses 5 and 6 and the wafer station 50 having the wafer supports 7, 8, 9 and 10 are disposed and an area A in which the wafer cassettes 1 and the transfer robot 4 are disposed are partitioned by a partition wall 14 so that the cleanliness of the area B and the area A can be separated. The partition wall 14 has an opening for allowing semiconductor wafers to pass therethrough, and a shutter 11 is provided at the opening of the partition wall 14. A transfer 14 robot 20 having two hands is disposed at a position where the transfer robot 20 can access the cleaning apparatus 5 and the three wafer supports 7, 9 and 10, and a transfer robot 21 having two hands is disposed at a position where the transfer robot 21 can access the cleaning apparatus 6 and the three wafer supports 8, 9 and 10.

The wafer support 7 is used to transfer a semiconductor wafer between the transfer robot 4 and the transfer robot 20 and has a sensor 71 for detecting whether there is a semiconductor wafer or not. The wafer support 8 is used to transfer a semiconductor wafer between the transfer robot 4 and the transfer robot 21 and has a sensor 72 for detecting whether there is a semiconductor wafer or not. The wafer support 9 is used to transfer a semiconductor wafer from the transfer robot 21 to the transfer robot 20, and has a sensor 73 for detecting whether there is a semiconductor wafer or not and rinsing nozzles 75 for supplying a rinsing liquid to prevent a semiconductor wafer from drying or to conduct rinsing of a semiconductor wafer. The wafer support 10 is used to transfer a semiconductor wafer from the transfer robot 20 to the transfer robot 21, and has a sensor 74 for detecting whether there is a semiconductor wafer or not and rinsing nozzles 76 for supplying a rinsing liquid to prevent a semiconductor wafer from drying or to conduct rinsing of a semiconductor wafer. The wafer supports 9 and 10 are disposed in a common water-scatter-prevention cover which has a opening defined therein for transferring semiconductor wafers therethrough, the opening being combined with a shutter 77. The wafer support 9 is disposed above the wafer support 10, and the wafer support 9 serves to support a semiconductor wafer which has been cleaned and the wafer support 10 serves to support a semiconductor wafer to be cleaned, so that the cleaned semiconductor wafer is prevented from being contaminated by rinsing water which would otherwise fall thereon. The sensors 71, 72, 73 and 74, the rinsing nozzles 75 and 76, and the shutter 77 are schematically shown in FIG. 1, and their positions and shapes are not illustrated exactly.

The transfer robot 20 and the transfer robot 21 have the respective two hands which are located in a vertically spaced relationship. The respective upper hands of the transfer robot 20 and the transfer robot 21 are used for transporting a semiconductor wafer which has been cleaned to the cleaning apparatuses or the wafer supports of the wafer station 50, and the respective lower hands of the transfer robot 20 and the transfer robot 21 are used for transporting a semiconductor wafer which has not cleaned or a semiconductor wafer to be polished. Since the lower hand is used to transfer a semiconductor wafer to or from a reversing device, the upper hand is not contaminated by drops of a rinsing water which fall from an upper wall of the reversing device.

A cleaning apparatus 22 is disposed at a position adjacent to the cleaning apparatus 5 and accessible by the hands of the transfer robot 20, and another cleaning apparatus 23 is disposed at a position adjacent to the cleaning apparatus 6 and accessible by the hands of the transfer robot 21.

All the cleaning apparatuses 5, 6, 22 and 23, the wafer supports 7, 8, 9 and 10 of the wafer station 50, and the transfer robots 20 and 21 are placed in the area B. The pressure in the area B is adjusted so as to be lower than the pressure in the area A. Each of the cleaning apparatuses 22 and 23 is capable of cleaning both surfaces of a semiconductor wafer.

The polishing apparatus has a housing 46 for enclosing various components therein. The housing 46 constitutes an enclosing structure. The interior of the housing 46 is partitioned into a plurality of compartments or chambers (including the areas A and B) by partitions 14, 15, 16, 24 and 47.

A polishing chamber separated from the area B by the partition wall 24 is formed, and is further divided into two areas C and D by the partition wall 47. In each of the two areas C and D, there are provided two turntables, and a top ring for holding a semiconductor wafer and pressing the semiconductor wafer against the turntables. That is, the turntables 34 and 36 are provided in the area C, and the turntables 35 and 37 are provided in the area D. Further, the top ring 32 is provided in the area C and the top ring 33 is provided in the area D.

An abrasive liquid nozzle 40 for supplying an abrasive liquid to the turntable 34 in the area C and a dresser 38 for dressing the turntable 34 are disposed in the area C. An abrasive liquid nozzle 41 for supplying an abrasive liquid to the turntable 35 in the area D and a dresser 39 for dressing the turntable 35 are disposed in the area D. A dresser 48 for dressing the turntable 36 in the area C is disposed in the area C, and a dresser 49 for dressing the turntable 37 in the area D is disposed in the area D. The turntables 36 and 37 may be replaced with wet-type thickness measuring devices for measuring the thickness of a layer on a semiconductor wafer. If such wet-type thickness measuring devices are provided, then they can measure the thickness of a layer on a semiconductor wafer immediately after it is polished, and hence it is possible to further polish the polished semiconductor wafer or control a polishing process for polishing a next semiconductor wafer based on the measured value.

Figure 2:
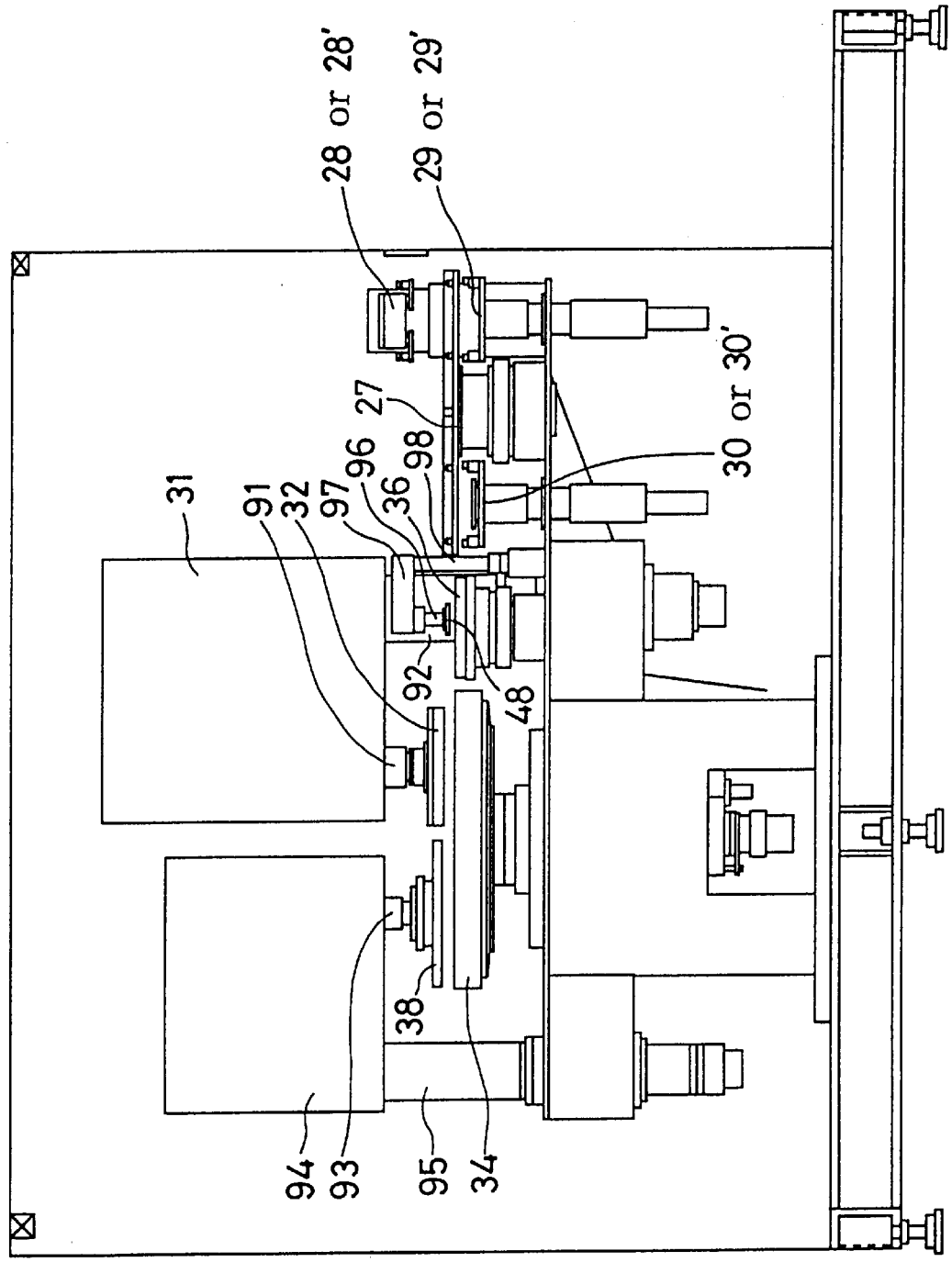
FIG. 2 is an elevational view showing the relationship between a top ring and turntables.
Figure 3:
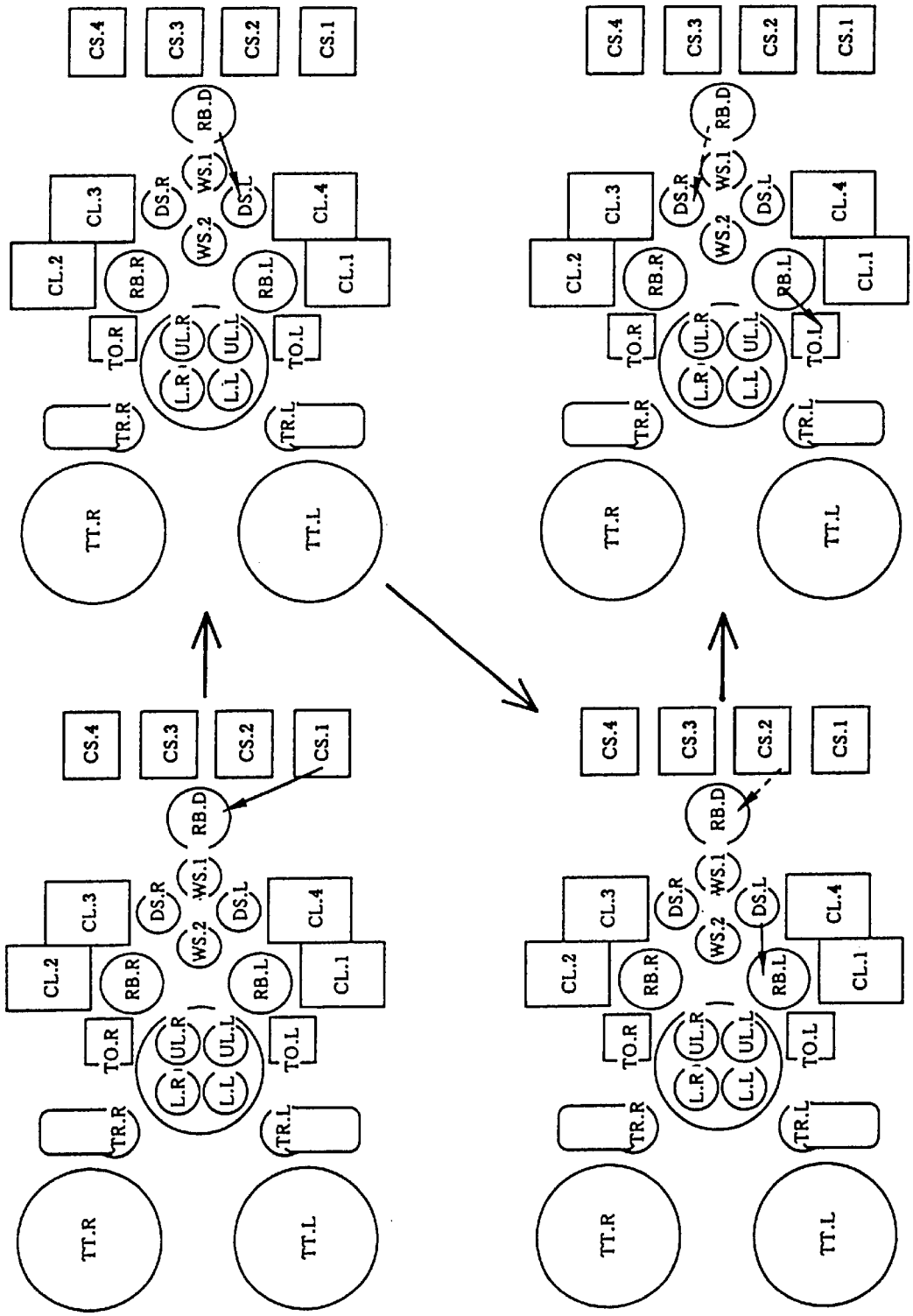
FIG. 3 is a diagram illustrative of a process of polishing a semiconductor wafer with the polishing apparatus shown in FIG. 1.
Figure 4:
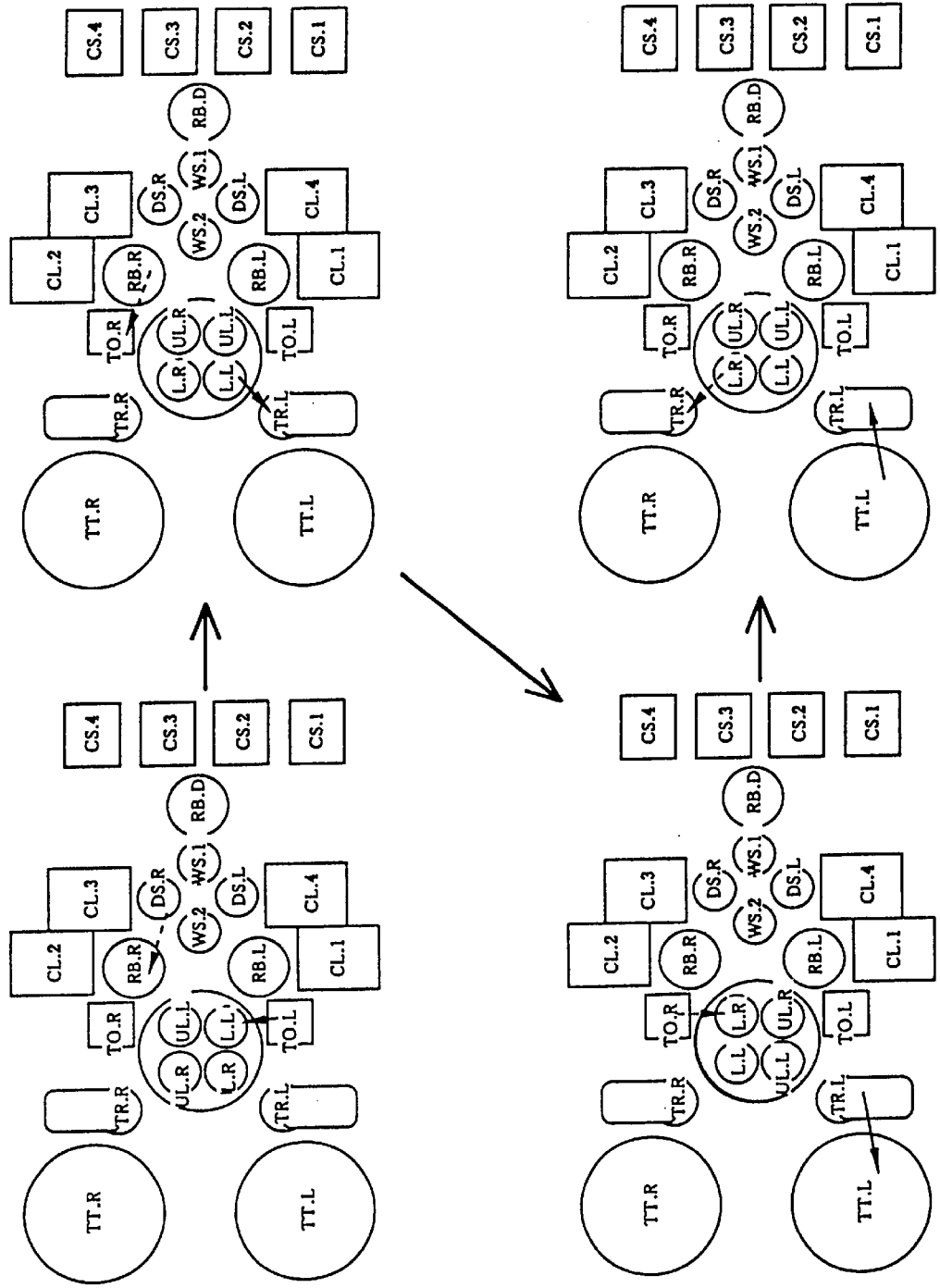
FIG. 4 is a diagram illustrative of the process of polishing a semiconductor wafer with the polishing apparatus shown in FIG. 1.
Figure 5:
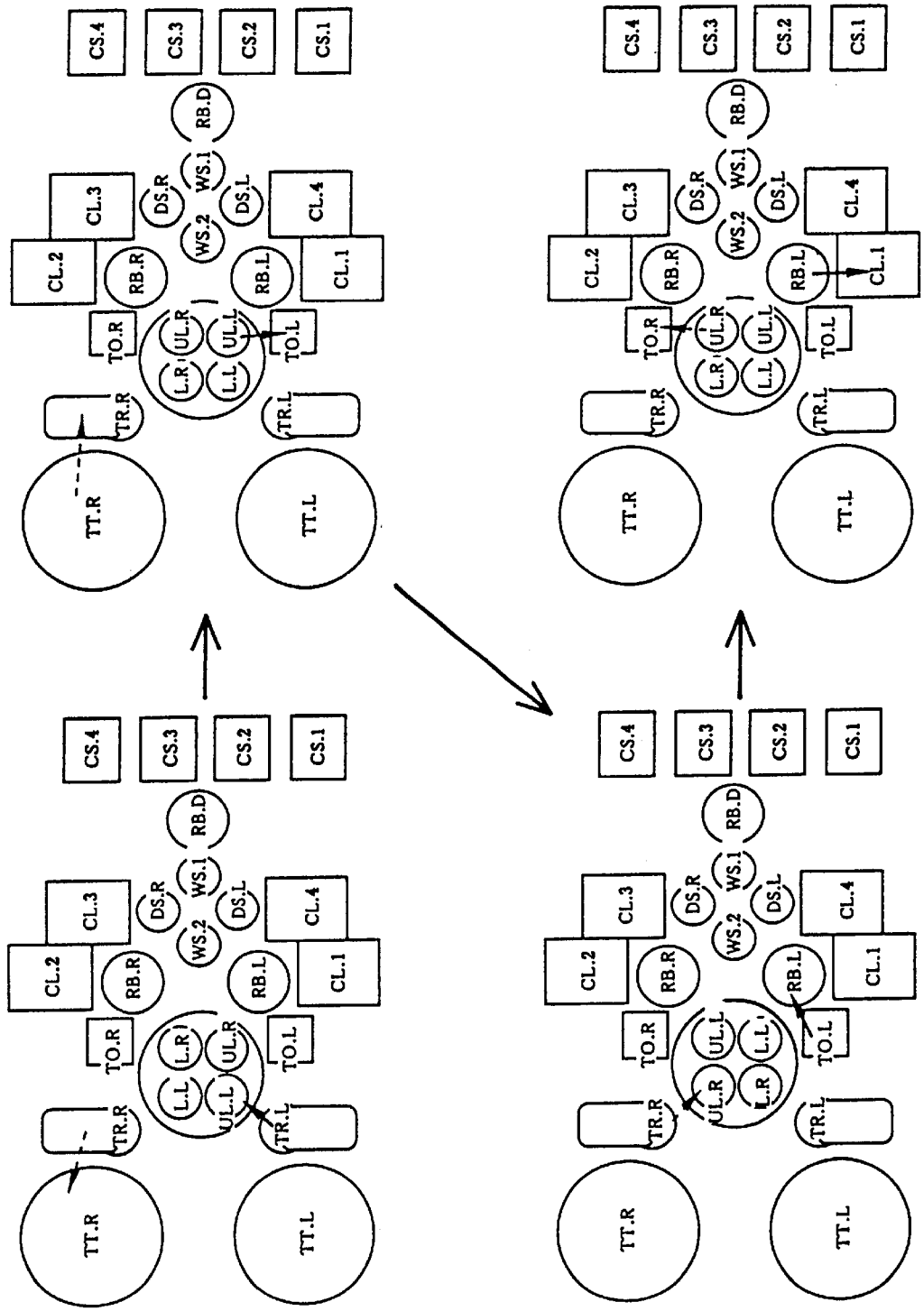
FIG. 5 is a diagram illustrative of the process of polishing a semiconductor wafer with the polishing apparatus shown in FIG. 1.
Figure 6:
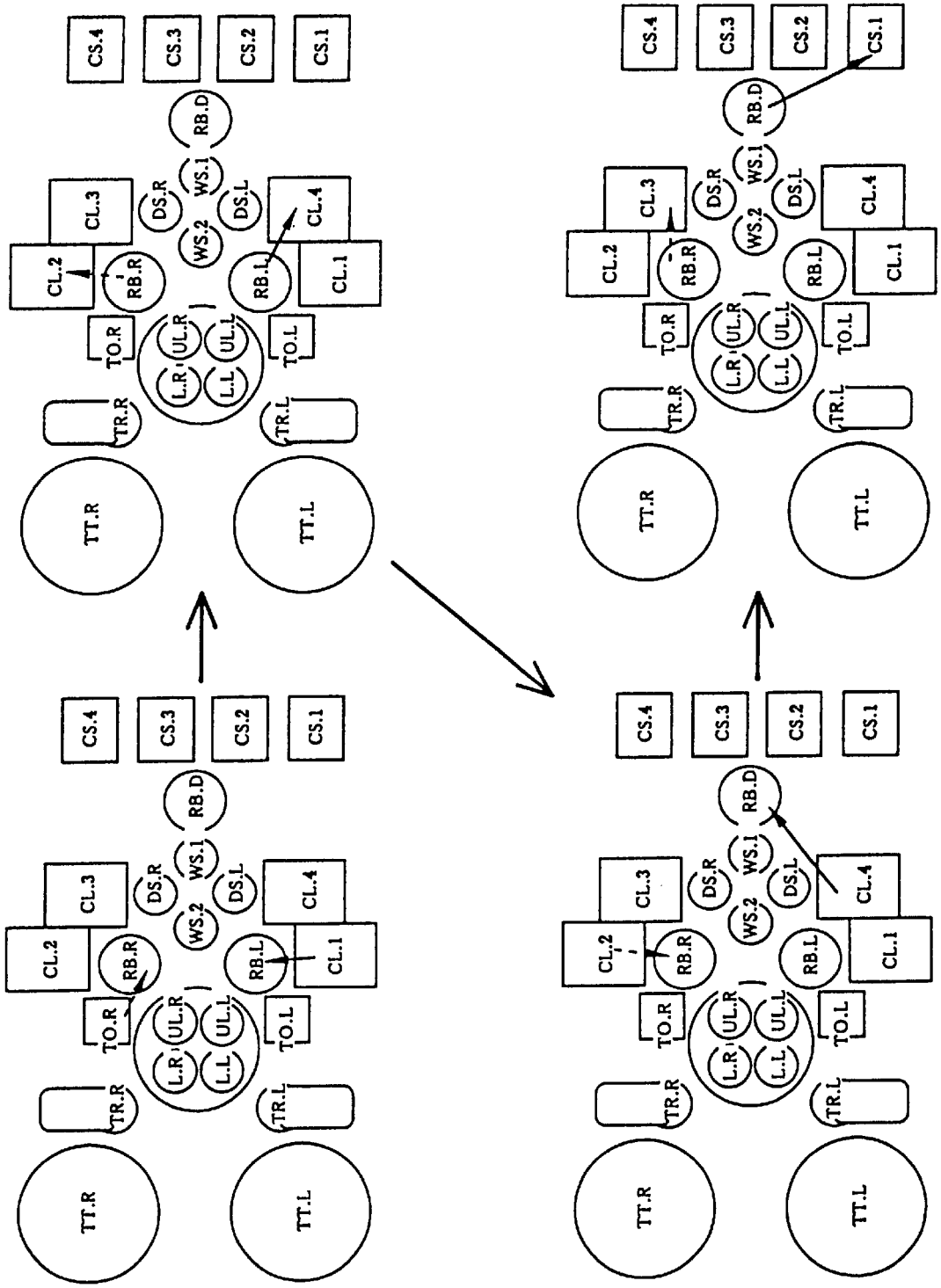
FIG. 6 is a diagram illustrative of the process of polishing a semiconductor wafer with the polishing apparatus shown in FIG. 1.
Figure 7:
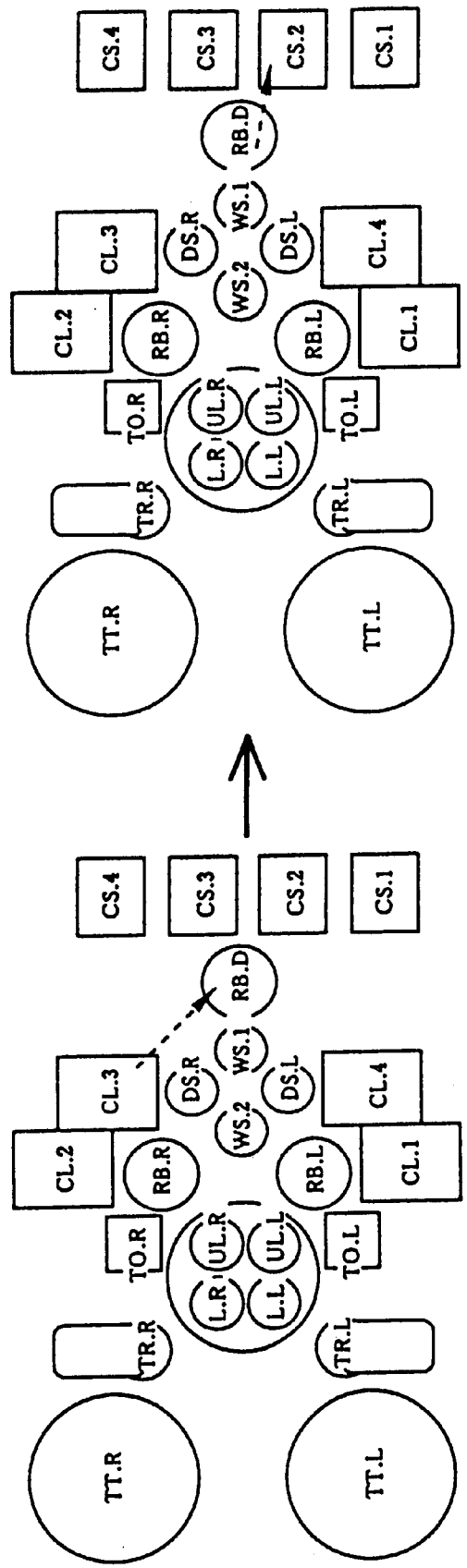
FIG. 7 is a diagram illustrative of the process of polishing a semiconductor wafer with the polishing apparatus shown in FIG. 1.
Figure 8:
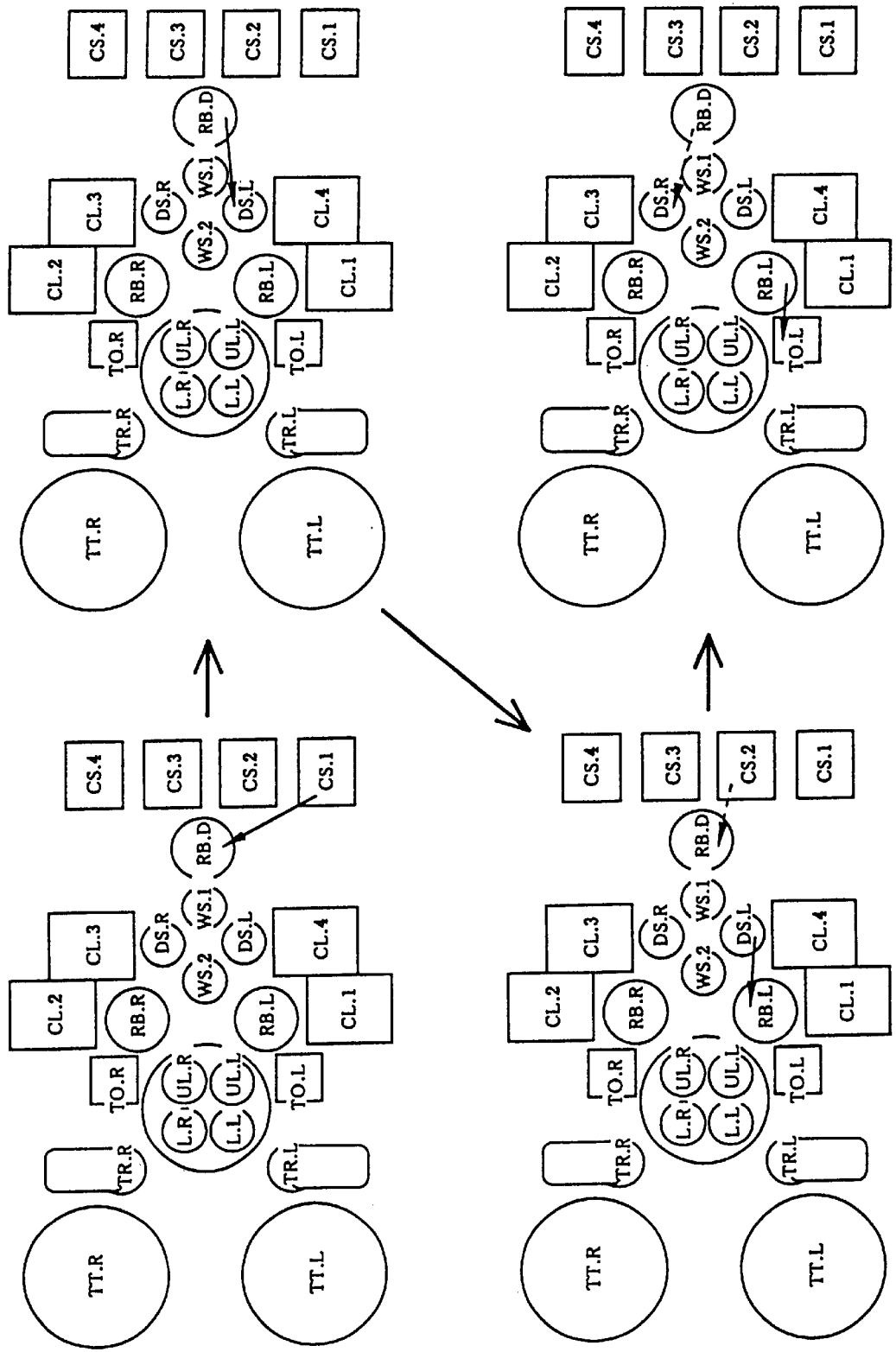
FIG. 8 is a diagram illustrative of another process of polishing a semiconductor wafer with the polishing apparatus shown in FIG. 1.
Figure 9:
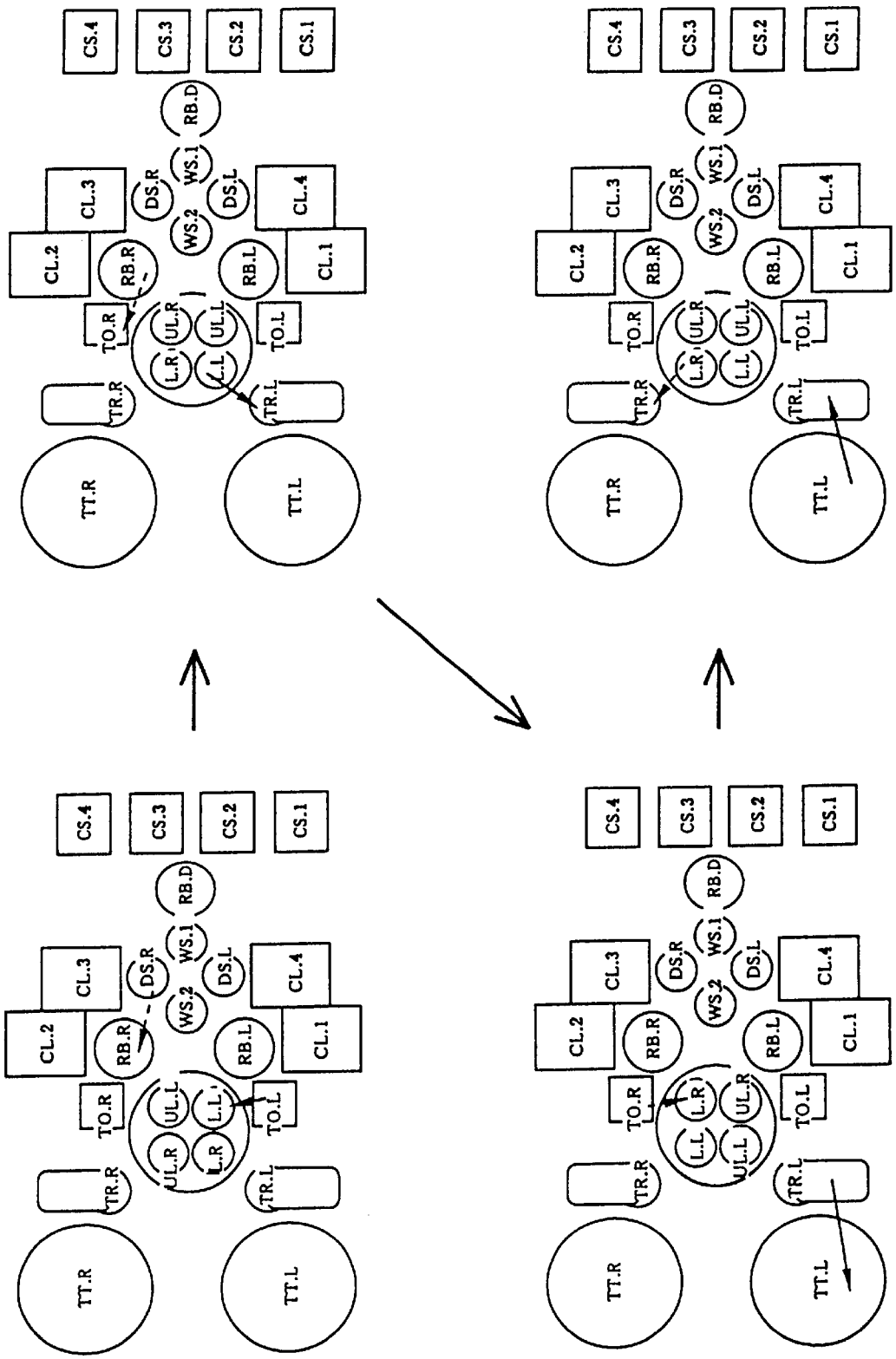
FIG. 9 is a diagram illustrative of the other process of polishing a semiconductor wafer with the polishing apparatus shown in FIG. 1.
Figure 10:
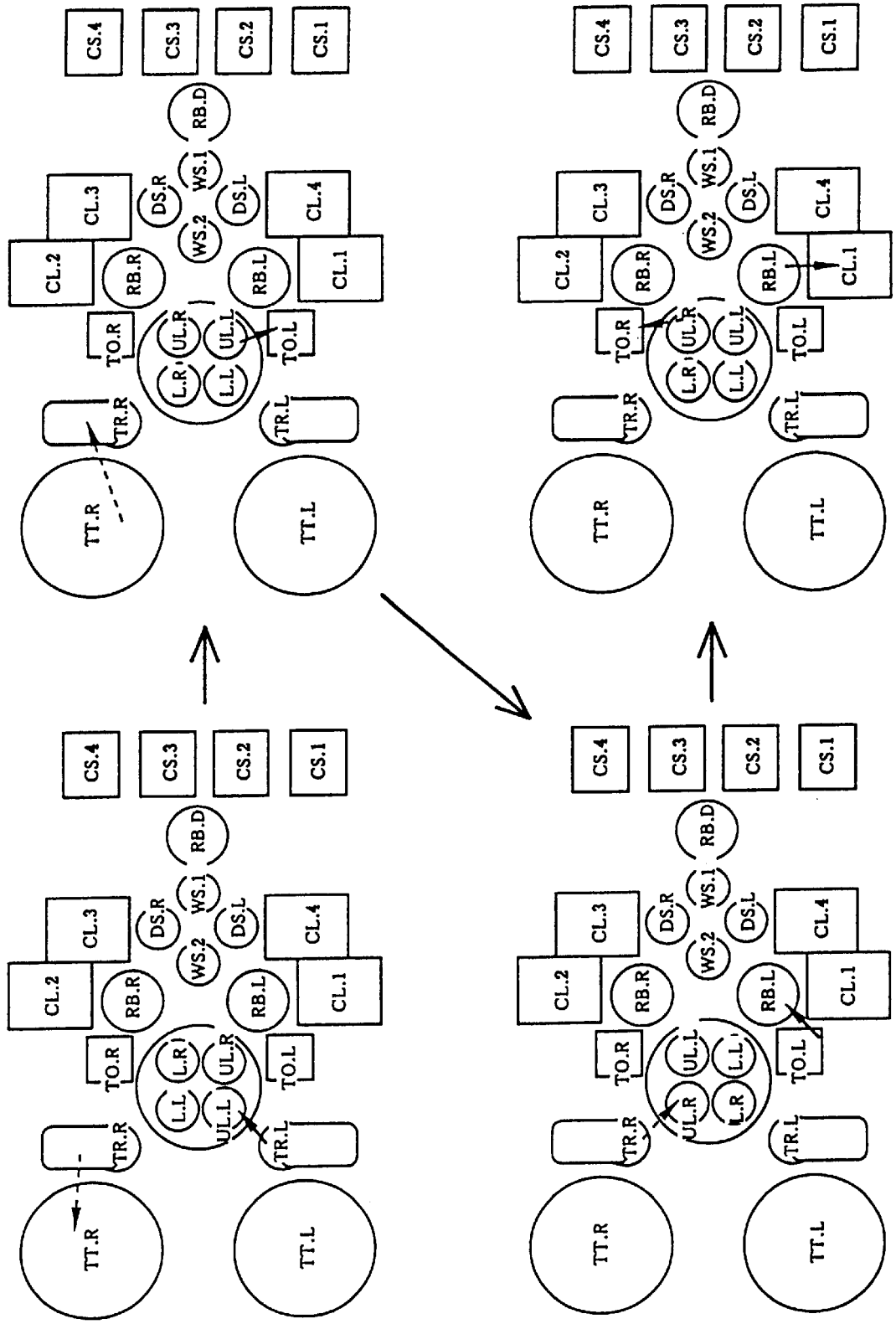
FIG. 10 is a diagram illustrative of the other process of polishing a semiconductor wafer with the polishing apparatus shown in FIG. 1.
Figure 11:
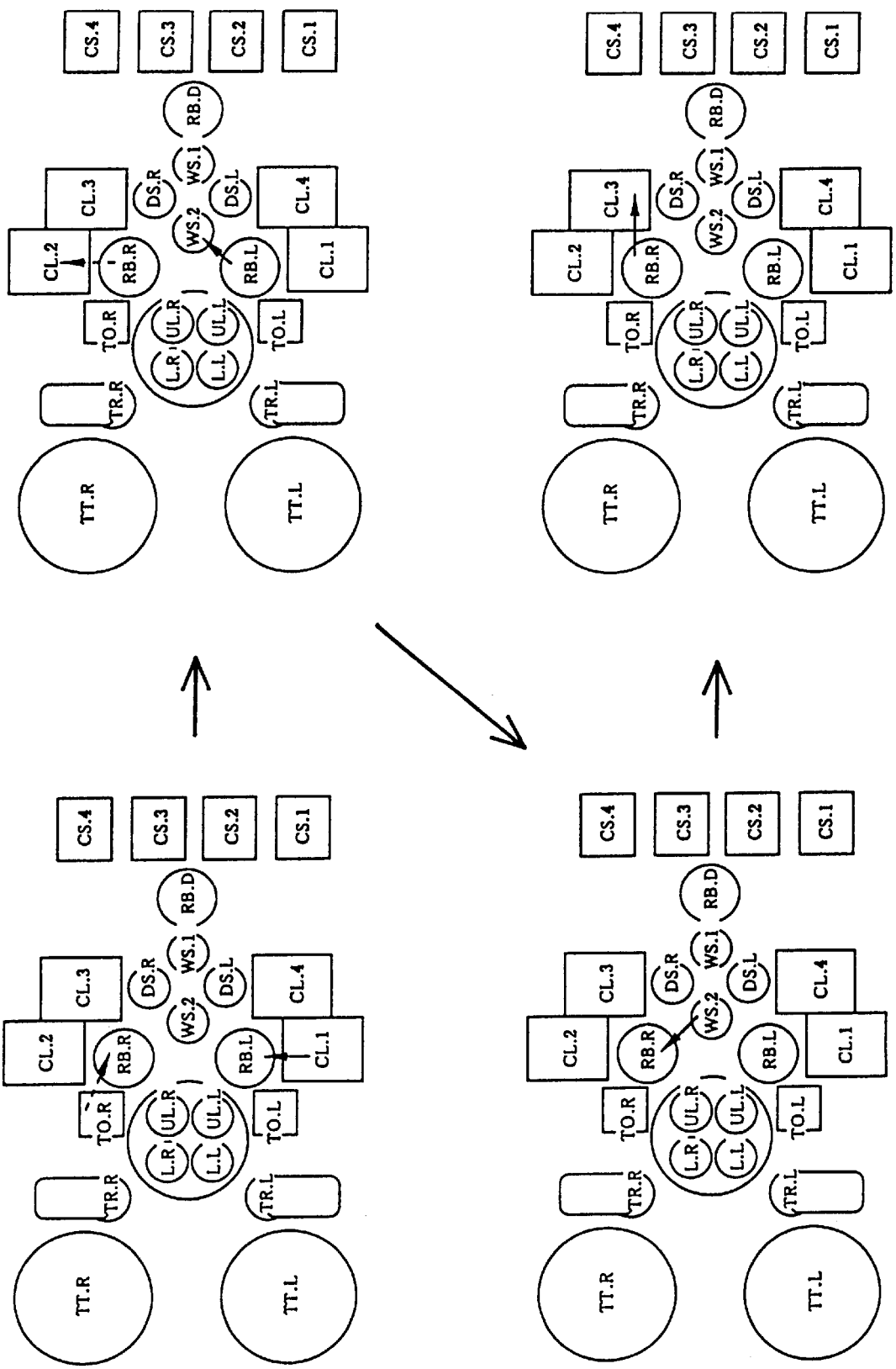
FIG. 11 is a diagram illustrative of the other process of polishing a semiconductor wafer with the polishing apparatus shown in FIG. 1.
Figure 12:
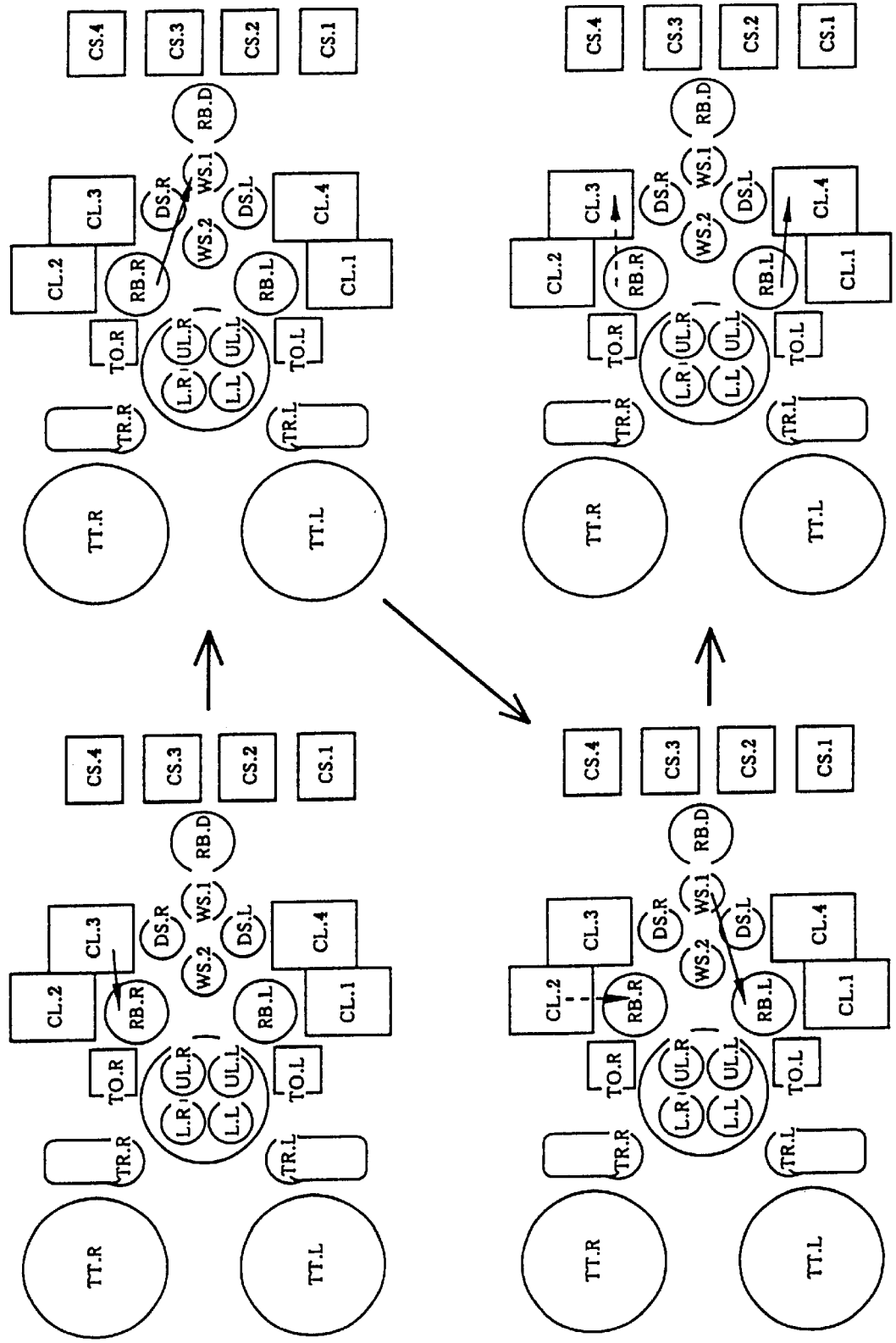
FIG. 12 is a diagram illustrative of the other process of polishing a semiconductor wafer with the polishing apparatus shown in FIG. 1.
Figure 13:
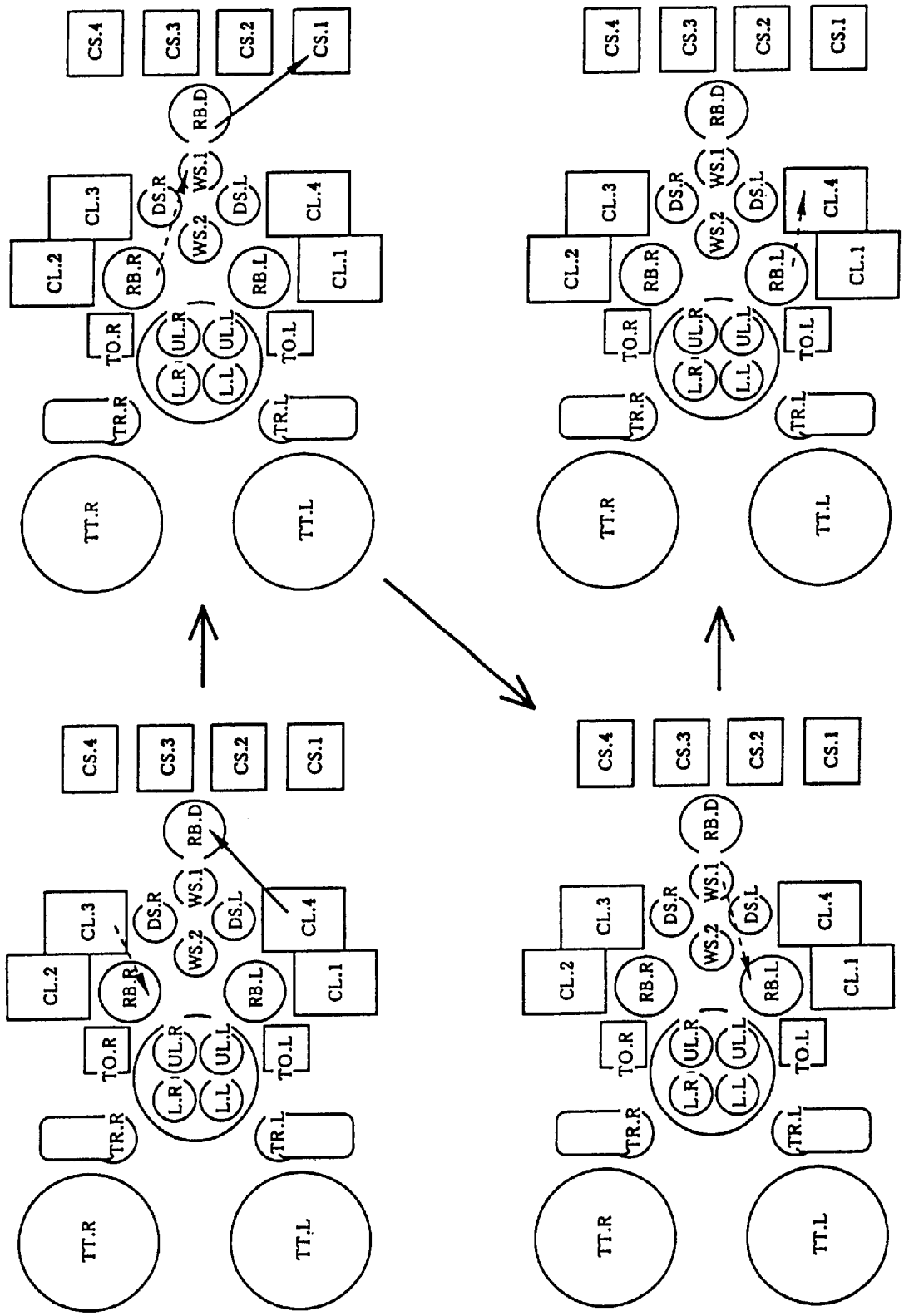
FIG. 13 is a diagram illustrative of the other process of polishing a semiconductor wafer with the polishing apparatus shown in FIG. 1.
Figure 15:
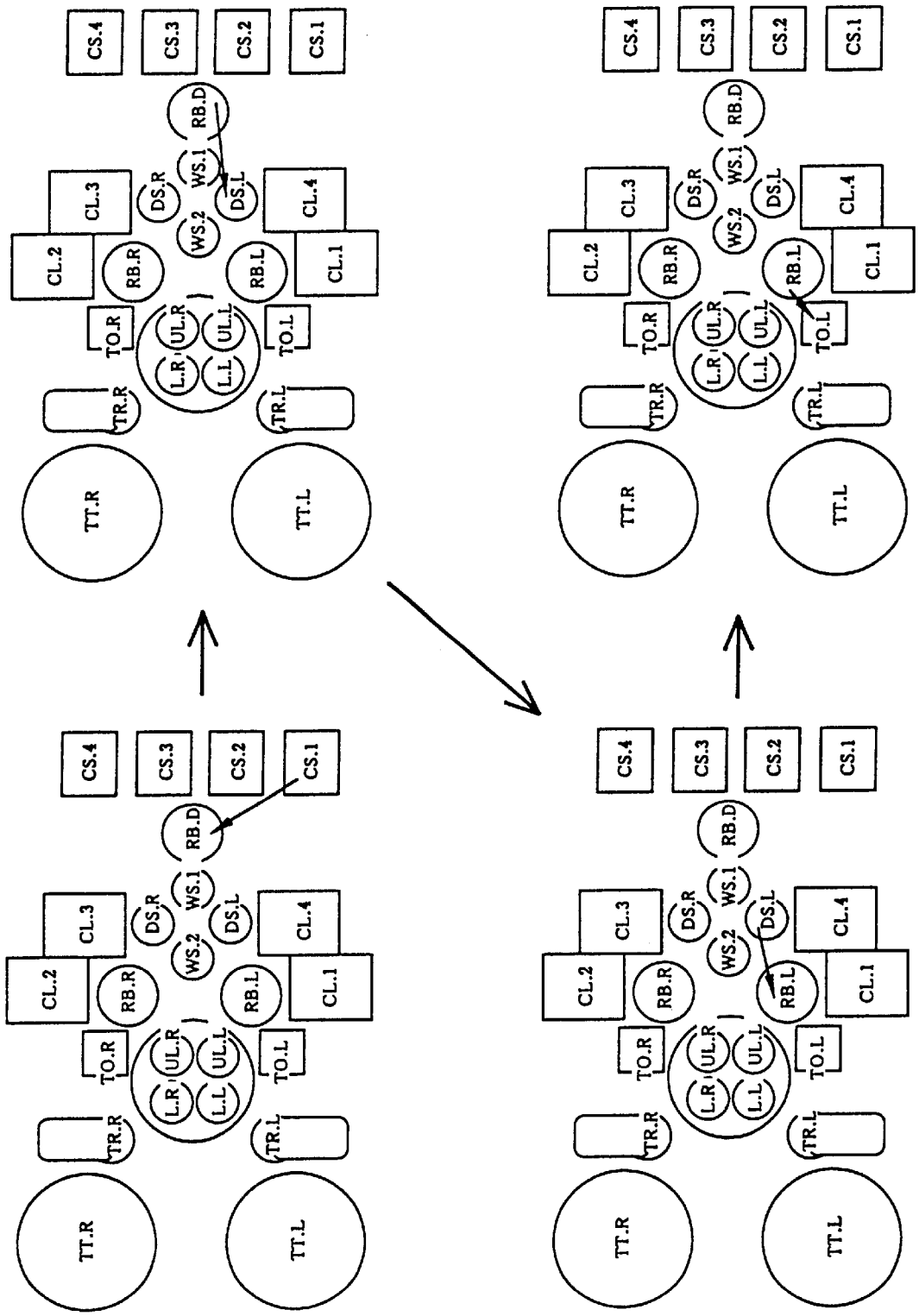
FIG. 15 is a diagram illustrative of still another process of polishing a semiconductor wafer with the polishing apparatus shown in FIG. 1.
Figure 16:
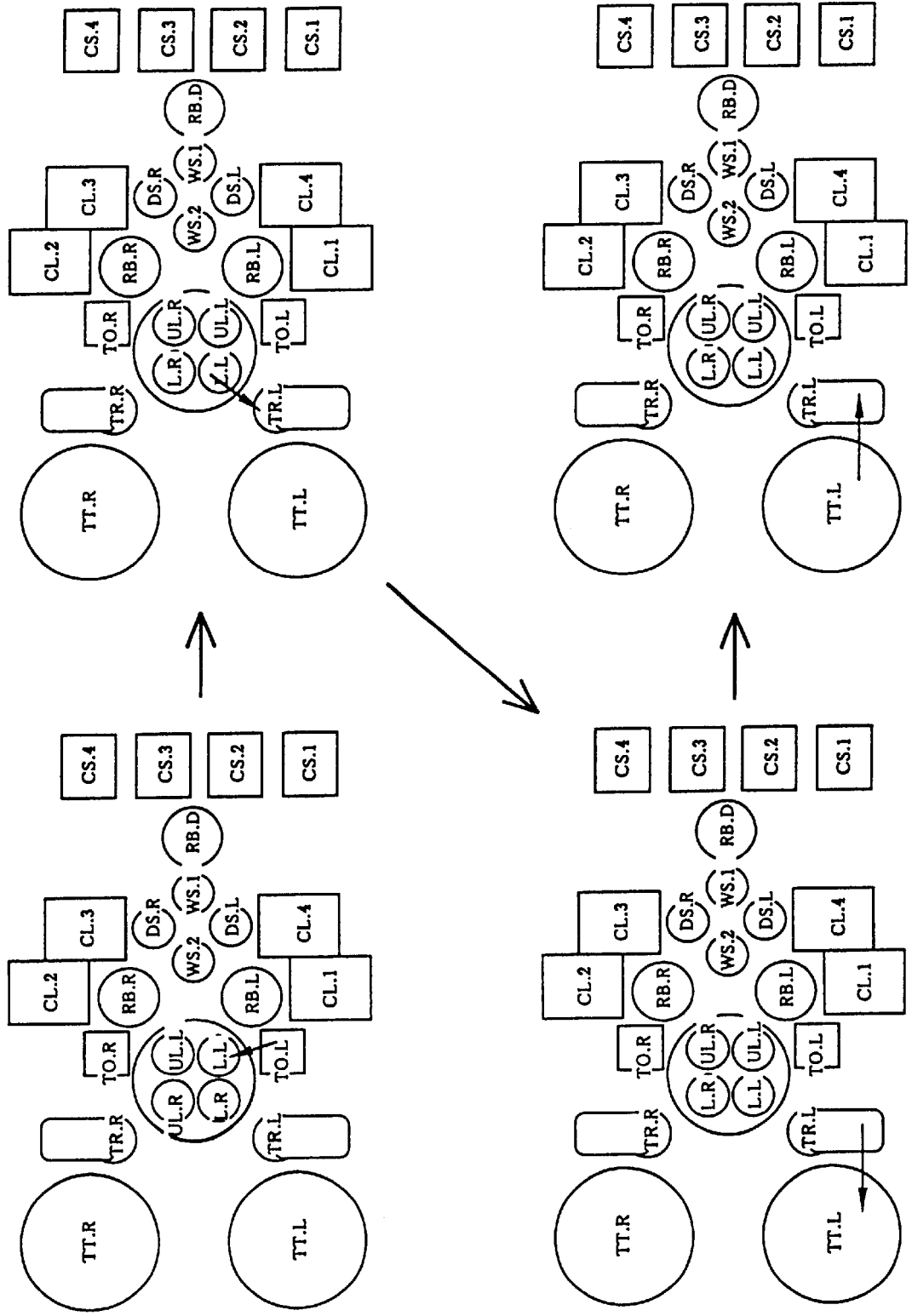
FIG. 16 is a diagram illustrative of the still other process of polishing a semiconductor wafer with the polishing apparatus shown in FIG. 1.
Figure 17:
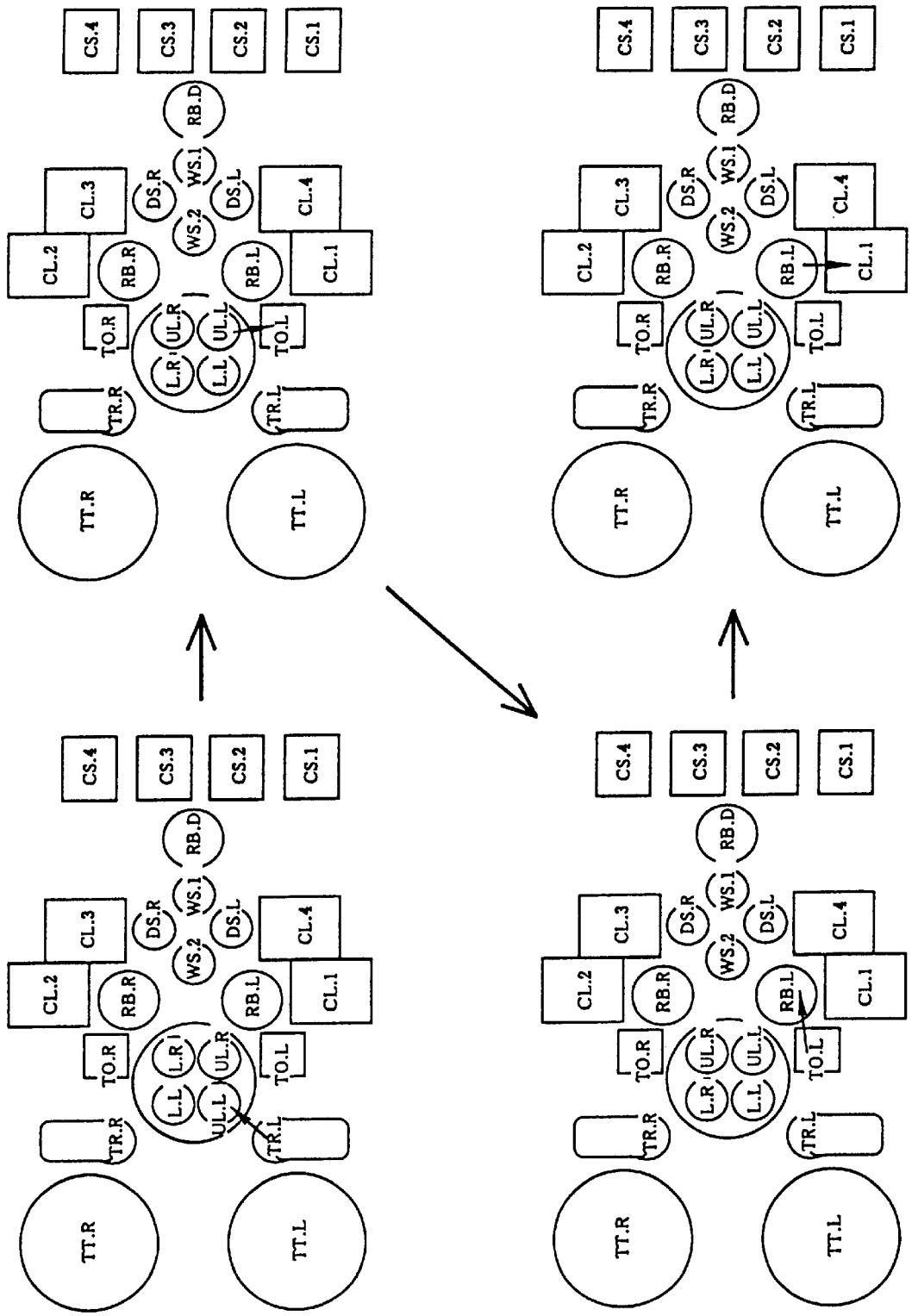
FIG. 17 is a diagram illustrative of the still other process of polishing a semiconductor wafer with the polishing apparatus shown in FIG. 1.
Figure 18:
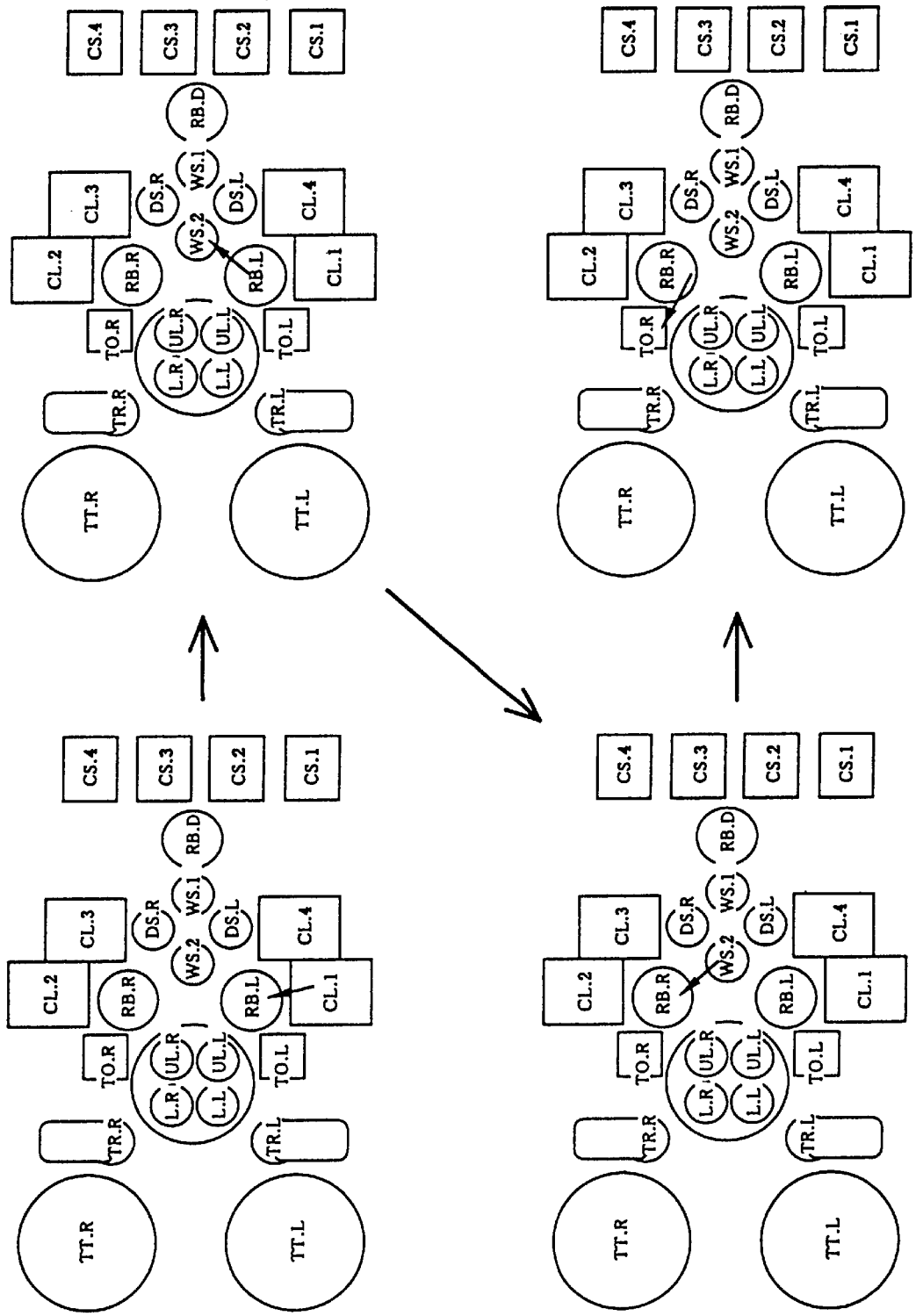
FIG. 18 is a diagram illustrative of the still other process of polishing a semiconductor wafer with the polishing apparatus shown in FIG. 1.
Figure 19:
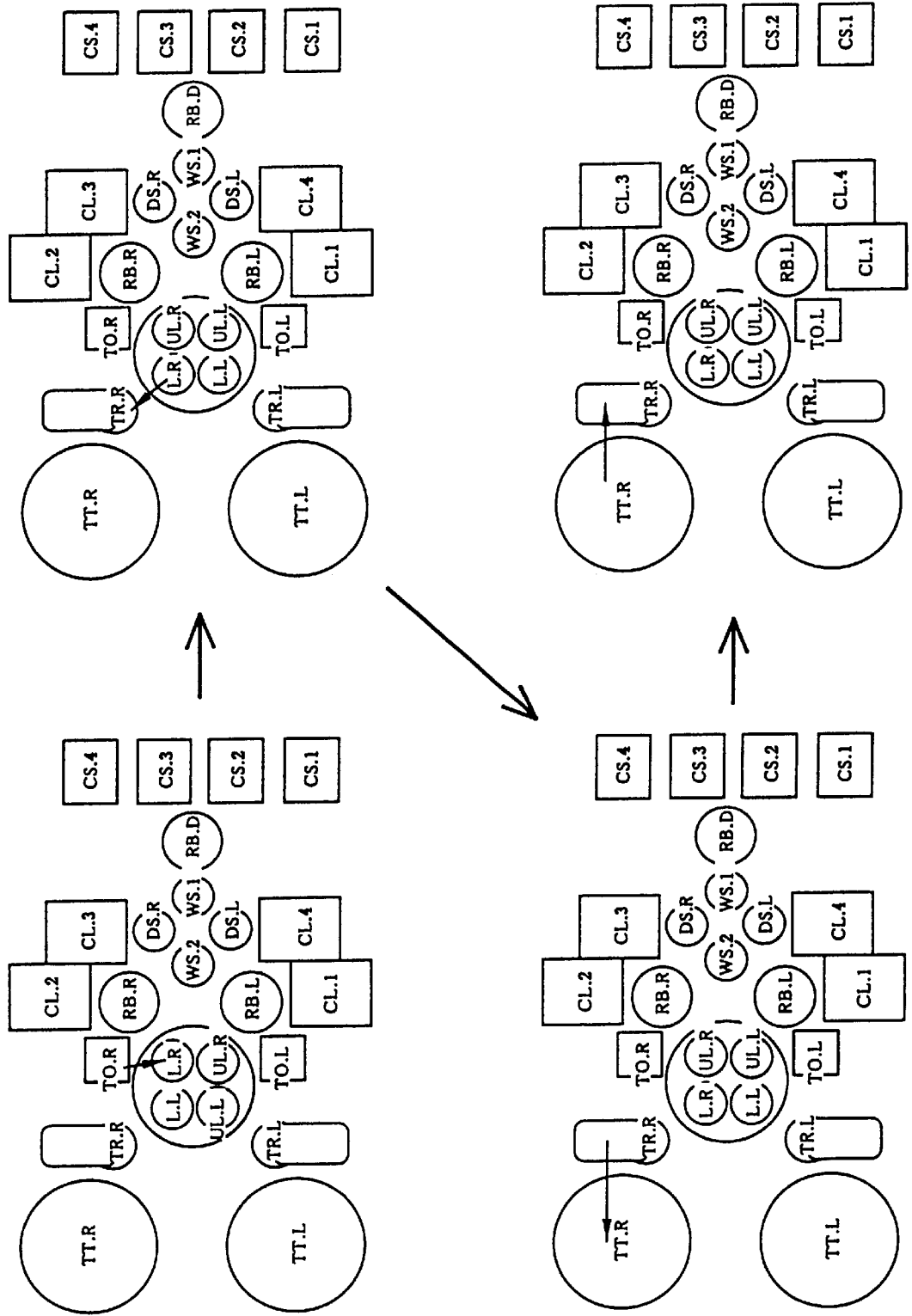
FIG. 19 is a diagram illustrative of the still other process of polishing a semiconductor wafer with the polishing apparatus shown in FIG. 1.
Figure 20:
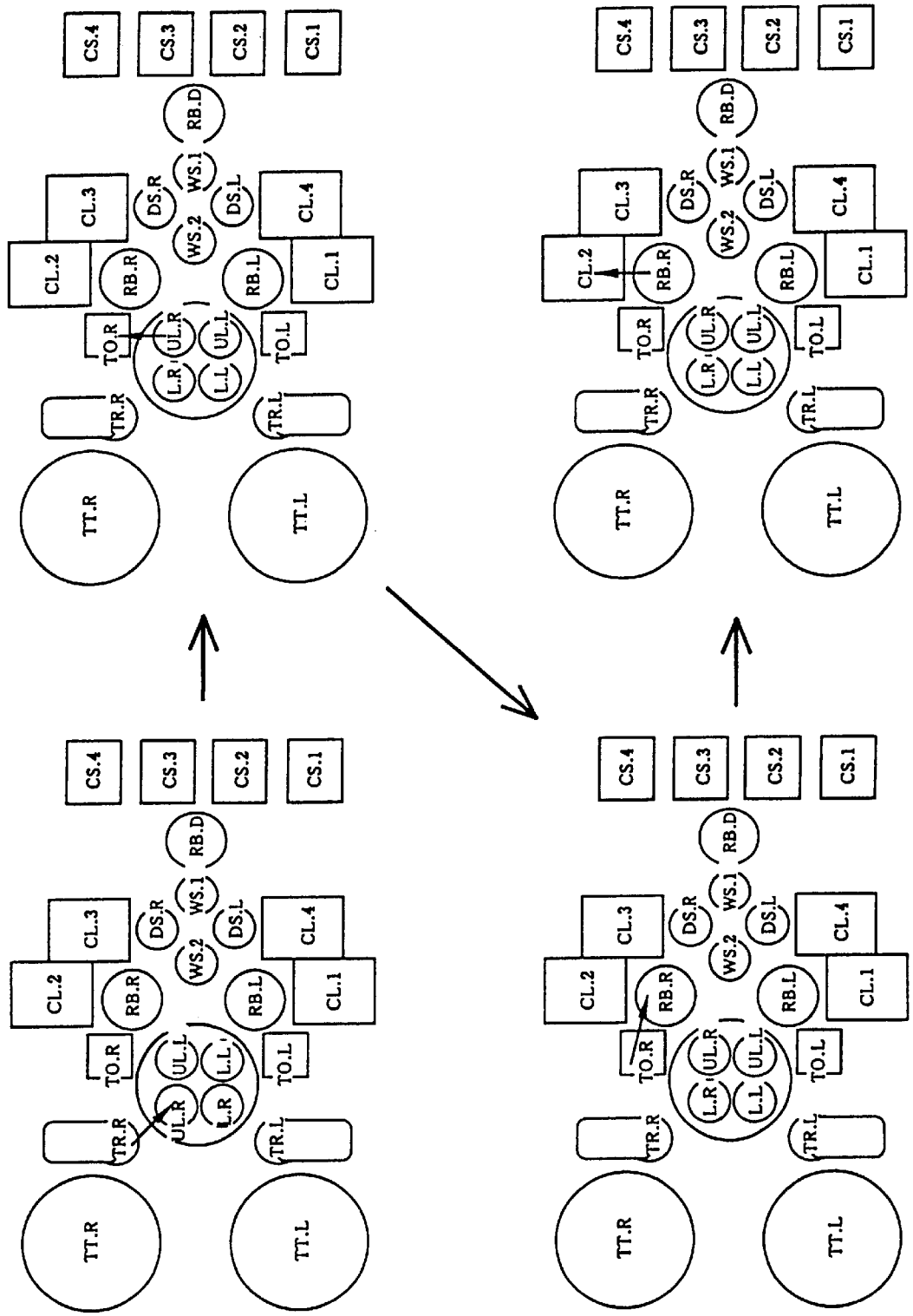
FIG. 20 is a diagram illustrative of the still other process of polishing a semiconductor wafer with the polishing apparatus shown in FIG. 1.
Figure 22:
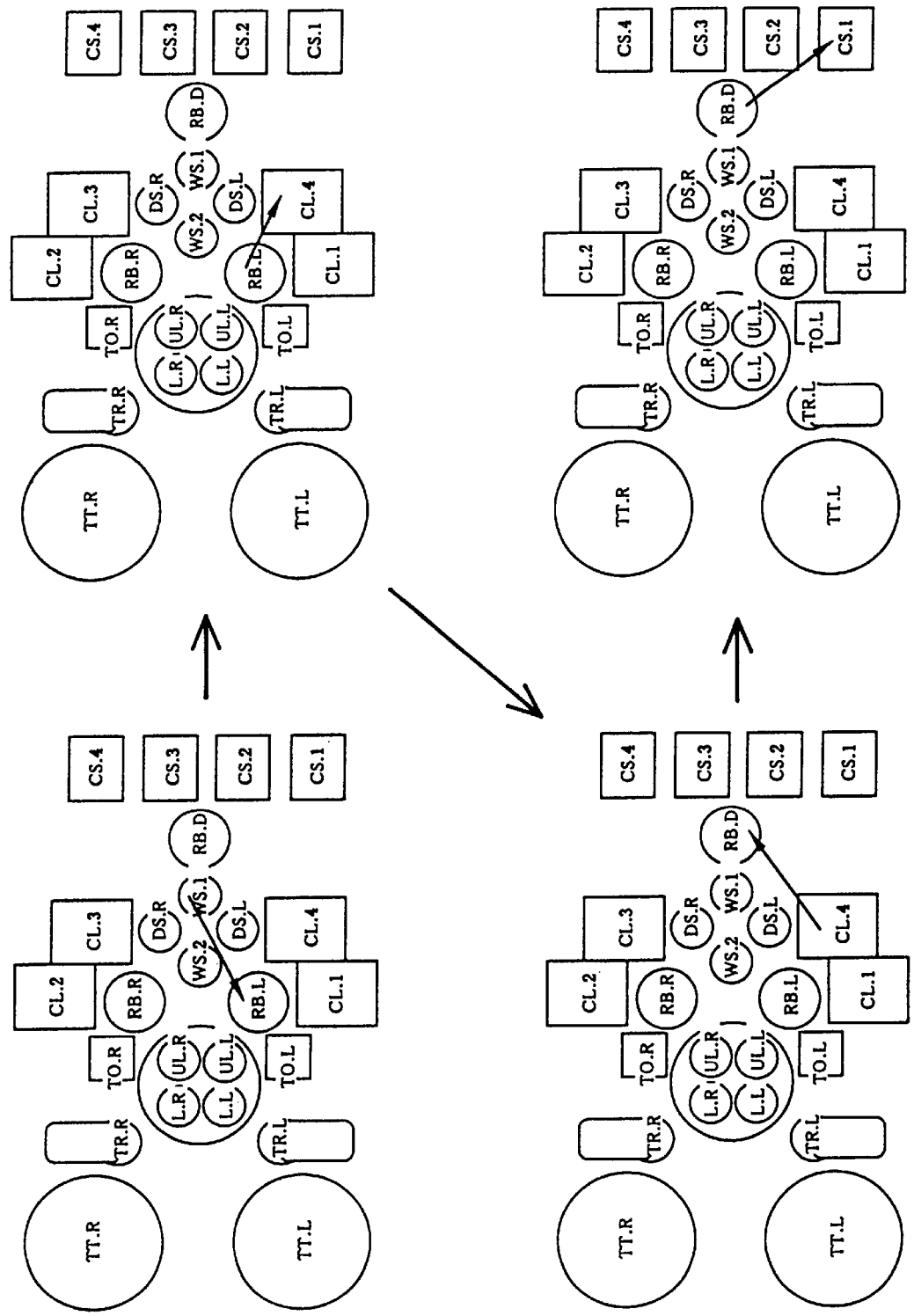
FIG. 22 is a diagram illustrative of the still other process of polishing a semiconductor wafer with the polishing apparatus shown in FIG. 1.

FIG. 2 shows the relationship between the top ring 32 and the turntables 34 and 36. The relationship between the top ring 33 and the turntables 35 and 37 is the same as that of the top ring 32 and the turntables 34 and 36. As shown in FIG. 2, the top ring 32 is supported from a top ring head 31 by a top ring drive shaft 91 which is rotatable. The top ring head 31 is supported by a support shaft 92 which can be angularly positioned, and the top ring 32 can access the turntables 34 and 36. The dresser 38 is supported from a dresser head 94 by a dresser drive shaft 93 which is rotatable. The dresser head 94 is supported by an angularly positionable support shaft 95 for moving the dresser 38 between a standby position and a dressing position over the turntable 34. The dresser 48 is similarly supported from a dresser head 97 by a dresser drive shaft 96 which is rotatable. The dresser head 97 is supported by an angularly positionable support shaft 98 for moving the dresser 48 between a standby position and a dressing position over the turntable 36.

As shown in FIG. 1, in the area C separated from the area B by the partition wall 24 and at a position that can be accessed by the hands of the transfer robot 20, there is provided a reversing device 28 for reversing a semiconductor wafer, and at a position that can be accessed by the hands of the transfer robot 21, there is provided a reversing device 28' for reversing a semiconductor wafer. The partition wall 24 between the area B and the areas C, D has two openings each for allowing semiconductor wafers to pass therethrough, one of which is used for transferring the semiconductor wafer to or from the reversing device 28 and the other of which is used for transferring the semiconductor wafer to or from the reversing device 28'. Shutters 25 and 26 are provided at the respective openings of the partition wall 24. The reversing devices 28 and 28' have a chuck mechanism for chucking a semiconductor wafer, a reversing mechanism for reversing a semiconductor wafer, and a semiconductor wafer detecting sensor for detecting whether the chuck mechanism chucks a semiconductor wafer or not, respectively. The transfer robot 20 transfers a semiconductor wafer to the reversing device 28, and the transfer robot 21 transfers a semiconductor wafer to the reversing device 28'.

A rotary transporter 27 is disposed below the reversing devices 28 and 28' and the top rings 32 and 33, for transferring semiconductor wafers between the cleaning chamber (area B) and the polishing chamber (areas C and D). The rotary transporter 27 has four stages for placing a semiconductor wafer at equal angular intervals, and can hold a plurality of semiconductor wafers thereon at the same time. The semiconductor wafer which has been transported to the reversing device 28 or 28' is transferred to the rotary transporter 27 by actuating a lifter 29 or 29' disposed below the rotary transporter 27 when the center of the stage of the rotary transporter 27 is aligned with the center of the semiconductor wafer held by the reversing device 28 or 28'. The semiconductor wafer placed on the stage of the rotary transporter 27 is transported to a position below the top ring 32 or 33 by rotating the rotary transporter 27 by an angle of 90°. At this time, the top ring 32 or 33 is positioned above the rotary transporter 27 beforehand by a swing motion thereof. The semiconductor wafer is transferred from the rotary transporter 27 to the top ring 32 or 33 by actuating a pusher 30 or 30' disposed below the rotary transporter 27 when the center of the top ring 32 or 33 is aligned with the center of the semiconductor wafer placed on the stage of the rotary transporter 27.

The semiconductor wafer transferred to the top ring 32 or 33 is held under vacuum by a vacuum attraction mechanism of the top ring 32 or 33, and transported to the turntable 34 or 35. Thereafter, the semiconductor wafer is polished by a polishing surface comprising a polishing cloth or a grinding stone (or a fixed abrasive plate) attached on the turntable 34 or 35. The second turntables 36 and 37 are disposed at positions that can be accessed by the top rings 32 and 33, respectively. With this arrangement, a primary polishing of the semiconductor wafer can be conducted by the turntable 34 or 35, and then a secondary polishing of the semiconductor wafer can be conducted by the second turntable 36 or 37. Alternatively, the primary polishing of the semiconductor wafer can be conducted by the second turntable 36 or 37, and then the secondary polishing of the semiconductor wafer can be conducted by the first turntable 34 or 35. In this case, since the second turntable 36 or 37 has a smaller-diameter polishing surface than the first turntable 34 or 35, a grinding stone (or a fixed abrasive plate) which is more expensive than a polishing cloth is attached to the second turntable 36 or 37 to thereby conduct a primary polishing of the semiconductor wafer. On the other hand, the polishing cloth having a shorter life but being cheaper than the grinding stone (or the fixed abrasive plate) is attached to the first turntable 34 or 35 to thereby conduct a finish polishing of the semiconductor wafer. This arrangement or utilization may reduce the running cost of the polishing apparatus. If the polishing cloth is attached to the first turntable and the grinding stone (or fixed abrasive plate) is attached to the second turntable, then the turntable system may be provided at a lower cost. This is because the grinding stone (or the fixed abrasive plate) is more expensive than the polishing cloth, and the price of the grinding stone (or the fixed abrasive plate) is substantially proportional to the diameter of the grinding stone. Further, since the polishing cloth has a shorter life than the grinding stone (or the fixed abrasive plate), if the polishing cloth is used under a relatively light load such as a finish polishing, then the life of the polishing cloth is prolonged. Further, if the diameter of the polishing cloth is large, the chance or frequency of the contact with the semiconductor wafer is distributed to thus provide a longer life, a longer maintenance period, and an improved productivity of the semiconductor devices.

After a semiconductor wafer is polished by the first turntable 34 and before the top ring 32 moves to the second turntable 36, a cleaning liquid is supplied from cleaning liquid nozzles 510 disposed adjacent to the turntable 34 to the semiconductor wafer held by the top ring 32 at a position where the top rind 32 is spaced from the turntable 34. Because the semiconductor wafer is rinsed before moving to the second turntable 36, the transfer of contamination between the turntables is prevented to thus avoid cross contamination of the turntables.

Further, two-stage polishing can be performed in such a manner that a polishing cloth sold under the tradename of IC1000/SUBA400 manufactured by Rodel Nitta corporation is used for the first polishing surface and a polishing cloth sold under the tradename of POLITEX manufactured by Rodel Nitta corporation is used for the second polishing surface, and the semiconductor wafer is first polished by the first polishing surface, and then polished by the second polishing surface. This two-stage polishing may be carried out by the use of the two large-sized turntables even if the small-sized second turntable is not used. In the above, although the two-stage polishing has been described as being conducted by two different polishing cloths, it may be conducted by the same polishing cloth or the same grinding stone. After the semiconductor wafer is polished by the first polishing surface and the second polishing surface, the first and second polishing surfaces are dressed by the dressers 38, 39, 48 and 49, respectively. The dressing process is a process for recovering the polishing surface of the turntable which has been degraded by polishing of the semiconductor wafers. This process is also called conditioning or rectification.

The semiconductor wafer which has been polished is returned to the reversing device 28 or 28' in the reverse route to the above. The semiconductor wafer returned to the reversing device 28 or 28' is rinsed by pure water or chemicals supplied from rinsing nozzles. Further, the semiconductor wafer holding surface of the top ring 32 or 33 from which the semiconductor wafer has been removed is also cleaned by pure water or chemicals supplied from cleaning nozzles, and in some cases, the semiconductor wafer holding surface of the top ring 32 or 33 is rinsed for preventing the semiconductor wafer holding surface from being dried. A cleaning nozzle or nozzles for cleaning the pusher are provided on the partition wall. In order to improve yield of the semiconductor device or cleaning effect of the semiconductor wafer, the semiconductor wafer may be rinsed by chemicals in such a state that the semiconductor wafer is held by the top ring 32 or 33. Further, the semiconductor wafer may be rinsed by chemicals in such a state that the semiconductor wafer is held by the rotary transporter 27. Further, the lifter 29 or 29' may be cleaned by nozzles (described later).

On the right side of FIG. 2, the relationship of the rotary transporter 27, the reversing device 28 or 28', the lifter 29 or 29', and the pusher 30 or 30' is shown. As shown in FIG. 2, the reversing units 28 and 28' are disposed above the rotary transporter 27, and the lifters 29 and 29' and the pushers 30 and 30' are disposed below the rotary transporter 27.

Next, transport routes for transporting semiconductor wafers will be described.

All software is constructed such that all units or devices are freely combined and set in normal processing routes of the semiconductor wafers in the polishing apparatus. Examples of the processing routes are the following:

1) Method (2 cassette parallel processing) in which semiconductor wafers in one wafer cassette are processed in one of the two areas C and D, and semiconductor wafers in another wafer cassette are processed in the other of the two areas C and D;

2) Method (1 cassette parallel processing) in which semiconductor wafers in one wafer cassette are distributed into the area C and the area D arbitrarily; and 3) Method (serial processing) in which semiconductor wafers in one wafer cassette are processed in one of the areas C and D, and then processed in the other of the areas C and D.

In the cleaning chamber, polished semiconductor wafers discharged from the polishing chambers are processed according to any one of the following six processes:

A) Process in which semiconductor wafers are cleaned in two-stages by two arrays of cleaning apparatuses and discharged, i.e., from the cleaning apparatus 22 to the cleaning apparatus 5 and from the cleaning apparatus 23 to the cleaning apparatus 6;

B) Process in which semiconductor wafers are cleaned in three-stages by one array of cleaning apparatuses and discharged, i.e., from the cleaning apparatus 23 to the cleaning apparatus 6 and then to the cleaning apparatus 5 or in three-stages by one array of cleaning apparatuses and discharged, i.e., from the cleaning apparatus 22 to the cleaning apparatus 23 or 6 and then to the cleaning apparatus 5;

C) Process in which semiconductor wafers are cleaned in three-stages and discharged, i.e., in one-stage by two cleaning apparatuses, i.e., either one of the cleaning apparatuses 22, 23 where no cleaning is being conducted, and in two-stages by one array of cleaning apparatuses, i.e., from the cleaning apparatus 6 to the cleaning apparatus 5;

D) Process in which semiconductor wafers are cleaned in four-stages by one array of cleaning apparatuses and discharged, i.e., from the cleaning apparatus 23 to the cleaning apparatus 6 and then to the cleaning apparatus 22 and then to the cleaning apparatus 5;

E) Process in which semiconductor wafers are cleaned in four-stages by one array of cleaning apparatuses and discharged, i.e., from the cleaning apparatus 22 to the cleaning apparatus 23 and then to the cleaning apparatus 6 and then to the cleaning apparatus 5; and F) Process in which semiconductor wafers are cleaned in three-stages by one array of cleaning apparatuses and discharged, i.e., from the cleaning apparatus 23 to the cleaning apparatus 6 and then to the cleaning apparatus 5, after the semiconductor wafers which have been polished in a first stage are cleaned by the cleaning apparatus 22 and then polished again in a second stage.

Combinations of the methods 1)–3) and the processes A)–F) provide their respective features as follows:

(1–A):

This combination is effective in a case where different processes are carried out for two wafer cassettes and a case where a plurality of lots of semiconductor wafers are discharged at a high throughput. If different processes are carried out for the two wafer cassettes, then an apparatus configuration or arrangement provided by a combination of two dry-in and dry-out type polishing apparatuses, for example, is employed. Since this combination offers the greatest throughput, it is used to achieve a higher production capability with the same process being carried out on semiconductor wafers from the two wafer cassettes.

(2-A):

This combination is effective to process semiconductor wafers in one wafer cassette in a short period of time. This combination also allows semiconductor wafers in one wafer cassette to be processed in two arbitrary different types of processes.

(3-A):

In the case where the time required to clean a semiconductor wafer in at least one of the two cleaning stages is longer than the time required to polish a semiconductor wafer in either one of the two polishing stages, if the two cleaning stages are carried out by one array of cleaning apparatuses, then the polishing capability is lowered because of the long cleaning time. In this case, if the two cleaning stages are carried out by two arrays of cleaning apparatuses, then polished semiconductor wafers can be delivered without being affected by the cleaning time. This combination is highly effective in this case.

(1-B):

This combination is used in a case where three or more types of cleaning process are required after the polishing process. Since the cleaning process is carried out by one array of cleaning apparatuses, the processing capability of the cleaning process according to this combination is reduced, and the combination is highly effective in a case where the polishing time is longer than the cleaning time.

(2-B):

This combination is used in a case where only one lot is processed, but not a plurality of lots are processed at once as with the combination (1-B), and offers the same advantages as with the combination (1-B).

(3-B):

This combination is used in a case where three cleaning stages are needed as with the combination (1-B).

(1-C):

This combination offers the same advantages as with the combination (1-B). If the cleaning time in the first cleaning stage is longer than the processing time in another wafer processing unit, then the first cleaning stage is carried out by two cleaning apparatuses for preventing semiconductor wafers from being jammed at the first cleaning apparatus, thereby increasing the processing capability.

(2-C):

As with the combination (1-C), this combination is used for the same reason as the combination (2-B).

(3-C):

As with the combination (1-C), this combination is used for the same reason as the combination (3-B).

(1, 2, 3-D, E):

This combination is used in a case where four cleaning stages are required in addition to the use of the respective polishing chambers.

(3-F):

In the two-stage polishing process, this combination is used to transport semiconductor wafers through a cleaning process before the second polishing stage for preventing the semiconductor wafers to which the abrasive liquid used in the first polishing stage is attached from being polished in the second polishing stage.

As described above, since the polishing apparatus according to the present invention has the two polishing sections having the respective turntables 34 and 35, one of the polishing sections can be inspected and serviced for maintenance while the polishing apparatus is in operation using the other polishing section.

A cleaning section has the cleaning apparatuses 5, 6, 22 and 23 for cleaning semiconductor wafers. While the polishing apparatus is in operation using at least one of the cleaning apparatuses, the other cleaning apparatuses can be inspected and serviced for maintenance.

FIGS. 3 through 22 show processes of polishing a semiconductor wafer with the polishing apparatus shown in FIG. 1. FIGS. 3 through 14 show a process in which a semiconductor wafer is taken out from a wafer cassette CS1, polished, cleaned, and returned to the wafer cassette CS1, and a process in which a semiconductor wafer is taken out from another wafer cassette CS2, polished, cleaned, and returned to the wafer cassette CS2. FIGS. 15 through 22 show a process in which a semiconductor wafer is taken out from the wafer cassette CS1, polished, cleaned, and returned to the wafer cassette CS1. In FIGS. 3 through 22, the wafer cassettes 1 are represented by CS1, CS2, CS3 and CS4, the transfer robots 4, 20 and 21 are represented by RBD, RBL and RBR, and the cleaning apparatuses 22, 23, 6 and 5 are represented by CL1, CL2, CL3 and CL4. The reversing devices 28 and 28' are represented by TOL and TOR, the turntables 34 and 35 are represented by TTL and TTR, and the top rings 32 and 33 are represented TRL and TRR. The wafer stages for loading in the rotary transporter 27 are represented by LR and LL, the wafer stages for unloading in the rotary transporter 27 are represented by ULR and ULL, and the wafer supports 7, 8, 9 and 10 of the wafer station 50 are represented by DSL, DSR, WS1 and WS2.

FIGS. 3 through 7 show two cassette parallel processing process in which two-stage cleaning is performed.

As shown in FIGS. 3 through 7, one semiconductor wafer is processed in the following route: the wafer cassette (CS1)→the transfer robot (RBD)→the wafer support of the wafer station (DSL)→the transfer robot (RBL)→the reversing device (TOL)→the wafer stage for loading in the rotary transporter (LL)→the top ring (TRL)→the turntable (TTL)→the top ring (TRL)→the wafer stage for unloading in the rotary transporter (ULL)→the reversing device (TOL)→the transfer robot (RBL)→the cleaning apparatus (CL1)→the transfer robot (RBL)→he cleaning apparatus (CL4)→the transfer robot (RBD)→the wafer cassette (CS1).

The other semiconductor wafer is processed in the following route: the wafer cassette (CS2)→the transfer robot (RBD)→the wafer support of the wafer station (DSR)→the transfer robot (RBR)→the reversing device (TOR)→the wafer stage for loading in the rotary transporter (LR)→the top ring (TRR)→the turntable (TTR)→the top ring (TRR)→the wafer stage for unloading in the rotary transporter (ULR)→the reversing device (TOR)→the transfer robot (RBR)→the cleaning apparatus (CL2)→the transfer robot (RBR)→the cleaning apparatus (CL3)→the transfer robot (RBD)→the wafer cassette (CS2).

FIGS. 8 through 14 show two cassette parallel processing in which three-stage cleaning is performed.

As shown in FIGS. 8 through 14, one semiconductor wafer is processed in the following route: the wafer cassette (CS1)43 the transfer robot (RBD)→the wafer support of the wafer station (DSL)→the transfer robot (RBL)→the reversing device (TOL)→the wafer stage for loading in the rotary transporter (LL)→the top ring (TRL)→the turntable (TTL)→the top ring (TRL)→the wafer stage for unloading in the rotary transporter (ULL)→the reversing device (TOL) the transfer robot (RBL)→the cleaning apparatus (CL1)→the transfer robot (RBL)→the wafer support of the wafer station (WS2)→the transfer robot (RBR)→the cleaning apparatus (CL3)→the transfer robot (RBR)→the wafer support of the wafer station (WS1)→the transfer robot (RBL)→the cleaning apparatus (CL4)→the transfer robot (RBD)→the wafer cassette (CS1).

The other semiconductor wafer is processed in the following route: the wafer cassette (CS2)→the transfer robot (RBD)→the wafer support of the wafer station (DSR)→the transfer robot (RBR)→the reversing device (TOR)→the wafer stage for loading in the rotary transporter (LR)→the top ring (TRR)→the turntable (TTR)→the top ring (TRR)→the wafer stage for unloading in the rotary transporter (ULR)→the reversing device (TOR)→the transfer robot (RBR)→the cleaning apparatus (CL2)→the transfer robot (RBR)→the cleaning apparatus (CL3)→the transfer robot (RBR)→the wafer support of the wafer station (WS1)→the transfer robot (RBL)→the cleaning apparatus (CL4)→the transfer robot (RBD)→the wafer cassette (CS2).

FIGS. 15 through 22 show a serial processing in which three-stage cleaning is performed.

As shown in FIGS. 15 through 22, the semiconductor wafer is processed in the following route: the wafer cassette (CS1)→the transfer robot (RBD)→the wafer support of the wafer station (DSL)→the transfer robot (RBL)→the reversing device (TOL)→the wafer stage for loading in the rotary transporter (LL)→the top ring (TRL)→the turntable (TTL)→the top ring (TRL)→the wafer stage for unloading in the rotary transporter (ULL)→the reversing device (TOL)→the transfer robot (RBL)→the cleaning apparatus (CL1)→the transfer robot (RBL)→the wafer support of the wafer station (WS2)→the transfer robot (RBR)→the reversing device (TOR)→the wafer stage for loading in the rotary transporter (LR)→the top ring (TRR)→the turntable (TTR)→the top ring (TRR)→the wafer stage for unloading in the rotary transporter (ULR)→the reversing device (TOR)→the transfer robot (RBR)→the cleaning apparatus (CL2)→the transfer robot (RBR)→the cleaning apparatus (CL3)→the transfer robot (RBR)→the wafer support of the wafer station (WS1)→the transfer robot (RBL)→the cleaning apparatus (CL4)→the transfer robot (RBD)→the wafer cassette (CS1).

In examples shown in FIGS. 3 through 22, it is described that one semiconductor wafer is taken out from the wafer cassette (CS1), and another semiconductor wafer is taken out from the wafer cassette (CS2). However, the wafer cassettes (CS1) and (CS2) may be used for dedicatedly supplying the semiconductor wafers to the turntable (TTL), and the wafer cassettes (CS3) and (CS4) may be used for dedicatedly supplying the semiconductor wafers to the turntable (TTR).

Next, the components of the polishing apparatus shown in FIG. 1 will be described in detail below.

Loading and Unloading Section

FIGS. 1, 23A and 23B are front and side elevational views of the loading and unloading section.

As shown in FIGS. 1, 23A and 23B, the loading and unloading section has four load-unload stages 2 each for placing a wafer cassette 1 (open cassette). The load-unload stages 2 have a positioning mechanism in the form of a block configurated to match the shape of a lower portion of the wafer cassette 1, for holding a wafer cassette in the same position at all times even when the wafer cassette is repeatedly placed thereon. When a wafer cassette is placed in a proper position, the presence of the wafer cassette is detected by a button-type sensor. A pair of transmission type light sensors 351 are positioned above and below a wafer cassette such that light between the transmission type light sensors 351 is blocked by any wafer that projects out of position. Therefore, the transmission type light sensors 351 can detect any semiconductor wafer that projects out of position and determine whether semiconductor wafers are properly placed in respective slots in the wafer cassette. If any semiconductor wafer that projects out of position is detected, then an interlocking mechanism is operated to control the transfer robot 4 and a search mechanism 352 so as not to access the loading and unloading section.

Dummy wafer stations 353 are disposed below the respective load-unload stages 2. Each of the dummy wafer stations 353 is capable of placing one or more wafers thereon, and can hold a dummy wafer for use in stabilizing a polishing cloth before a product wafer is processed and a QC (quality control) wafer to be delivered for confirming the status or condition of the polishing apparatus. Each of the dummy wafer stations 353 has a pair of wafer detecting sensors 354 for confirming the presence of a semiconductor wafer therein. Each of the dummy wafer stations 353 also has a sensor for detecting a semiconductor wafer that projects out of position, but the transmission type light sensors 351 may be also used as such sensors. If no wafer cassette is placed on the load-unload stage 2, the load-unload stage 2 located above each of the dummy wafer stations 353 may be lifted, and a wafer may manually be placed on the dummy wafer station 353. According to a standard procedure, after a wafer cassette with wafers inserted therein is placed on any one of the load-unload stages 2, wafers are searched for, and an instruction is sent from a control panel to indicate which wafer is to be sent to the selected dummy wafer station. Then, the selected wafer is delivered from the wafer cassette to the dummy wafer station by the transfer robot 4 which can access both the wafer cassette and the dummy wafer station.

A wafer search mechanism 352 is disposed below each of the load-unload stages 2, and each of the dummy wafer stations 353, if any. The wafer search mechanism 352 is vertically movable with a pair of wafer search sensors 356 mounted on the tip end thereof by a driving source 355 comprising a pulse motor. While the wafer search mechanism 352 is not in a wafer search operation, the wafer search mechanism 352 is kept in a standby position within the apparatus for avoiding interference with other operating members. The wafer search sensors 356 are disposed in confronting relation to each other such that light traveling therebetween passes horizontally through the wafer cassette as viewed from a side of the loading and unloading section. While the wafer search mechanism 352 is in a wafer search operation, it moves from a position below the dummy wafer station 353 to a position above a final slot in the wafer cassette in a reciprocating manner, counts the number of times that the light is interrupted by a semiconductor wafer for thereby counting the number of wafers in the wafer cassette, detects the positions of the semiconductor wafers from the pulses of the pulse motor as the driving source, and determines which slots in the wafer cassette the semiconductor wafers are placed in. The wafer search mechanism 352 also has an oblique wafer detecting function to detect an obliquely inserted wafer when the light between the wafer search sensors 356 is interrupted for the time corresponding to the number of pulses that is greater than the number of pulses corresponding to the spacing between the slots in the wafer cassette which has been stored in advance.

A shutter 357 that is vertically movable by an air cylinder is disposed between an opening in the wafer cassette and the apparatus for thereby separating the cassette placing area and the interior of the apparatus. The shutter 357 is closed except when the transfer robot 4 transfers the semiconductor wafers to or from the wafer cassette. A partition 358 is disposed between the load-unload stages 2 arrayed in front of the apparatus for allowing the operator to access the processed wafer cassette for replacement without touching an adjacent wafer cassette which is in operation.

The load-unload stages 2 have respective front sides separated from the exterior of the apparatus by a door 360. The door 360 has a lock mechanism and a sensor 361 for detecting whether the door is open or closed. While a wafer cassette is being processed, the door 360 is locked by the lock mechanism to protect the wafer cassette and avoid danger to the operator. When the door 360 is left open for a certain period of time, an alarm is issued.

There are two methods of placing a wafer cassette in the loading and unloading section.

(1) According to one method, a wafer cassette housing semiconductor wafers is placed directly on a wafer support portion. This process is employed when a chamber of a clean room facing the loading and unloading section is relatively clean, i.e., has a class 100 clean room environment or lower, for example.

(2) According to another method, when a chamber of a clean room facing the loading and unloading section is relatively dirty, i.e., has a class 1000 clean room environment or higher, for example, the wafer cassette is placed in a box which is controlled in about class 100 clean room environment, and delivered in the clean room and placed on the loading and unloading section.

If the method (1) described above is employed, a filter fan unit 10000 is mounted on the loading and unloading section for keeping the wafer support portions clean at all times.

Figure 24:
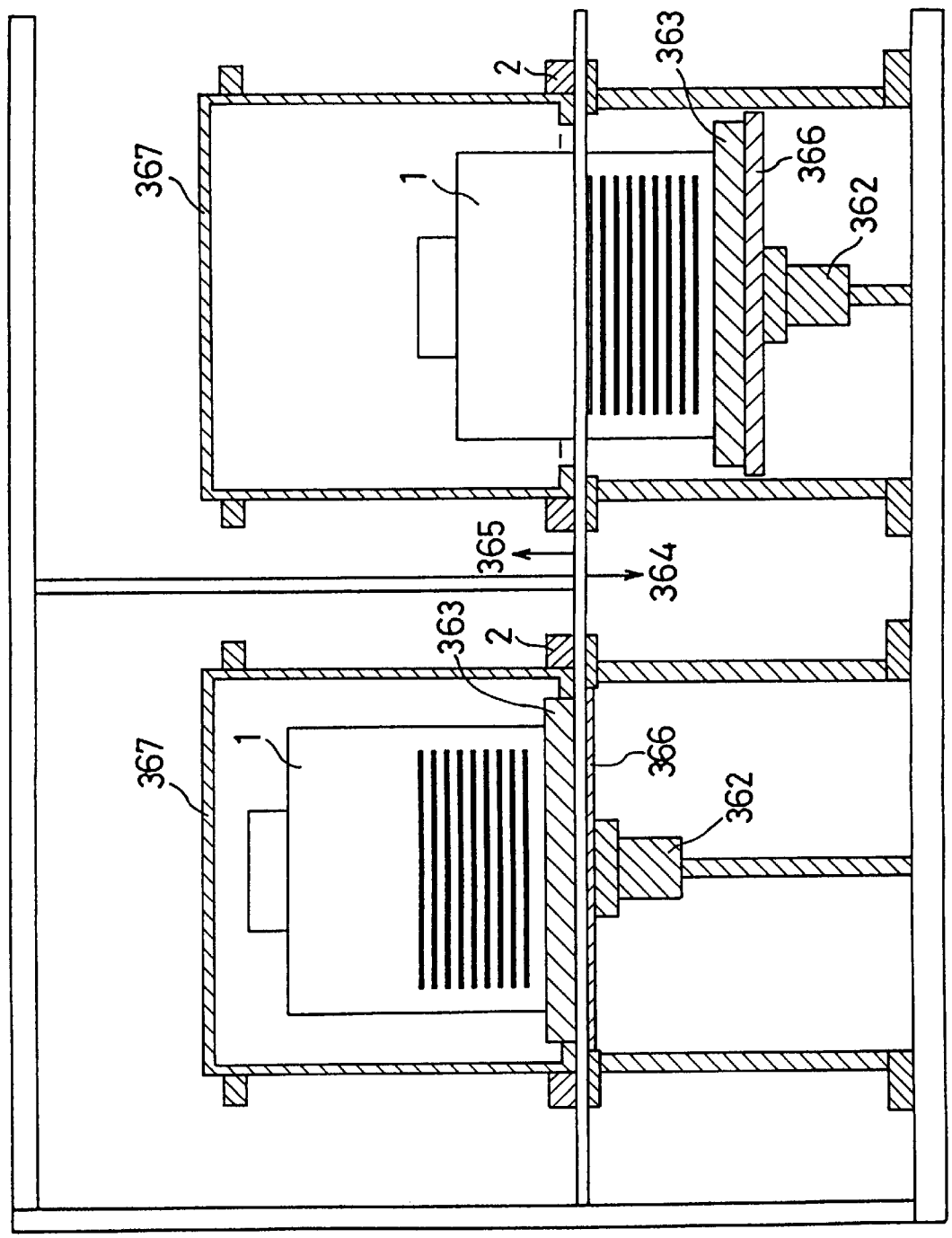
FIG. 24 is a front elevational view of another loading and unloading section.

FIG. 24 shows another loading and unloading section which is operated according to the method (2) described above. According to the method (2), a wafer cassette 1 is housed in a box 367 and placed on a load-unload stage 2. When the box 367 is placed on the load-unload stage 2, a stage 366 attached to the load-unload stage 2 and a bottom plate 363 of the box 367 are locked and fixed to each other. The bottom plate 363 is attached to the box 367 so as to fully close the box 367. At the same time that the stage 366 and the bottom plate 363 are locked to each other, the load-unload stage 2 and the box 367 are held in intimate contact with each other, and the box 367 and the bottom plate 363 are released from each other and can freely detached from each other.

The stage 366 has a lifting mechanism 362 for lifting and lowering the stage 366 and the bottom plate 363 on which the wafer cassette 1 is placed. When it is confirmed that the stage 366 and the bottom plate 363 are locked to each other, the stage 366 is lowered to introduce the wafer cassette 1 into an apparatus interior 364. If the apparatus interior 364 is kept clean, then the wafer cassette 1 can be carried into the apparatus interior 364 without being exposed to an exterior atmosphere 365 which is dirtier than the apparatus interior 364. By allowing the transfer robot 4 to move to a position adjacent to the wafer cassette 1 to receive semiconductor wafers in the wafer cassette 1 located below the load-unload stage 2, the semiconductor wafer can be fed into the polishing apparatus.

Cleaning Apparatus

Of the cleaning apparatuses mounted in the polishing apparatus, the cleaning apparatuses 22 and 23 have a roll-shaped sponge rotatable about its own axis and pressed against a semiconductor wafer to clean the reverse side of the semiconductor wafer. For cleaning the face side (polished surface) of the semiconductor wafer, the cleaning apparatuses 22 and 23 may have a roll type cleaning mechanism for rotating and pressing a roll-shaped sponge against the semiconductor wafer, or a pencil type cleaning mechanism for rotating and pressing a hemispherical sponge against the semiconductor wafer. Either one of the two types can be selected. Further, a megasonic type cleaning mechanism for cleaning the semiconductor wafer with a cleaning liquid to which ultrasonic vibration is applied may be added. The cleaning apparatuses 22 and 23 serve mainly to remove particles from the semiconductor wafers. Regardless of the type of the cleaning apparatus, each of the cleaning apparatuses can supply three or more kinds of cleaning liquid to the face (polished surface) and reverse sides of the semiconductor wafer. The cleaning liquid may comprise pure water.

Each of the cleaning apparatuses 5 and 6 is capable of rinsing the reverse side of a semiconductor wafer. For cleaning the face side of the semiconductor wafer, the cleaning apparatuses 5 and 6 may conduct cleaning by the pencil type cleaning mechanism for rotating and pressing a hemispherical sponge against the semiconductor wafer and cleaning by the megasonic type cleaning mechanism for cleaning the semiconductor wafer with a cleaning liquid to which ultrasonic vibration is applied. Each of the cleaning apparatuses 5 and 6 can supply three or more kinds of cleaning liquid to the face (polished surface) and reverse sides of the semiconductor wafer. The cleaning liquid may comprise pure water. A stage for chucking a semiconductor wafer may be rotated at a high speed, and has a function for drying a cleaned wafer.

Instead of the megasonic type cleaning mechanism, each of the cleaning apparatuses may have cavitation jet type cleaning mechanism utilizing a cavitation effect in which a cavitation is applied to a cleaning liquid because it is as effective as the megasonic type.

As shown in FIG. 1, the cleaning apparatuses 5, 6, 22 and 23 have respective openings associated with respective shutters 5a, 5b, 6a, 6b, 22a and 23a which can be opened only when the semiconductor wafers are to be introduced therein or removed therefrom. The openings with the shutters 5b, 6b serve to allow the cleaned and dried semiconductor wafer to pass therethrough. That is, the polished, cleaned and dried semiconductor wafer may be transferred from the cleaning apparatuses 5, 6 through the openings with the shutters 5b, 6b to the wafer cassette 1 by the transfer robot 4. Further, the polished, cleaned and dried semiconductor wafer may be transferred from the cleaning apparatuses 5, 6 through the openings with the shutters 5a, 6a and the wafer station 50 to the wafer cassette 1 by the transfer robot 4.

Each of the cleaning apparatuses 5, 6, 22 and 23 has a plurality of cleaning liquid supply lines associated with constant-rate flow valves that can be controlled by an air pressure. With the constant-rate flow valves combined with electropneumatic regulators for controlling the air pressure, the flow rate in the cleaning liquid supply lines can freely be established from a control panel. Cleaning liquids supplied to the cleaning apparatuses, and cleaning processes and cleaning time therefor can be set from the control panel.

Guides are mounted on a base of the cleaning chamber (area B), and the cleaning apparatuses are mounted in the guides, so that the cleaning apparatuses can easily be replaced with different type cleaning apparatuses. There are provided positioning mechanisms for placing replaced cleaning apparatuses in the same position.

Air Flow

The polishing apparatus is divided into four areas including the loading and unloading section (area A), the cleaning chamber (area B), the polishing chambers (areas C and D).

Air flows in the polishing chambers (areas C and D) are classified into four air flows. The first air flow occurs around the turntables for the purpose of preventing dust such as slurry from being scattered. The second air flow takes place around the pusher for the purpose of preventing mist of cleaning liquid produced when the semiconductor wafers, the pusher and the top rings are cleaned in the pusher region from being scattered. The third air flow is caused in the entire wet region in the polishing chambers by opening doors leading to the wet atmosphere in the polishing chambers and simultaneously discharging air from the entire wet region for preventing the wet atmosphere from going out of the polishing chambers when expendables such as polishing cloths are replaced. The fourth air flow is developed to draw heat discharged from motors and other control units. Since all the air flows are created by exhausting air in the polishing chambers to the exterior thereof, the overall polishing chambers develop a negative pressure therein as compared with the pressure developed outside the polishing chambers. For producing the third air flow, in order to discharge air at the same time that the doors are opened, it is necessary to automatically open dampers in response to signals from door sensors. To meet such a requirement, actuators are attached to the dampers for opening and closing the dampers.

Other exhaust air passages have dampers for regulating the respective amounts of exhaust air. The amounts of exhaust air in the respective exhaust passages are regulated by the dampers to achieve an overall discharged air balance. A pressure switch is disposed in an air discharge port of the polishing apparatus for enabling the polishing apparatus to issue an alarm or shutting off the polishing apparatus if no air is discharged, so that the polishing apparatus can be operated safely.

FIG. 25 shows air flows in the cleaning chamber (area B). As shown in FIG. 25, a structure for producing air flows in the cleaning chamber (area B) includes a filter fan unit 194 comprising a filter 190 (e.g., an ULPA filter or a HEPA filter) and fans 191 which are mounted on the ceiling of the cleaning chamber (area B), a duct 193 for returning air in the cleaning chamber (area B) to the filter fan unit 194 to circulate air, individual air discharge passages 197 for discharging air from the four cleaning apparatuses, and an air inlet port 195 combined with the filter fan unit 194. A chemical filter may be added for removing ions (e.g., $NH_4^-$, $K^+$, etc.) contained in the air.

Air is supplied into the cleaning chamber (area B) through the filter 190 by the fans 191 of the filter fan unit 194, and introduced as a downflow adjusted by a mechanism 198 for regulating the air flow rate of the fans 191. The mechanism 198 comprises an inverter and a thyristor-controlled AC power regulator. Air E discharged from the cleaning apparatuses is introduced from the air inlet port 195 combined with the filter fan unit 194 into the cleaning chamber (area B). Air F other than the air discharged from the cleaning apparatuses is delivered via the duct 193 to the filter fan unit 194, and passes through the filter 190 as clean air that is returned to the cleaning chamber (area B) for air circulation.

The air pressure in the cleaning chamber (area B) is adjusted by the opening degree of a damper 192 which is disposed in the duct 193.

The air from the cleaning apparatuses is discharged via the individual air discharge passages. These individual air discharge passages may be combined together for discharging the air from the cleaning apparatuses if cleaning chemicals used in the cleaning apparatuses do not produce an adverse effect due to a chemical reaction therebetween. Dampers are disposed in the respective air discharge passages to produce balanced amounts of discharged air.

A structure for producing air flows in the loading and unloading section (area A) is the same as the structure for producing air flows in the cleaning chamber (area B) except that the individual air discharge passages from the cleaning apparatuses are dispensed with. The process of regulating the air flows in the loading and unloading section (area A) is also the same as the process of regulating the air flows in the cleaning chamber (area B) except that the air pressure in the loading and unloading section (area A) is regulated so as to be higher than the air pressure in the cleaning chamber (area B).

The air in the polishing apparatus is circulated by the return duct 193 and reused via the filter 190. Therefore, the amount of clean air introduced from the clean room into the polishing apparatus is reduced for saving energy.

Air flows in the entire polishing apparatus are regulated such that the air pressure in the loading and unloading section (area A) where a highest level of cleanliness is required is highest, and progressively lower in the order of the cleaning chamber (area B) and the polishing chambers (areas C and D). If the level of cleanliness in the clean room is lower than the level of cleanliness required for the semiconductor wafers, then the air pressures in the entire polishing apparatus can be regulated to make the air pressures in the polishing apparatus higher than the air pressure in the clean room. If the level of cleanliness in the clean room is equal to or higher than the level of cleanliness required for the semiconductor wafers, then the air pressures in the entire polishing apparatus can be regulated to make the air pressures in the polishing apparatus lower than the air pressure in the clean room.

Transfer Robot

Figure 26:
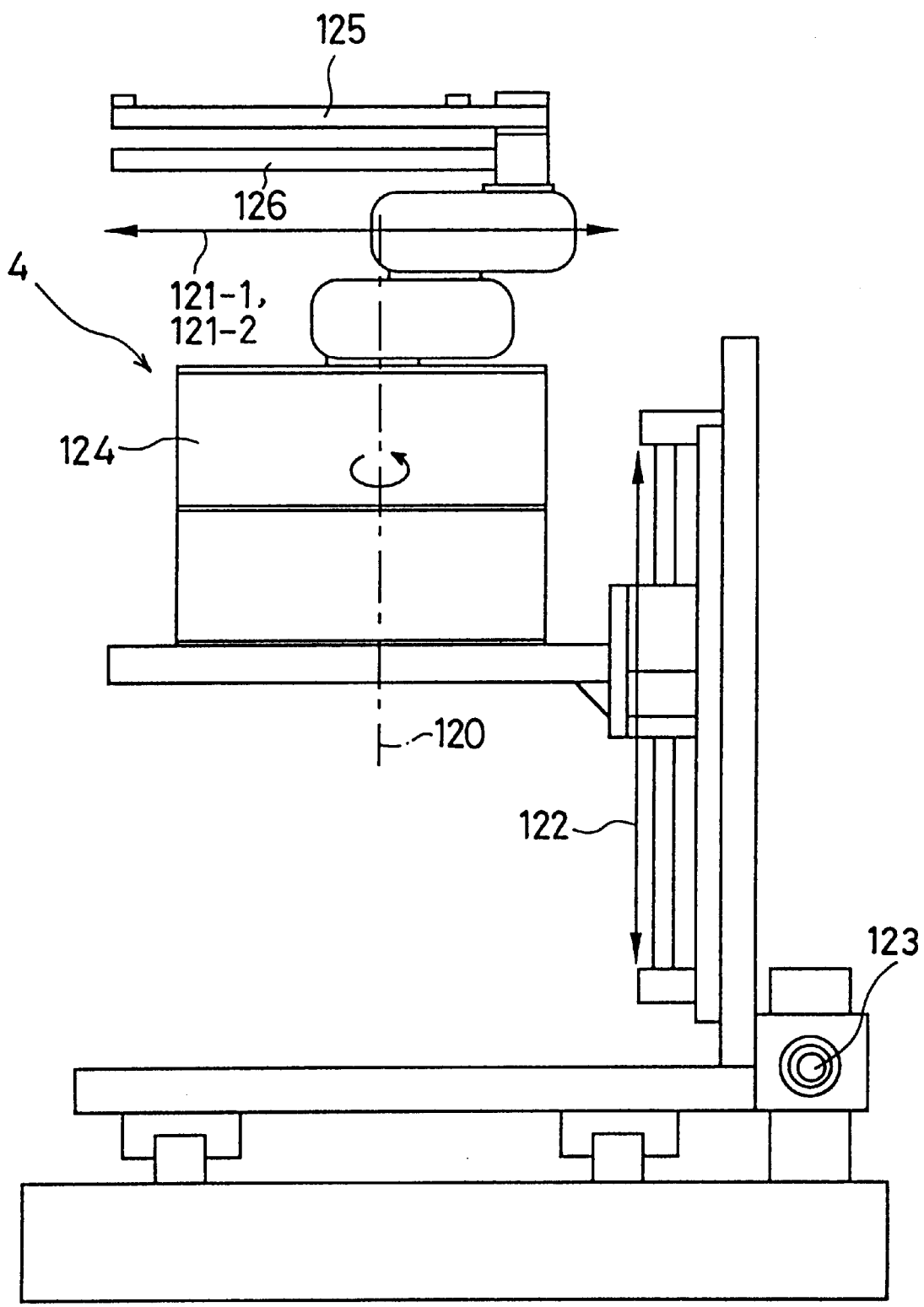
FIG. 26 is a side elevational view of a transfer robot.

FIG. 26 is a side elevational view of the transfer robot 4. As shown in FIG. 26, the transfer robot 4 has a θ-axis 120 for rotating a robot body, an R1 (upper hand) and R2 (lower hand)-axis 121-1, 121-2 (i.e. X-axis, Y-axis) for extending or contracting the hand, a Z-axis 122 in a vertical direction, and an X-axis 123 in a direction in which the wafer cassettes are arrayed. The Z-axis of the robot may be incorporated in a robot body 124. The upper and lower hands may have respective vacuum lines therein, and may be used as a vacuum attraction-type hand. Further, in order to prevent the reverse side of the semiconductor wafer 101 from being contaminated, the upper hand may comprise a thin recess support-type hand 125 made of ceramics for supporting the peripheral edge of the semiconductor wafer. The thin recess support-type hand 125 is effective if used in a transfer process for removing wafers from the cleaning apparatuses 5 and 6 and returning the wafers in the wafer cassette 1. That is, the thin recess support-type hand 125 is preferable for transferring the semiconductor wafers which have been cleaned. If there is provided a thickness measuring unit for measuring the thickness of a layer on the semiconductor wafer, then the thin recess support-type hand 125 is used to transfer wafers to and from the thickness measuring unit. The lower hand comprises a vacuum attraction-type hand 126 made of ceramics and having two support portions branched from a hand body. The vacuum attraction-type hand 126 has a vacuum line therein. The hand 126 serves to take out a semiconductor wafer from the wafer cassette 1 and to transfer the semiconductor wafer to the wafer station 50.

Figure 27:
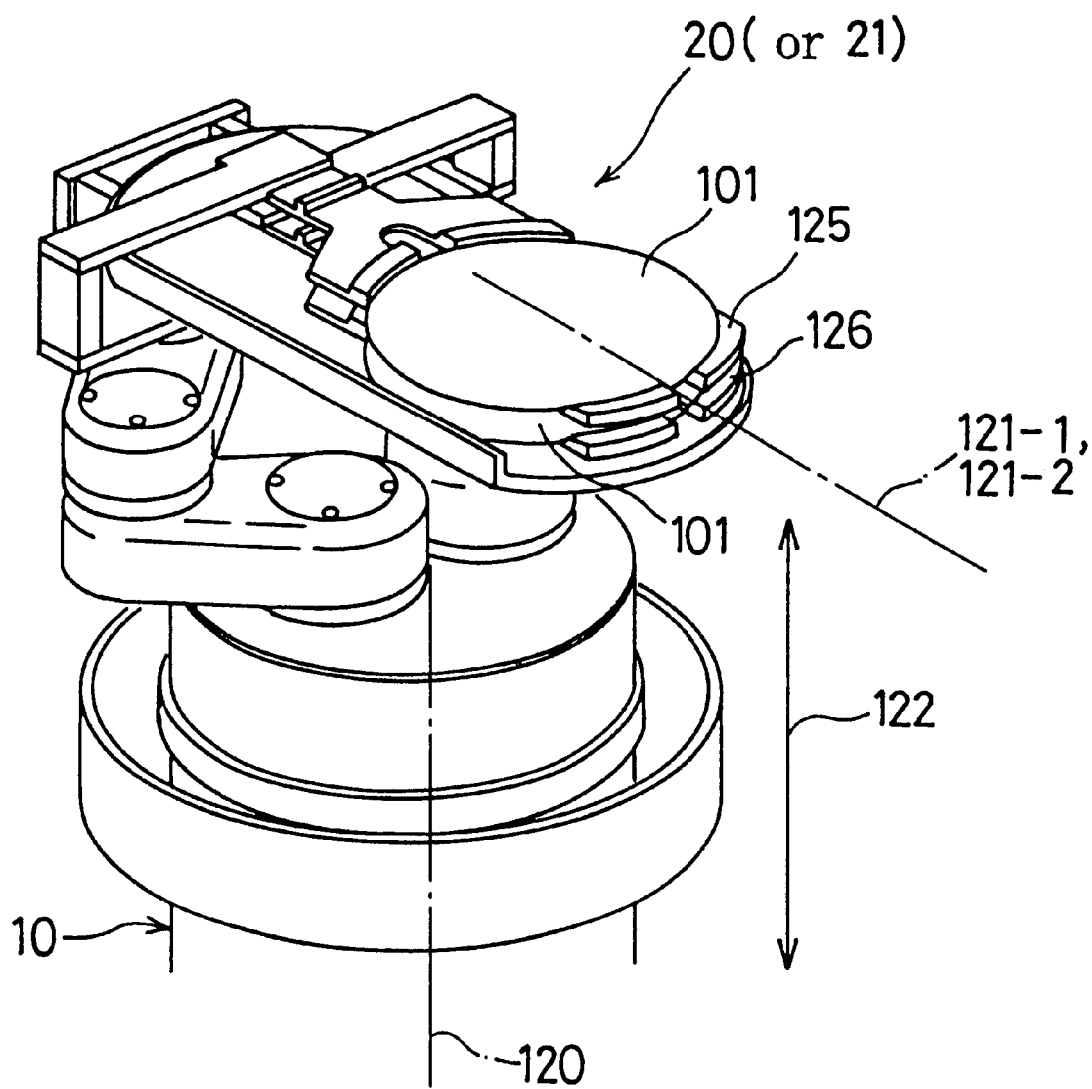
FIG. 27 is a perspective view of the transfer robot.

FIG. 27 is a perspective view of the transfer robot 20 or 21. As shown in FIG. 27, the transfer robot 20 or 21 has a θ-axis 120 for rotating a robot body, an R1 (upper hand) and R2 (lower hand)-axis 121-1, 121-2 (including X-axis, Y-axis) for extending or contracting the hand, and a Z-axis 122 in a vertical direction. Further, the upper hand 125 and the lower hand 126 are the recess support-type hand. The upper hand 125 of the transfer robot 20 can access the cleaning apparatus 22, the cleaning apparatus 5, and the wafer support 9 and 10 of the wafer station 50. The lower hand 126 of the transfer robot 20 can access the wafer support 7 of the wafer station 50, the cleaning apparatus 22, and the reversing device 28. Further, the upper hand 125 of the transfer robot 21 can access the cleaning apparatus 23, the cleaning apparatus 6, and the wafer supports 9 and 10 of the wafer station 50. The lower hand 126 of the transfer robot 21 can access the wafer support 8 of the wafer station 50, the cleaning apparatus 23, and the reversing device 28'. In FIG. 27, the upper hand 125 and the lower hand 126 are shown as holding the semiconductor wafer 101, respectively.

Wafer Station

FIGS. 28A through 28E show the wafer station. FIG. 28A is a front elevational view of the wafer station, FIG. 28B is a side elevational view of the wafer station, FIG. 28C is a view of the wafer station as viewed in the direction indicated by the arrow I, FIG. 28D is a view of the wafer station as viewed in the direction indicated by the arrow II, and FIG. 28E is a view of the wafer station as viewed in the direction indicated by the arrow III.

As shown in FIGS. 28A through 28E, the wafer station 50 comprises the wafer supports 7, 8, 9 and 10 capable of simultaneously holding four wafers. The wafer station 50 is roughly divided into dry stations composed of the wafer supports 7 and 8 which are horizontally spaced from each other, and wet stations composed of the wafer supports 9 and 10 which are vertically spaced from each other.

The dry stations 7 and 8 serve as a wafer support for temporarily supporting a semiconductor wafer before it is polished. The dry station 8 can be accessed by the transfer robot 4 and the transfer robot 21, and allows a semiconductor wafer transferred from the transfer robot 4 to the transfer robot 21 therethrough which transfers the semiconductor wafer to the right-hand polishing section. Similarly, the dry station 7 allows a semiconductor wafer transferred from the transfer robot 4 to the transfer robot 20 therethrough which transfers the semiconductor wafer to the left-hand polishing section. Since the wafer supports are provided respectively for the transfer robots 20 and 21, dedicated routes to the respective polishing chambers are available to supply the semiconductor wafers to be processed to the polishing chambers at all times without being blocked by a longer polishing time on one of the turntables than on the other turntable when the polishing times in the respective polishing processes on the turntables differ from each other.

The semiconductor wafers taken out from the wafer cassette under vacuum attraction by the transfer robot 4 are transferred to the dry stations 7 and 8. Since the positional accuracy of semiconductor wafers in the wafer cassette is not so high, the positional accuracy of a semiconductor wafer held by the vacuum attraction hand of the robot is not so high. In order to absorb such positional accuracy errors and allows semiconductor wafers to be transferred to and from subsequent robot hands, guide blocks 78 and 79 for placing semiconductor wafers thereon have positioning tapers 180 for centering of the semiconductor wafers. Since wafer deviations in the wafer cassette are larger than in other mechanisms, the vertical length of the tapers of the guide blocks need to be large. The transfer robot 4 positions its lower hand within the guide blocks of the dry stations 7 and 8, and performs the vacuum break of the hand to drop the semiconductor wafers therefrom, and to transfer the semiconductor wafers to the guide blocks by which the semiconductor wafers are centered. The dry stations 7 and 8 have transmission type light sensors 71 and 72, respectively, for detecting whether there is a semiconductor wafer or not in the dry stations 7 and 8.

Because the dry stations 7 and 8 are positioned intermediate between the cleaning area and the dry area, the shutter 11 is provided to separate those areas from each other in order to prevent the atmospheres in the areas having different levels of cleanliness from being mixed with each other. The shutter 11 is normally closed, but is opened only when the transfer robot 4 gains access to the dry stations 7 and 8.

The wet stations 9 and 10 serve as wafer supports for supporting the semiconductor wafers which have been polished. The wet stations 9 and 10 can be accessed by the transfer robots 20 and 21, respectively, and allow the semiconductor wafers to be transferred between the transfer robots 20 and 21. The wet station 9 serves as a wafer support for placing a semiconductor wafer which has been cleaned at least once, and the wet station 10 serves as a wafer support for placing a semiconductor wafer which is subjected to a cleaning process whose number of cleaning stages is smaller than that of the semiconductor wafer placed on the wet station 9. Inasmuch as the wet stations 9 and 10 are used separately depending on the level of cleanliness, it is possible to prevent contamination from being diffused via the stations.

Each of the wet stations 9 and 10 has a wafer guide comprising pins, and is compatible with both a semiconductor wafer having an orientation flat and a semiconductor wafer having a notch. Since the wet stations 9 and 10 are of a structure having pins for point-to-point contact with the semiconductor wafers, they are effective to prevent contamination from being diffused via the stations. The wet stations 9 and 10 have transmission type light sensors 73 and 74, respectively, for detecting whether there is a semiconductor wafer or not in the wet stations 9 and 10.

The wet stations have respective nozzles 75 and 76 for preventing semiconductor wafers from being dried and cleaning the semiconductor wafers by supplying a cleaning liquid to both upper and lower surfaces of the semiconductor wafers. A local air discharge line is provided for preventing mist of the cleaning liquid from being scattered around from the interior of the wafer station 50. The cleaning liquid may be any of various liquids including pure water, ion water or the like depending on the type of layer (film) to be cleaned.

In order to make the wet stations water-tight, the wet stations have the shutter 77 disposed at the opening for the transfer robots 20 and 21 to transfer the semiconductor wafers therethrough, the shutter 77 being vertically movable by an air cylinder 81. The shutter 77 is normally closed, and is opened only when the transfer robots 20 and 21 access the stations.

Reversing Device

Figure 29A:
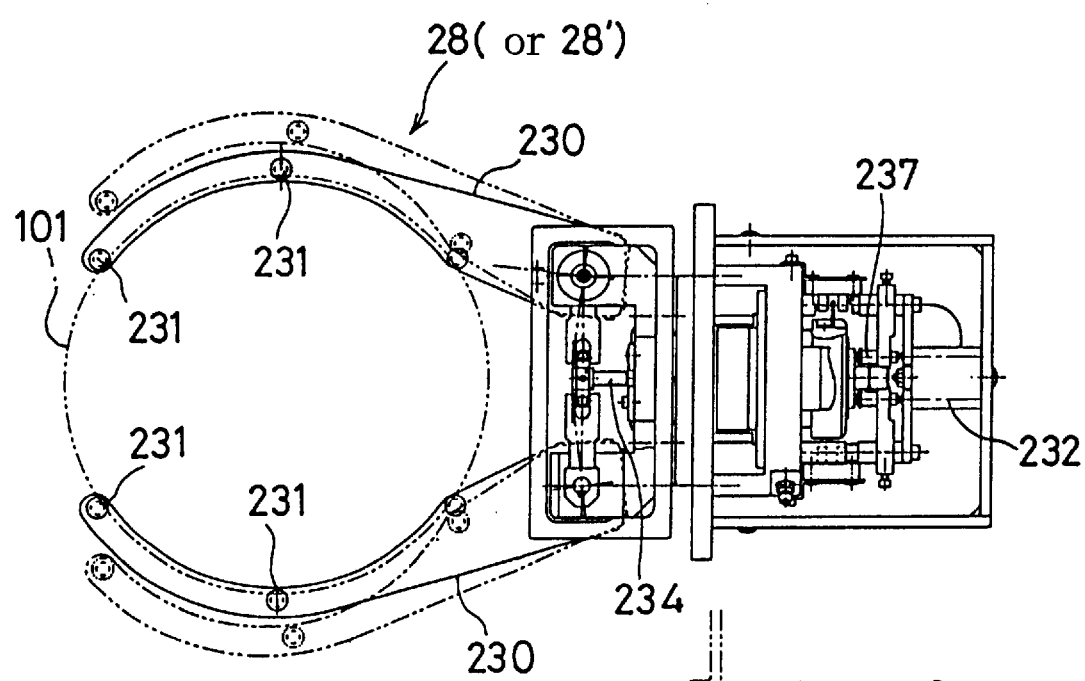
FIG. 29A is a plan view of a reversing device.
Figure 29B:
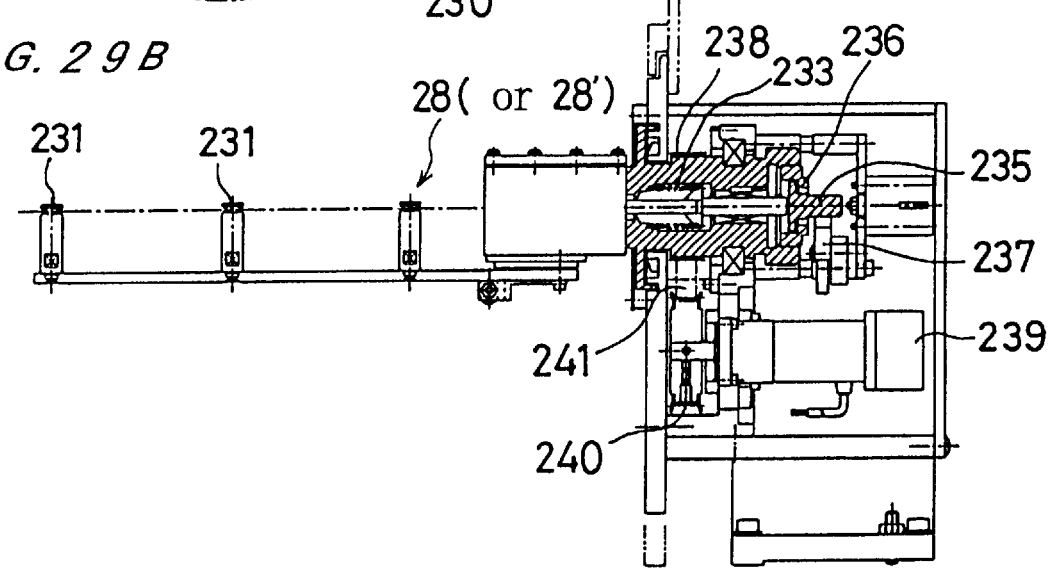
FIG. 29B is a side elevational view, partly in cross section, of the reversing device.

FIGS. 29A and 29B show the reversing device. FIG. 29A is a plan view of a reversing device, and FIG. 29B is a side elevational view, partly in cross section, of the reversing device. Since the reversing devices 28 and 28' are of an identical structure, only the reversing device 28 will be described below. As shown in FIGS. 29A and 29B, the reversing device 28 has a pair of arcuate arms 230 supporting a plurality of (e.g., six) pins 231 fixed thereto which have grooves for clamping a semiconductor wafer therein. The arms 230 can be opened and closed in response to movement of a shaft 234 that can be pushed and pulled by an air cylinder 232 and a compression spring 233. When the air cylinder 232 is extended, the arms 230 are opened thereby. When the air cylinder 232 is contracted, the arms 230 are closed under the force of the compression spring 233. The shaft 234 and a tip end of the air cylinder 232 are spaced from each other by a distance, and the shaft 234 is pulled back until a stopper 235 contacts an end block 236 under the bias of the compression spring 233.

The end block 236 is adjusted such that when a semiconductor wafer 101 is chucked, a clearance of 1 mm is created between the stopper 235 and the end block 236. The stopper 235 has a slit defined therein, and a transmission type light sensor 237 is positioned to detect light that has passed through the slit when the semiconductor wafer 101 is clamped by the arms 230. Therefore, when the semiconductor wafer 101 is not clamped or cannot be clamped properly, the transmission type light sensor 237 does not detect light. Therefore, the transmission type light sensor 237 is capable of recognizing whether the semiconductor wafer 101 is present or not in the reversing device 28.

A slide mechanism for the shaft 234 and a pulley 238 are connected to each other, and the pulley 238 is coupled to a pulley 240 fixed to a shaft end of a stepping motor 239 through a belt 241. When the stepping motor 239 is energized, the arms 230 are rotated about a horizontal axis.

As shown in FIG. 1, the shutters 25 and 26 are disposed between the reversing devices 28 and 28' and the transfer robots 20 and 21 for separating the polishing chambers with the reversing devices disposed therein from the cleaning chamber with the transfer robots disposed therein. For transferring the semiconductor wafers, the shutters 25 and 26 are opened, and the hands of the transfer robots 20 and 21 move in and out of the openings. When the hands of the transfer robots 20 and 21 do not move in and out of the openings, the shutters 25 and 26 are closed, providing a water-proof mechanism for allowing the semiconductor wafers and the chuck fingers fixed to the arms to be cleaned.

Next, the operation of the reversing device will be described with reference to FIGS. 29A and 29B.

The transfer robot 20 and the lifter 29 can access the reversing device 28 and transfer the semiconductor wafer to the reversing device 28. The transfer robot 21 and the lifter 29' can access the reversing device 28' and transfer the semiconductor wafer to the reversing device 28'.

The reversing device 28 waits for the semiconductor wafer which is conveyed by the transfer robot 20 or the lifter 29 in such a state that the arms 230 are opened. The arms 230 are closed when the semiconductor wafer conveyed by the lower hand of the transfer robot 20 or the lifter 29 is positioned in the same vertical height as wafer holding grooves of pins 231 fixed to the arms 230 and the center of the semiconductor wafer is substantially positioned at the center of the pin arrangement on the arms 230 and after a signal indicative of completion of movement from the transfer robot 20 or the lifter 29 is generated. After the presence of the semiconductor wafer 101 is confirmed by a sensor 237, the hand of the transfer robot 20 is lowered to a certain height and is then retracted. Alternatively, after the presence of the semiconductor wafer 101 is confirmed by the sensor 237, the lifter 29 is lowered. In this manner, the semiconductor wafer 101 is transferred from the transfer robot 20 or the lifter 29 to the reversing device 28. The semiconductor wafer 101 transferred to the reversing device 28 is reversed by actuating the arms 230 with the stepping motor 239. The reversed semiconductor wafer 101 is kept in the same condition until the transfer robot 20 or the lifter 29 accesses the reversing device 28 to receive the semiconductor wafer therefrom.

The reversing operation of the semiconductor wafer is carried out before and after polishing of the semiconductor wafer. In case of reversing the semiconductor wafer 101 which has been polished, in order to prevent abrasive liquid or ground-off particles attached to the semiconductor wafer 101 during polishing from being dried on the semiconductor wafer 101, the semiconductor wafer 101 is rinsed by a cleaning liquid during or after reversing of the semiconductor wafer. The cleaning liquid used to rinse the semiconductor wafer 101 comprises pure water or a chemical liquid, and is applied from spray nozzles at a required rate under a required pressure at an optimum angle for a desired period of time. The rinsing process enables a subsequent cleaning process to be conducted in a sufficient cleaning performance. While the semiconductor wafer 101 is waiting on the reversing device 28, the cleaning liquid continues to be supplied to the semiconductor wafer 101. However, in view of the running cost, the cleaning liquid may be supplied intermittently to reduce its amount in use.

While the reversing device 28 is not clamping the semiconductor wafer 101, the grooves for clamping the semiconductor wafer 101 and surrounding areas thereof may be cleaned by the cleaning liquid to prevent the semiconductor wafer 101 from being contaminated by members that will contact the semiconductor wafer 101.

Lifter

Figure 30:
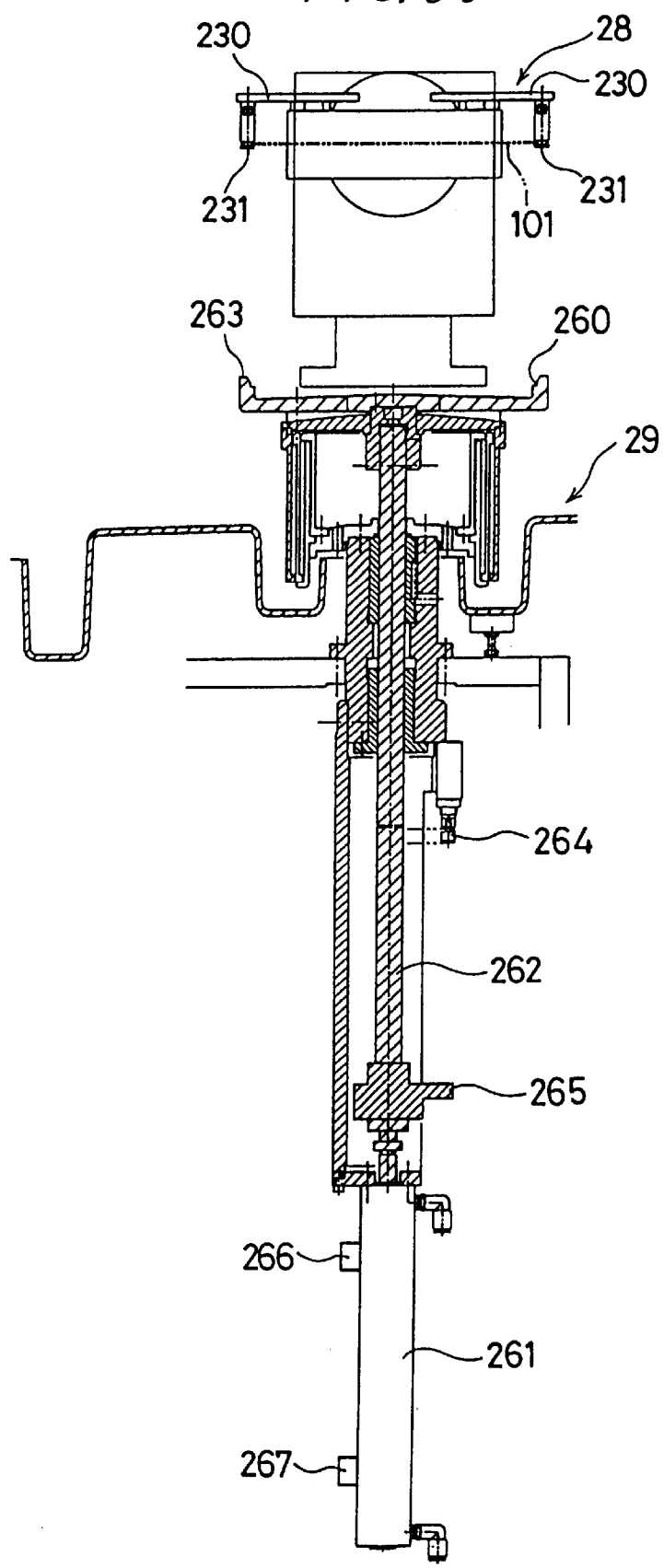
FIG. 30 is a vertical cross-sectional view of a lifter.

FIG. 30 is a vertical cross-sectional view of the lifter. The lifter 29 and 29' have the same structure, and hence only the lifter 29 will be described. The lifter 29 comprises a stage 260 for placing a semiconductor wafer thereon and an air cylinder 261 for lifting and lowering the stage 260. The air cylinder 261 and the stage 260 are coupled by a shaft 262 which is vertically movable. The stage 260 has three support portions 263 disposed at angularly equal intervals in a circumferential direction and extending radially outwardly. The three support portions 263 are arranged in the angularly equal intervals so that the semiconductor wafer having an orientation flat can be held and are reliably transported. The three support portions 263 are disposed at positions where they are not aligned with the pins 231 for chucking the semiconductor wafer in the reversing device 28. That is, the first peripheral edge of the semiconductor wafer held by the pins 231 does not correspond to the second peripheral edge of the semiconductor wafer held by the support portions 263 of the lifter 29. The wafer support portions 263 of the lifter 29 which performs the transfer of the semiconductor wafer to the reversing device 28 or the rotary transporter 27 have respective support surfaces for supporting the semiconductor wafer thereon, and respective taper surfaces extending radially outwardly and upwardly from the support surfaces for centering the semiconductor wafer when the semiconductor wafer is placed on the support surfaces.

The wafer support surfaces of the stage 260 is raised by actuation of the air cylinder 261 to a position where the semiconductor wafer is held by the reversing device 28. A stopper 264 having a shock absorbing function is provided to stop raising of the stage 260. When a stopper base 265 fixed to the shaft 262 contacts the stopper 264, further actuation of the air cylinder 261 is stopped, and the lifting of the stage 260 fixed to the shaft 262 is simultaneously stopped. By adjusting the location of the stopper 264, the lifting height of the stage 260 can be adjusted to a transfer position of the semiconductor wafer between the lifter 29 and the reversing device 28. Sensors 266 and 267 are provided on the air cylinder 261 to detect completion of lifting and lowering of the air cylinder 261, respectively.

Next, the operation of the lifter having the above structure will be described. The lifter 29 constitutes a wafer transfer mechanism for transferring the semiconductor wafer between the reversing device 28 and the rotary transporter 27. The semiconductor wafer to be polished is transferred from the transfer robot 20 to the reversing device 28. Thereafter, the semiconductor wafer is reversed by the reversing device 28 to cause a pattern surface (the surface on which semiconductor device is formed) of the semiconductor wafer to face downward. The stage 260 of the lifter 29 is raised toward the semiconductor wafer held by the reversing device 28 and is stopped immediately below the semiconductor wafer. When the sensor 266 provided on the air cylinder 261 detects the stop of the lifter 29 at a position where the stage 260 is located immediately below the semiconductor wafer, the reversing device 28 releases the semiconductor wafer by opening the arms 230 and the semiconductor wafer is placed on the stage 260 of the lifter 29. Thereafter, the lifter 29 is lowered while holding the semiconductor wafer thereon. While the semiconductor wafer is lowered by the lifter 29, the semiconductor wafer is transferred to the rotary transporter 27. At this time, the semiconductor wafer is placed on the pins of the rotary transporter 27. After the semiconductor wafer is transferred to the rotary transporter 27, the lifter 29 continues to be operated to lower the stage 260, and then is stopped when the stage 260 is lowered by the stroke of the air cylinder 261.

The semiconductor wafer which has been polished is transferred from the rotary transporter 27 to the reversing device 28 by the lifter 29. That is, the semiconductor wafer which has been polished is transported by the rotary transporter 27 to the position above the lifter 29. At this time, the stage 260 of the lifter 29 is located immediately below the rotary transporter 27. After it is confirmed that the semiconductor wafer placed on the rotary transporter 27 is located at the position immediately above the stage 260 of the lifter 29 and the movement of the semiconductor wafer is stopped, the stage 260 of the lifter 29 starts to be raised. The stage 260 of the lifter 29 receives the semiconductor wafer from the rotary transporter 27 while the stage 260 is lifted. Thereafter, the stage 260 of the lifter 29 continues to be lifted. At this time, the reversing device 28 waits for the semiconductor wafer in such a state that the arms 230 are opened to be ready for cramping the semiconductor wafer. The lifting of the semiconductor wafer is stopped at the position where the semiconductor wafer is horizontally aligned with the wafer holding grooves of the pins 231 on the arms 230. The completion of lifting of the stage 260 in the lifter 29 is detected by the sensor 266 provided on the air cylinder 261, and the detecting signal by the sensor 266 is sent to a controller of the polishing apparatus to allow the controller to recognize the completion of lifting of the stage 260. When the controller of the polishing apparatus receives the detecting signal, the reversing device 28 is operated to close the arms 230. By this operation, the semiconductor wafer is held by the reversing device 28. After it is confirmed that the semiconductor wafer is held by the reversing device 28, the stage 260 of the lifter 29 is lowered.

Rotary Transporter

Figure 32:
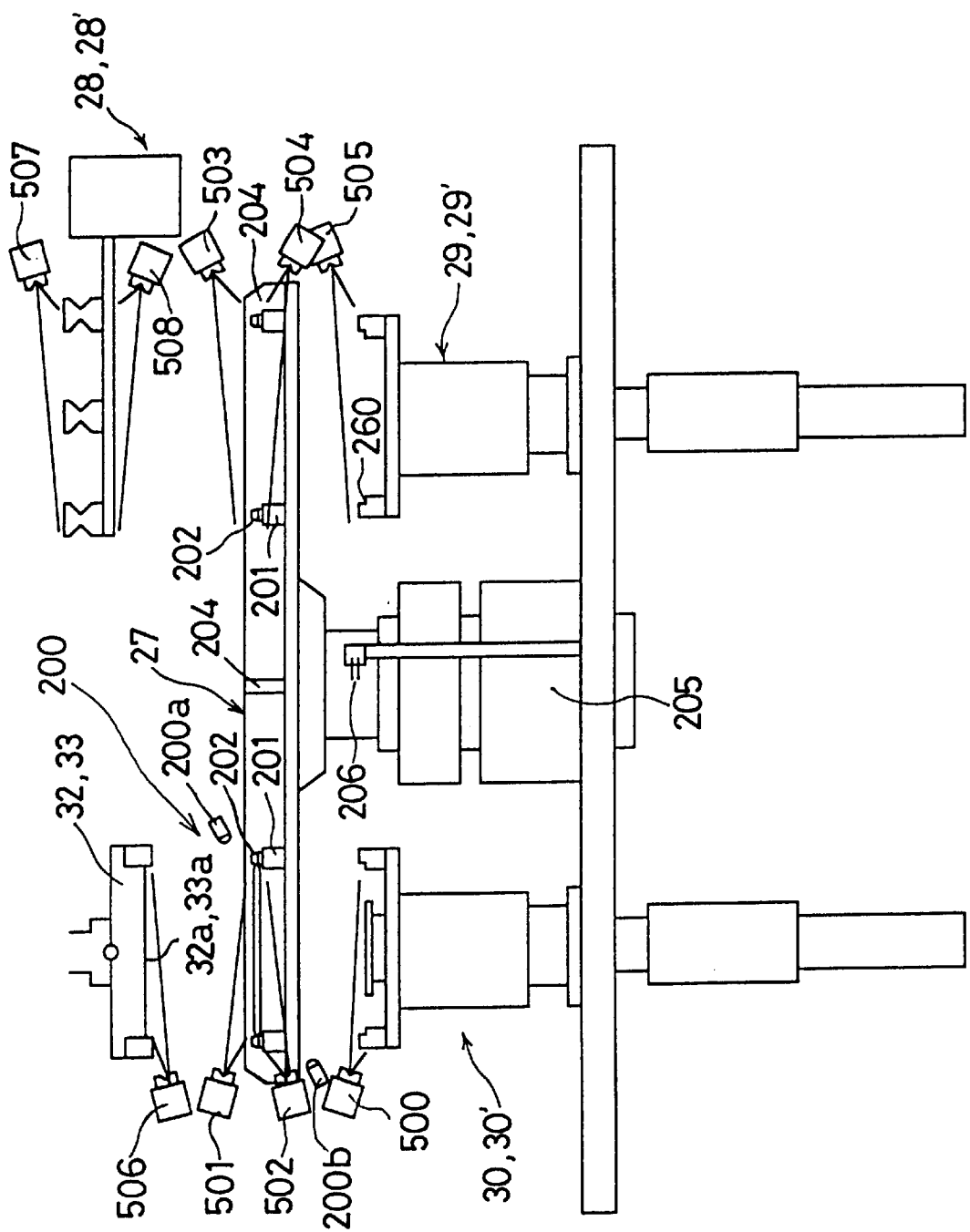
FIG. 32 is a side elevational view of the rotary transporter.

FIGS. 31 and 32 show the rotary transporter, and FIG. 31 is a plan view of the rotary transporter and FIG. 32 is a vertical cross-sectional view of the rotary transporter. As shown in FIGS. 31 and 32, the rotary transporter 27 for transporting the semiconductor wafer 101 has four wafer support stages at angularly equal intervals of 90°, and each of the four wafer support stages has six pins 201 standing on the stage for supporting the semiconductor wafer at six points. The semiconductor wafer can be supported by at least three pins, but in this embodiment, the six pins 201 are provided for supporting both of the semiconductor wafer having an orientation flat and the semiconductor wafer having a notch. A taper surface 202 having a taper angle of 15° to 25° from the perpendicular is formed at the forward end portion of the pin 201 to allow the semiconductor wafer to be centered when the semiconductor wafer is transferred.

The wafer detecting sensors 200 are provided at positions spaced from the rotary transporter 27. The sensor 200 is a photosensor comprising a light emitting element 200a and a light receiving element 200b, and is not moved with the stages of the rotary transporter 27. The conditions of the semiconductor wafers which are placed on the stages are determined in the respective stages of the rotary transporter 27. To be more specific, the rotary transporter 27 comprises two load stages (the right and left sides) for placing the semiconductor wafer to be polished and two unload stages (the right and left sides) for placing the semiconductor wafer which has been polished. The conditions of the semiconductor wafers placed on the respective stages are always fixed, and the rotary transporter 27 has a stage 210 for placing the semiconductor wafer to be polished on the turntable 34, a stage 211 for placing the semiconductor wafer which has been polished on the turntable 34, a stage 212 for placing a semiconductor wafer to be polished on the turntable 35, and a stage 213 for placing the semiconductor wafer which has been polished on the turntable 35.

Rinsing nozzles 501, 502, 503 and 504 for supplying a cleaning liquid to the semiconductor wafer are provided above or below the rotary transporter 27 and in the positions spaced from the rotary transporter 27. The rinsing nozzles 501 to 504 are stationary and are not rotated with the stages. Pure water or ionic water is mainly used as a cleaning liquid. A separator 204 is provided on the rotary transporter 27 so as to separate the wafer support stages 210 to 213 from one another for preventing the slurry or the cleaning liquid used for cleaning the semiconductor wafer or the top ring from being scattered around. The rotary transporter 27 is coupled to a servomotor 205, and the semiconductor wafers on the rotary transporter 27 are transported by driving the servomotor 205. A home position sensor 206 is provided on the lower portion of the rotary transporter 27, and positioning of the wafer transfer position is controlled by the home position sensor 206 and the servomotor 205. The transfer positions which can be positioned are three positions at angular intervals of 90° with respect to the home position as a center.

Next, the operation of the rotary transporter 27 having the above structure will be described. FIG. 31 shows the home position of the rotary transporter 27. The rotary transporter 27 is rotated counterclockwise by an angle of 90° and the stage 210 is located above the lifter 29.

The semiconductor wafer 101 to be transferred to the top ring 32 is transferred to the reversing device 28 by the transfer robot 20. The semiconductor wafer 101 is held by the reversing device 28, and then is reversed, i.e. turned upside down. The reversed semiconductor wafer 101 is received by the lifter 29, and then lowered. While the semiconductor wafer 101 is lowered by the lifter 29, the semiconductor wafer 101 is centered by the taper surfaces 202 of the pins 201 on the wafer support stage 210, and placed on the shoulder of the pins 201. After the semiconductor wafer 101 is placed on the pins 201, the lifter 29 continues to be operated to cause the stage 260 to be lowered until the stage 260 does not interfere with the rotary transporter 27 even when the rotary transporter 27 is rotated. Thereafter, the rotary transporter 27 is rotated clockwise by an angle of 90°, and the semiconductor wafer 101 on the rotary transporter 27 is positioned above the pusher 30. After positioning of the rotary transporter 27 is completed, the pusher 30 is operated, and the semiconductor wafer 100 is transferred to the top ring 32 located above the rotary transporter 27.

The semiconductor wafer 101 polished by the top ring 32 is moved toward the wafer support stage 211 of the rotary transporter 27 located below the top ring 32 by the pusher 30. The semiconductor wafer 101 transferred from the top ring 32 to the pusher 30 is centered by the taper surfaces 202 of the pins 201 on the wafer support stage 211, and then placed on the shoulders of the pins 201. After the semiconductor wafer 101 is placed on the wafer support stage 211, the pusher 30 continues to be operated so that the pusher 30 does not interfere with the rotary transporter 27. Thereafter, the rotary transporter 27 is rotated counterclockwise by an angle of 90°, and the semiconductor wafer 101 on the stage 211 is positioned above the lifter 29. After positioning of the rotary transporter 27 is completed, the stage 260 of the lifter 29 is raised, and the semiconductor wafer 101 is received by the stage 260 from the wafer support stage 211 and transported to the reversing device 28.

Pusher

Figure 33:
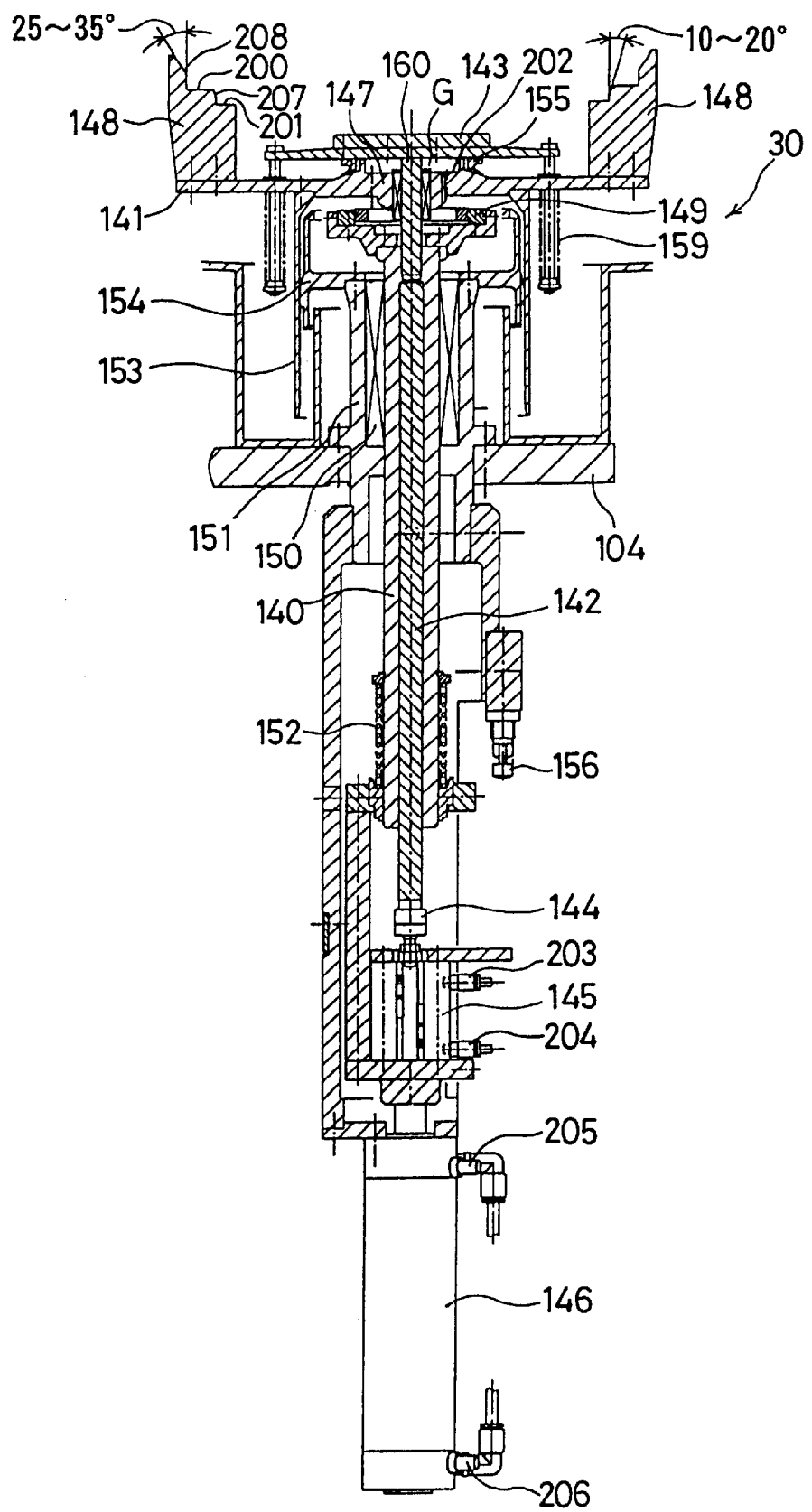
FIG. 33 is a vertical cross-sectional view of a pusher.

FIG. 33, and FIGS. 34A through 34E show a pusher, and FIG. 33 is a vertical cross-sectional view of the pusher and FIGS. 34A through 34E are views for explaining operation of the pusher. The pusher 30 and 30' have the same structure, and hence only the pusher 30 will be described.

As shown in FIG. 33, a guide stage 141 for holding the top ring is provided above a hollow shaft 140, and a spline shaft 142 is provided in the hollow shaft 140. A push stage 143 is provided above the spline shaft 142. An air cylinder 145 is coupled to the spline shaft 142 through a flexible joint 144. Two air cylinders are disposed vertically in series. The lower air cylinder 146 serves to lift and lower the guide stage 141 and the push stage 143, and lifts and lowers the hollow shaft 140 together with the air cylinder 145. The air cylinder 145 serves to lift and lower the push stage 143.

A linear way 149 movable in directions of an X-axis and a Y-axis is provided to allow the top ring guide 148 to have an alignment mechanism. The guide stage 141 is fixed to the linear way 149, and the linear way 149 is fixed to the hollow shaft 140. The hollow shaft 140 is held by a bearing case 151 through a slide bush 150. The stroke of the air cylinder 146 is transmitted to the hollow shaft 140 through a compression spring 152.

The push stage 143 is located above the guide stage 141, and a push rod 160 extending downwardly from the center of the push stage 143 passes through a slide bush 147 located at the center of the guide stage 141 to allow the push rod 160 to be centered. The push rod 160 contacts the upper end of the spline shaft 142. The push stage 143 is vertically moved by the air cylinder 145 through the spline shaft 142, so that the semiconductor wafer 101 is loaded on the top ring 32. Compression springs 159 are provided at the peripheral portion of the push stage 143.

Three top ring guides 148 are provided at the outer circumferential portion of the guide stage 141. Each of the top ring guides 148 has a two-step structure, the upper step 200 serves as a contact portion with the lower surface of the guide ring 301 of the top ring 32 or 33, and the lower step 201 serves as a support portion for supporting the semiconductor wafer 101. A taper surface 208 having an angle of 25° to 35° from the perpendicular is formed at the upper step 200 for guiding the guide ring 301 toward the upper step 200, and a tapered surface 207 having an angle of 10° to 20° from the perpendicular is formed at the lower step 201 for guiding the semiconductor wafer 101 toward the lower step 201. When the semiconductor wafer 101 is unloaded from the top ring 32, the top ring guides 148 receive the peripheral edge of the semiconductor wafer.

A guide sleeve 153 is fixed to the guide stage 141 to prevent water from entering the central part of the guide stage 141 and to guide the guide stage 141 so that the guide stage 141 is returned to its original position. A center sleeve 154 located inside of the guide sleeve 153 is fixed to the bearing case 151 for centering the guide stage 141. The pusher is fixed to a motor housing 104 in the polishing section through the bearing case 151.

A V-ring 155 is used to prevent water from entering between the push stage 143 and the guide stage 141, and has a lip held in contact with the guide stage 141 to prevent water from passing therethrough. When the guide stage 141 is elevated, the volume of a portion G increases, thus lowering the pressure to thereby draw water. In order to prevent water from being drawn, the V-ring 155 has a hole 202 defined in an inner side thereof to prevent the pressure from being lowered.

A shock absorber 156 is provided for positioning of the top ring guides 148 in a vertical direction and for shock-absorbing when the top ring guides 148 contact the top ring 32. In each of the air cylinders 145 and 146, upper and lower limit sensors are provided for detecting the position of the pusher in a vertical direction. That is, sensors 203 and 204 are provided on the air cylinder 145, and sensors 205 and 206 are provided on the air cylinder 146. A cleaning nozzle or nozzles for cleaning the pusher are provided to prevent the slurry attached to the pusher from contaminating the semiconductor wafer. A sensor for confirming the presence or absence of the semiconductor wafer on the pusher may be provided. The control of the air cylinders 145 and 146 are performed by double solenoid valves, respectively. The pushers 30 and 30' are dedicatedly provided for the top rings 32 and 33, respectively.

Next, the operation of the pusher having the above structure will be described below.

1) Loading a Semiconductor Wafer

Figure 34:
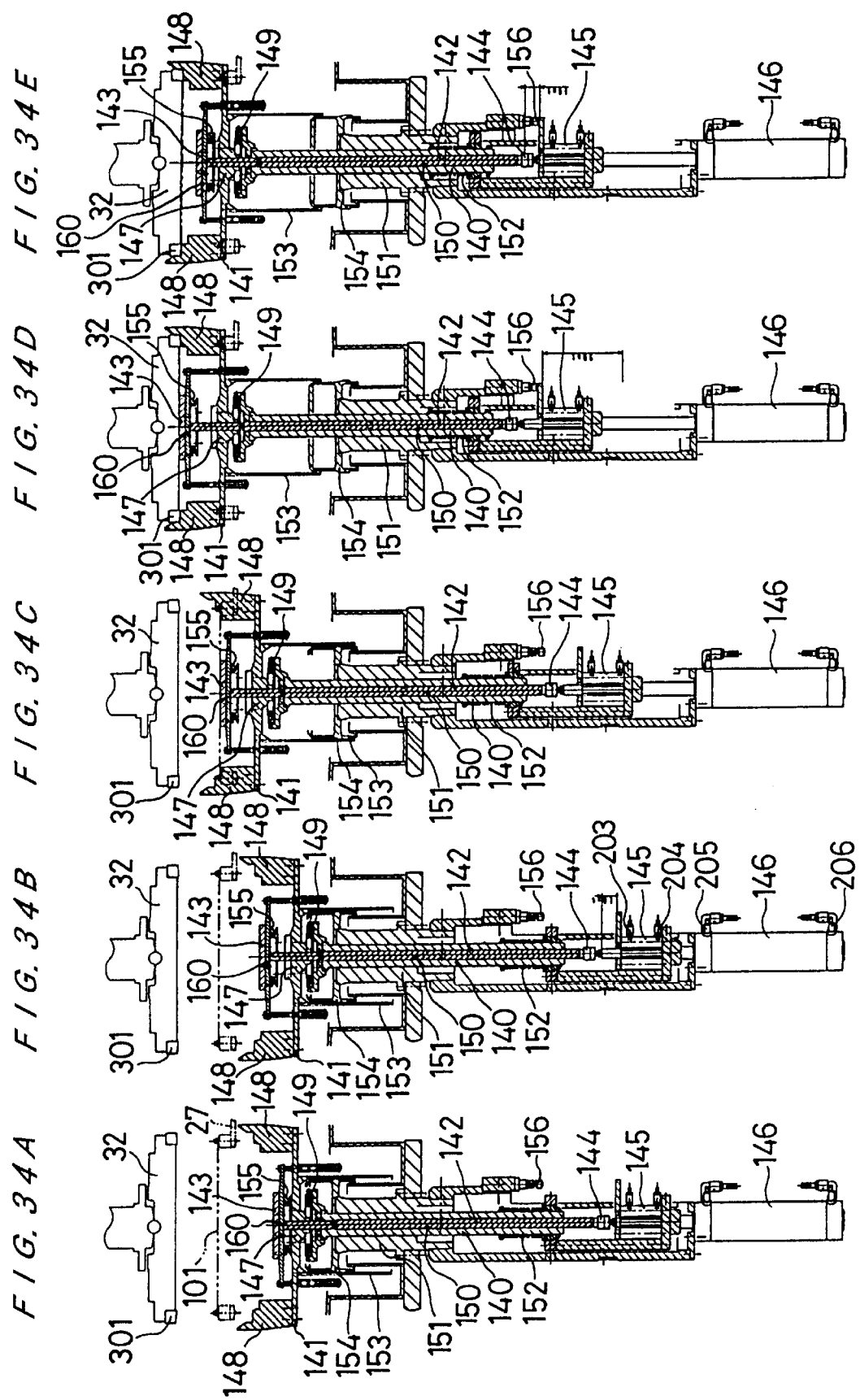
FIGS. 34A through 34E are vertical cross-sectional views illustrative of the manner in which the pusher operates.

As shown in FIG. 34A, the semiconductor wafer 101 is transported to a position above the pusher 30 by the rotary transporter 27. When the top ring 32 is located in a loading position above the pusher 30 and does not hold the semiconductor wafer, as shown in FIG. 34B, the push stage 143 is raised by the air cylinder 145. When the completion of raising of the push stage 143 is detected by the sensor 203, as shown in FIG. 34C, the guide stage 141 and the components associated with the guide stage 141 are raised by the air cylinder 146. While the guide stage 141 is raised, the guide stage 141 passes through the wafer holding position of the rotary transporter 27. At this time, the semiconductor wafer 101 is centered by the taper surfaces 207 of the top ring guides 148, and the pattern surface except peripheral portion of the semiconductor wafer is held by the push stage 143. The semiconductor wafer 101 is held by the push stage 143 at portions except for the peripheral edge thereof.

While the push stage 143 holds the semiconductor wafer, the top ring guides 148 are raised without being stopped, and the guide ring 301 is guided by the taper surfaces 208 of the top ring guides 148. The center of the top ring guides 148 is aligned with the center of the top ring 32 by the linear way 149 movable in X and Y directions, and the upper steps 200 of the top ring guides 148 contact the lower surface of the guide ring 301 and lifting of the guide stage 141 is stopped.

When the upper steps 200 of the top ring guides 148 contact the lower surface of the guide ring 301, the guide stage 141 is fixed and is not raised anymore. However, the air cylinder 146 continues to be actuated until the stopper fixed to the rod of the air cylinder 146 contacts the shock absorber 156, and hence only the spline shaft 142 continues to be raised because the compression spring 152 is compressed, and the push stage 143 is further raised. At this time, as shown in FIG. 34D, the push stage 143 holds the semiconductor wafer 101 at portions except for the peripheral edge of the semiconductor wafer 101, and transports the semiconductor wafer 101 to the top ring 32. After the semiconductor wafer 101 contacts the top ring 32, the lifting stroke of the air cylinder 146 is absorbed by the compression springs 159 to thereby protect the semiconductor wafer 101.

After the top ring 32 completes the attraction of the semiconductor wafer 101, the pusher starts to be operated and the guide stage 141 and the push stage 143 are lowered to the position shown in FIG. 34A. When the guide stage 141 is lowered, the guide stage 141 is centered by the taper portion formed on the guide sleeve 153 and the taper portion formed on the center sleeve 154. When the lowering of the guide stage 141 is completed, the operation of the loading of the semiconductor wafer is completed.

2) Unloading a Semiconductor Wafer

The semiconductor wafer 101 is transported by the top ring 32 to a wafer unload position located above the pusher 30. When the wafer unload stage of the rotary transporter 27 is located above the pusher 30 and does not hold the semiconductor wafer, the guide stage 141 and the components associated with the guide stage 141 are raised by the air cylinder 146, and the guide ring 301 of the top ring 32 is guided by the tapered surfaces 208 of the top ring guides 148. The center of the top ring guides 148 is aligned with the center of the top ring 32 by the linear way 149, and the upper steps 200 of the top ring guides 148 contact the lower surface of the guide ring 301 and the lifting of the guide stage 141 is stopped. The air cylinder 146 continues to be actuated until the stopper fixed to the rod of the air cylinder 146 contacts the shock absorber 156. However, since the upper steps 200 of the top ring guides 148 contact the lower surface of the guide ring 301 to cause the guide stage 141 to be fixed at this position, the air cylinder 146 pushes the spline shaft 142 together with the air cylinder 145 against urging force of the compression spring 152, thus lifting the push stage 143. At this time, as shown in FIG. 34E, the push stage 143 is not raised to a position higher than the wafer holding portion of the lower steps 201 of the top ring guides 148. In this embodiment, the air cylinder 146 is arranged to be further actuated after the top ring guides 148 contact the guide ring 301. The shock at this time is absorbed by the spring 152.

After the lifting actuation of the air cylinder 146 is completed, the semiconductor wafer 101 is removed from the top ring 32. At this time, the semiconductor wafer 101 is centered by the lower tapered surfaces 207 of the top ring guides 148, and the semiconductor wafer 101 is held by the lower steps 201 of the top ring guides 148 at the peripheral edge of the semiconductor wafer 101. After the semiconductor wafer 101 is held by the pusher, the pusher starts to be operated to lower the guide stage 141. While the guide stage 141 is lowered, the guide stage 141 is centered by the guide sleeve 153 and the center sleeve 154. While the guide stage 141 is lowered, the semiconductor wafer 101 is transferred from the pusher 30 to the rotary transporter 27. When the lowering of the guide stage 141 is completed, the operation of the unloading of the semiconductor wafer is completed.

According to the pusher having the structure shown in FIG. 33 and FIGS. 34A through 34E, since the pusher 30 has a centering mechanism for centering the main components of the pusher with respect to the top ring 32, adjustment of the positional relationship between the pusher 30 and the top ring 32 can be easily performed. The lifting stroke of the push stage 143 is set to a position higher than the lower surface of the top ring 32 by about 2 mm, and thus positioning in a vertical direction can be easily performed. At this time, the shock of contact in the vertical direction can be absorbed by the spring.

Top Ring

Figure 35:
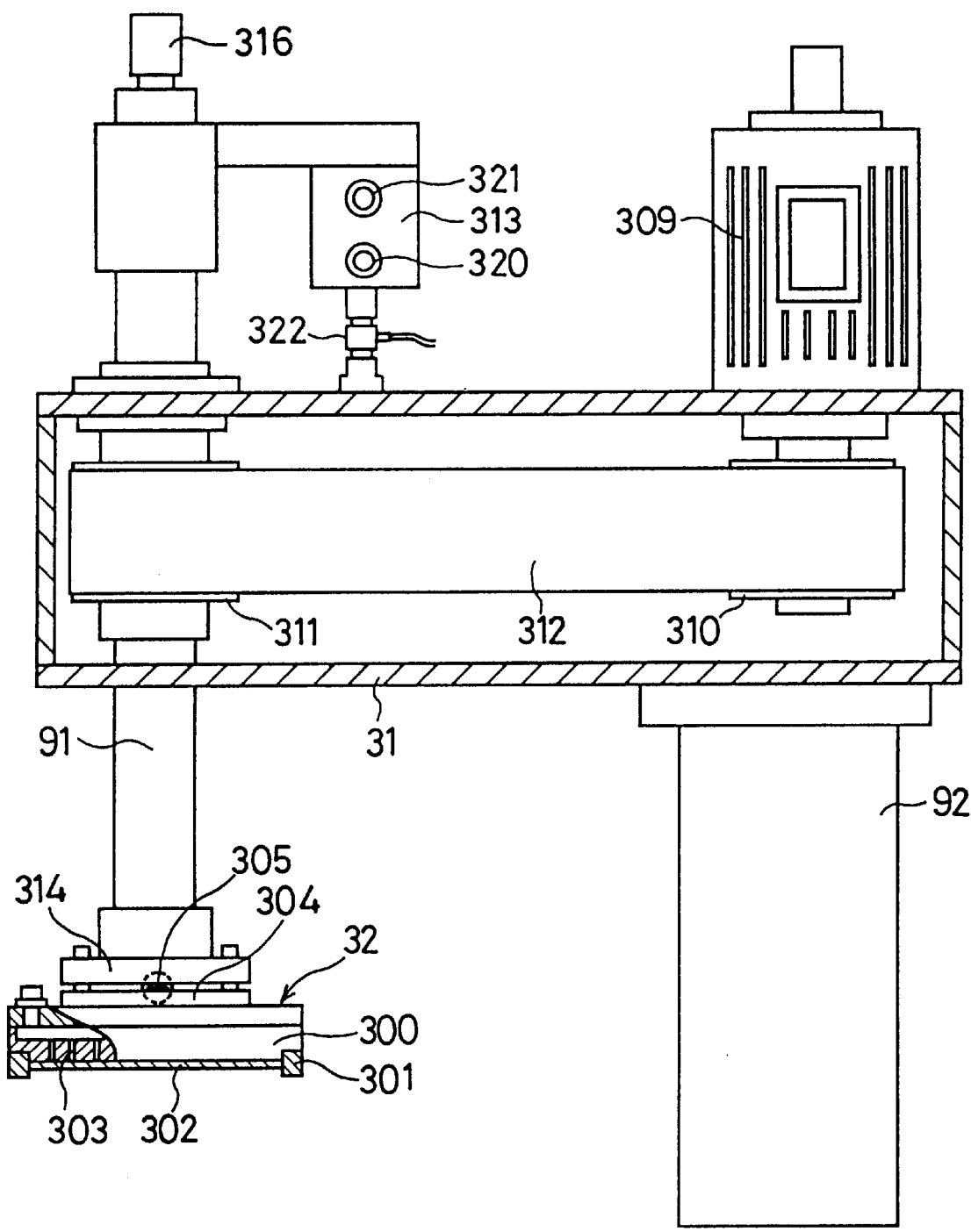
FIG. 35 is a side elevational view, partly in cross section, of a top ring.

FIG. 35 is a side view with a partially cross-section showing the top ring. The top rings 32 and 33 have the same structure, and only the top ring 32 will be described.

The top ring 32 is held by the top ring head 31 so that the top ring 32 can perform various motions including rotation, pressing, and swing. The top ring 32 comprises a top ring body 300 for holding an upper surface of the semiconductor wafer and pressing the semiconductor wafer against the polishing surface of the turntable, a guide ring 301 for retaining the outer periphery of the semiconductor wafer, and a backing pad 302 attached to the lower surface of the top ring body 300 and having a cushioning function between the top ring 32 and the semiconductor wafer. The top ring body 300 is made of material having a rigidity such as ceramics, and has a wafer holding surface which is formed to a flat finish surface so that the entire surface of the semiconductor wafer can be uniformly pressed against the polishing surface. However, the wafer holding surface of the top ring body 300 may have a slightly concave or convex surface depending on the kind of the semiconductor wafer to be polished.

The guide ring 301 has an inner diameter slightly larger than the diameter of the semiconductor wafer so that the semiconductor wafer is inserted into the guide ring 301 and retained by the guide ring 301. The top ring body 300 has a plurality of through-holes 303 which are open toward the wafer holding surface and an opposite surface to the wafer holding surface. The clean air or nitrogen gas having a positive pressure is supplied to the semiconductor wafer held by the wafer holding surface through the through-holes 303, and certain areas of the semiconductor wafer can be selectively and locally pressed against the polishing surface. Further, a negative pressure is developed in the through-holes 303, and the semiconductor wafer is attracted under vacuum when the semiconductor wafer is transported. Further, clean air or nitrogen gas is ejected toward the semiconductor wafer through the through-holes 303, whereby the semiconductor wafer can be removed from the top ring body 300. In this case, the wafer removing force is heighten by mixing pure water with the clean air or gas, thereby making it possible to remove the semiconductor wafer reliably.

An attachment flange 304 is mounted on an upper surface of the top ring 32. The attachment flange 304 has a hemispherical hole defined centrally in an upper surface thereof. A drive flange 314 fixed to the top ring drive shaft 91 is disposed above the attachment flange 304. The drive flange 314 also has a hemispherical hole defined therein. A ball 305 which is hard and made of ceramics, for example, is provided in the hemispherical holes. A downward pressing force applied to the drive flange 314 is transmitted via the ball 305 to the attachment flange 304 disposed therebelow.

On the other hand, the top ring head 31 supports the top ring 32 through the top ring drive shaft 91 comprising a spline shaft. The top ring head 31 is supported by the support shaft 92. The support shaft 92 is rotated by a motor (reference numeral 407 in FIG. 40) coupled to the lower end of the support shaft 92, and the top ring head 31 is swung by the rotation of the support shaft 92. By this swing motion of the top ring head 31, the top ring 32 can be moved to a polishing position, a maintenance position, and a transfer position. A motor 309 is provided above the support shaft 92 and on the upper surface of the top ring head 31, and a driving pulley 310 fixed to the end of the shaft of the motor 309 is rotated by the motor 309 and a driven pulley 311 fixed to the top ring drive shaft 91 is rotated through a belt 312. When the driven pulley 311 is rotated, the top ring drive shaft 91 is rotated, and the rotation of the top ring drive shaft 91 is transmitted to the top ring 32, thus rotating the top ring 32.

Further, an air cylinder 313 is fixed to the upper surface of the top ring head 31 in such a manner that the shaft of the air cylinder 313 extends downwardly. The top ring head 31 and the shaft of the air cylinder 313 are coupled flexibly. By controlling air pressure supplied to the air cylinder 313, the force for raising or lowering the top ring drive shaft 91, i.e., the force for raising or lowering the top ring 32 can be controlled. A tensile/compressive load-type cell 322 is interposed in the junction between the air cylinder 313 and the top ring head 31 for measuring a vertical thrust force generated by the air cylinder 313 fixed to the top ring head 31. Since this thrust force is equal to a force for pressing a semiconductor wafer, a feedback circuit may be formed using the measured thrust force for the purpose of controlling the force for pressing the semiconductor wafer. The body of the air cylinder 313 and the top ring drive shaft 91 comprising a spline shaft are coupled to each other such that the top ring drive shaft 91 can be rotated. When the air cylinder 313 is operated vertically, the top ring drive shaft 91 is simultaneously operated vertically. The top ring drive shaft 91 has a vertical through hole defined therein, with a tube (not shown) disposed in the vertical through hole. Since the top ring drive shaft 91 and the top ring 32 are rotated, a rotary joint 316 is mounted on the upper end of the tube. A vacuum, a gas such as $N_2$ or clean air and/or liquid such as pure water is supplied via the rotary joint 316 to the top ring body 300.

The top ring 32 having the above structure attracts the semiconductor wafer which has been transported to the pusher 30 under vacuum, and holds the semiconductor wafer in the guide ring 301 of the top ring 32. Thereafter, the top ring 32 is swung from the position above the pusher 30 to the polishing surface on the turntable. After the top ring 32 is moved to the position above the turntable, the top ring 32 is rotated at a given rotational speed, and then lowered by the air cylinder 313 to contact the semiconductor wafer with the polishing surface on the turntable. When the top ring 32 is lowered to the upper surface of the turntable, a sensor 321 for detecting the lower end of the stroke of the air cylinder 313 is actuated to generate a signal indicating that the downward movement of the air cylinder 313 is completed. In response to the signal, the air cylinder 313 is supplied with air under a pressure corresponding to a desired pressing load for thereby pressing the top ring 32 against the turntable 34 to apply a pressing force to the semiconductor wafer. At the same time, a vacuum line for developing a negative pressure to attract the semiconductor wafer is cut off. At this time, depending on the type of the layer to be polished of the semiconductor wafer, the negative pressure may remain developed, or a valve is operated to control the pressure of the gas to apply a positive pressure to the upper surface of the semiconductor wafer for thereby controlling the polished profile of the semiconductor wafer. The pressure at this time is applied only to the through holes 303 defined in the wafer holding portion of the top ring 32. Therefore, depending on which area of the semiconductor wafer the pressure is to be applied to, the diameters, number, and positions of the through holes 303 are varied to achieve a desired polished profile.

After a predetermined time of polishing, the top ring 32 holds the semiconductor wafer under vacuum. Thereafter, the semiconductor wafer 101 held by the top ring 32 is moved toward the outer periphery of the turntable 34 while the semiconductor wafer contacts the polishing cloth on the turntable. Finally, the semiconductor wafer 101 projects from the outer periphery of the turntable 34 in such a manner that the center of the semiconductor wafer 101 is located on the turntable 34 and near the periphery of the turntable 34 as much as possible and about 40% of the surface of the semiconductor wafer projects from the turntable 34. Thereafter, the air cylinder 313 is actuated, and the top ring 32 holding the semiconductor wafer 101 is raised. Depending on the polishing cloth which is used, the surface tension between the slurry on the polishing cloth and the semiconductor wafer may be stronger than the attractive force of the top ring, tending to leave the semiconductor wafer on the polishing cloth. In order to reduce the surface tension, the semiconductor wafer is allowed to project from the turntable and then the top ring 32 is raised. If more than 40% of the surface area of the semiconductor wafer projects from the turntable, then the top ring would be tilted, causing the semiconductor wafer to hit the edge of the turntable and hence to crack. It is therefore preferable for the semiconductor wafer to project about 40% of its surface area from the turntable. In other words, it is essential that the center of the semiconductor wafer is located on the turntable 34.

When lifting of the top ring 32 is completed, the sensor 320 detects the completion of the lifting action of the air cylinder 313. Thereafter, the top ring 32 starts to be swung, and is moved to the position above the pusher 30 and transfers the semiconductor wafer 101 to the pusher 30. After the semiconductor wafer is removed from the top ring 32, a cleaning liquid is supplied to the lower surface of the top ring 32 from a nozzle or nozzles located below the top ring 32, and the wafer holding surface of the top ring 32 and surrounding regions are cleaned. The purpose of supply of the cleaning liquid is to prevent the top ring from being dried until a next semiconductor wafer is transferred to the top ring, and the supply of the cleaning liquid may be continued. The cleaning liquid may be intermittently ejected from the nozzle to reduce the running cost. While the semiconductor wafer is being polished, the polishing time is divided into a plurality of steps, and the pressing force and rotational speed of the top ring and the method of holding the semiconductor wafer can be changed in each of the steps. It is also possible to change the kind, amount, density, temperature, and supply timing of the abrasive liquid that is used.

If the current supplied to the motor for rotating the top ring is monitored during the polishing process, then the torque outputted by the motor can be calculated. When the polishing of a semiconductor wafer reaches the end point, the friction between the semiconductor wafer and the polishing cloth is changed. The end point of the polishing of the semiconductor wafer may be detected on the basis of a change in the torque of the motor. Similarly, the current supplied to the motor for rotating the turntable 34 may be monitored, a change in the torque may be calculated, and the end point of the polishing of the semiconductor wafer may be detected on the basis of a change in the calculated torque. While a semiconductor wafer is polished, vibrations of the top ring are measured, and the end point of the polishing of the semiconductor wafer may be detected by detecting inflection points of the vibration waveform. Furthermore, an electrostatic capacitance may be measured to detect the end point of the polishing process. These four types of detection of the end point of the polishing process are based on a determination from different surface irregularities or different surface layer qualities or the thickness of the remaining layer before and after the semiconductor wafer is polished. The surface of a polished semiconductor wafer may be cleaned, the amount of a material removed from the semiconductor wafer may be confirmed, insufficient polishing may be confirmed, and then the semiconductor wafer may be polished again to make up for the insufficient polishing.

Dresser

Figure 36:
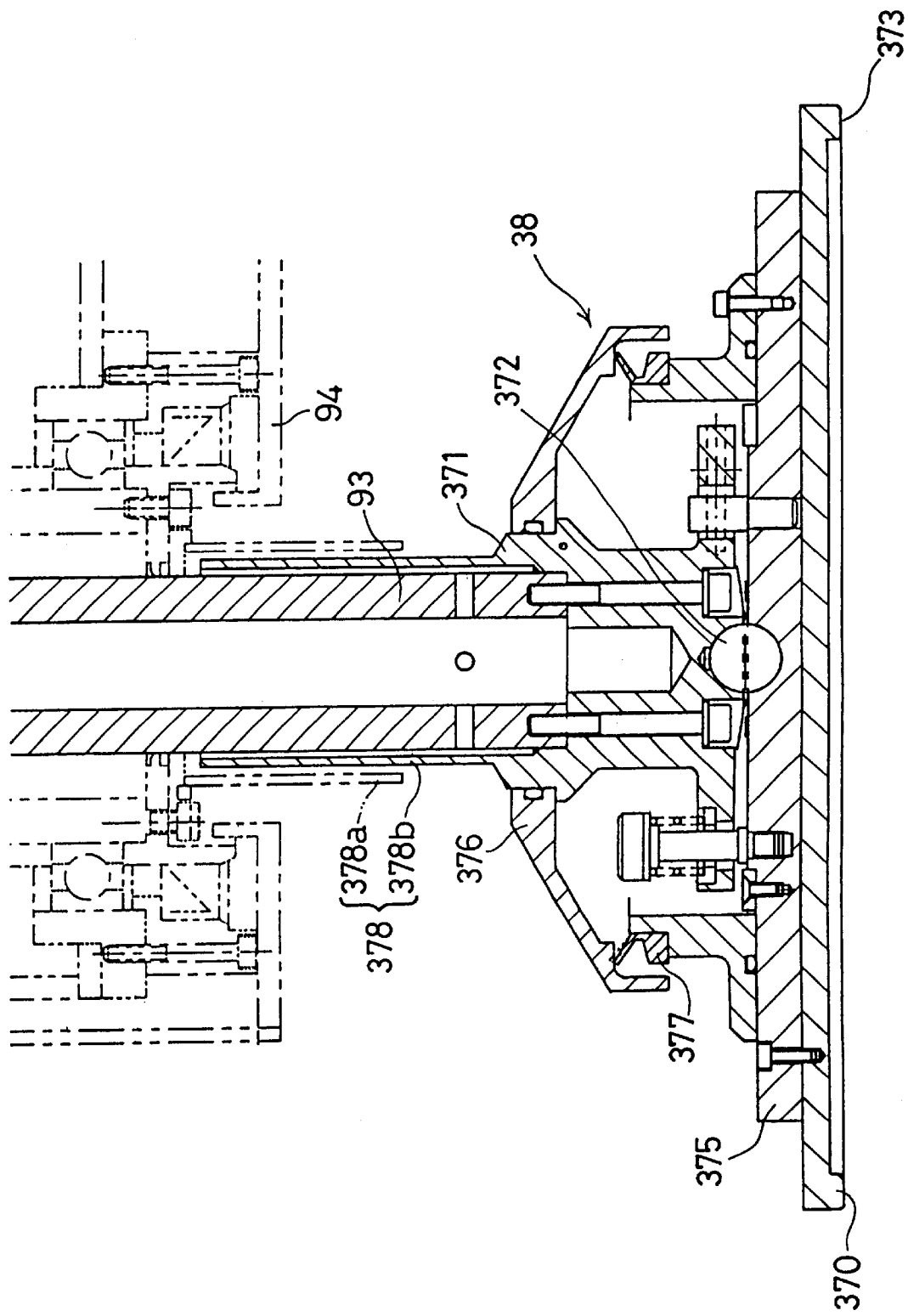
FIG. 36 is a vertical cross-sectional view of a diamond dresser.
Figure 37:
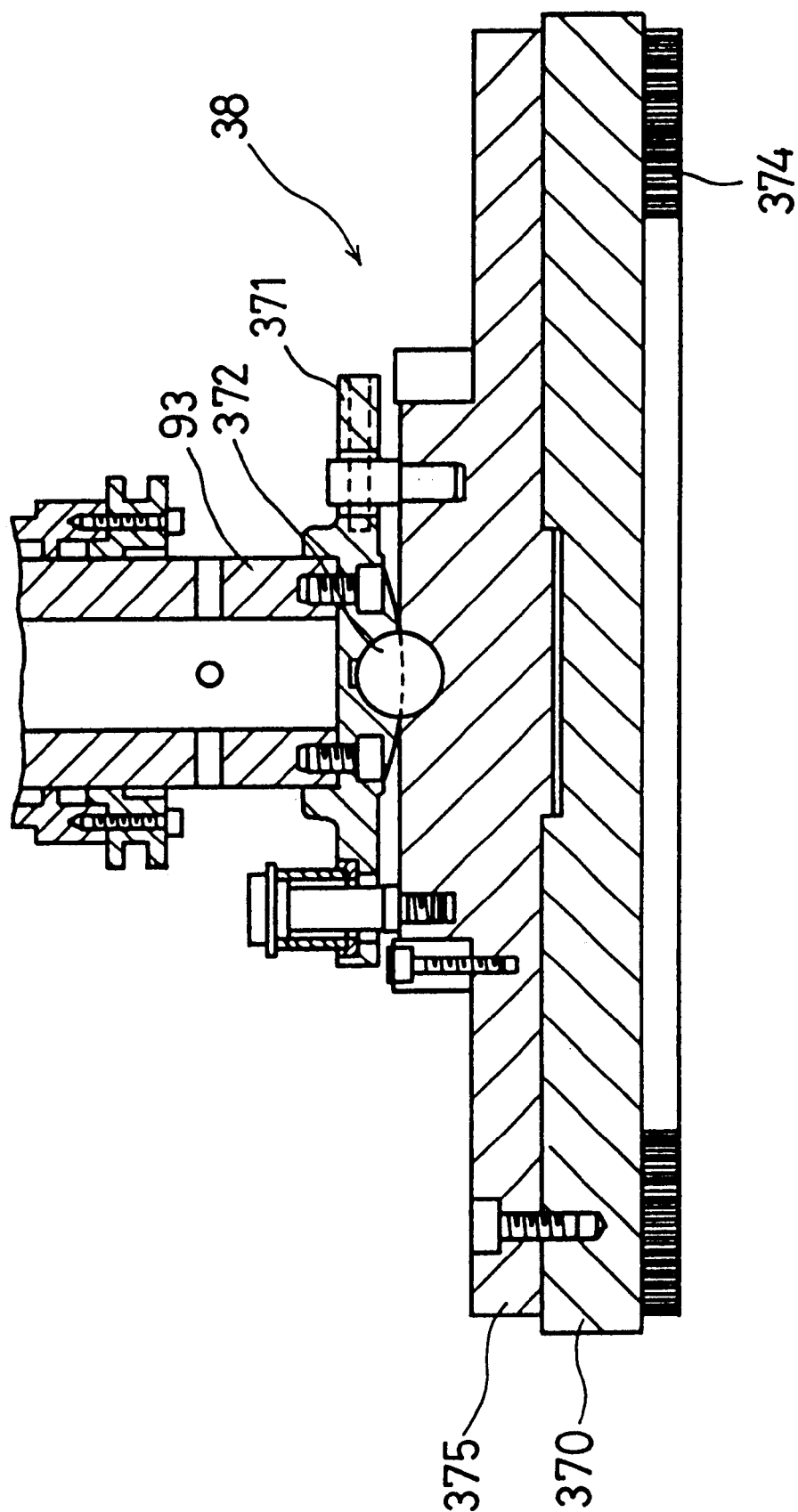
FIG. 37 is a vertical cross-sectional view of a brush dresser.

FIGS. 36 and 37 are vertical cross-sectional views of dressers. FIG. 36 shows a diamond dresser, and FIG. 37 shows a brush dresser. Since the dressers 38 and 39 are of substantially the same structure, only the dresser 38 will be described below.

As shown in FIG. 36, the dresser 38 has a dresser plate 370 having a dressing surface for dressing the polishing cloth. The dresser plate 370 is fastened to an attachment flange 375 which has a hemispherical hole defined centrally in an upper surface thereof. A drive flange 371 fixed to the dresser drive shaft 93 is disposed above the attachment flange 375. The drive flange 371 also has a hemispherical hole defined therein. A ball 372 which is hard and made of ceramics, for example, is provided in the hemispherical holes. A downward pressing force applied to the drive flange 371 is transmitted via the ball 372 to the dresser plate 370. Diamond particles 373 for correcting the shape of the polishing cloth and dressing the polishing cloth are electrode posited on a lower surface of the dresser plate 370. Alternatively, a number of hard protrusions of ceramics, for example, may be disposed on the dresser plate 370. The diamond particles or hard protrusions may be replaced only by replacing the dresser plate 370 for thereby easily performing other types of dressing processes. In any case, since the surface configuration of the dresser plate 370 is reflected in the surface configuration of the polishing cloth that is dressed, the dressing surface of the dresser is finished to a flat surface.

The dresser drive shaft 93 is supported on the dresser head 94 (see FIG. 2). The dresser head 94 has essentially the same function as the top ring head 31. The dresser drive shaft 93 is rotated by a motor and vertically moved by an air cylinder. The details of the structure of the dresser head 94 are substantially the same as those of the top ring head 31, and will not be illustrated.

FIG. 37 shows the brush dresser having a brush 374 mounted on the lower surface of the dresser plate 370 in place of the diamond particles 373. Other structural details of the brush dresser are essentially the same as those of the diamond dresser shown in FIG. 36.

For correcting the shape of the polishing cloth or dressing the polishing cloth, the dresser is angularly moved from a cleaning position above a dressing position on the turntable. Upon completion of the angular movement of the dresser, the dresser rotates at a desired rotational speed, and is lowered by the air cylinder. When the dresser is brought into contact with the upper surface of the turntable, a sensor associated with the air cylinder for detecting the lower end of its stroke is actuated to generate a signal indicating that the dresser 38 has touched the turntable. In response to the signal, the air cylinder applies a pressing force to the dresser 38 to dress the polishing cloth on the turntable under the desired pressing force. After the dresser 38 has dressed the polishing cloth for a desired period of time, the air cylinder is operated to lift the dresser 38 away from the turntable. Thereafter, the dresser 38 is angularly moved to the cleaning position in which the dresser 38 is submerged in a water container 43, 43' (see FIG. 1) and cleaned. Rather than being submerged in the water tank, the dresser may be cleaned by a spray ejected from a spray nozzle, or by being pressed against a brush provided on the bottom of the water tank and rotated. The water tank 43' is associated with the dresser 39.

When the dresser 38 is submerged in the water container 43, the cleaning water in the water container 43 may be vibrated by ultrasonic energy. If the upper surface of the dresser 38 were placed in the cleaning water in the water container 43, then when the dresser 38 is dried after being lifted out of the water container 43, any ground-off material on the dresser 38 would be solidified and tend to drop onto the turntable in a polishing process, thus adversely affecting the polishing process. Therefore, only the lower surface of the dresser 38 may be submerged in the cleaning water, and the upper surface thereof may be cleaned by a spray nozzle. At this time, droplets of the spray are liable to be applied to the upper surface of the dresser 38. Such droplets of the spray are prevented from entering the dresser 38 by a water-resistant cap 376 and a V-ring 377 and also a labyrinth 378 comprising members 378a and 378b. The cleaning liquid used for cleaning the dresser may comprise pure water or a chemical liquid. The above structure of the dresser may be applied to the top ring 32 shown in FIG. 35 or the dresser 38 shown in FIG. 37. The dressing operation may be performed while the current supplied to the motor for rotating the dresser is being measured, and a certain reference value of the measured current may be used as a sign indicative of the end point of the process of correcting the shape of the polishing cloth or dressing the polishing cloth.

Dressing of Second Turntable

As shown in FIGS. 1 and 2, in the polishing apparatus, there are provided the second turntables 36 and 37 which are smaller in diameter than the first turntables 34 and 35. These second turntables 36 and 37 may be used to slightly scrape off the surface of semiconductor wafers, i.e., in a finish polishing process such as a buffing-off process. The second turntables are dressed by respective dressers, i.e., the dressers 48 and 49 shown in FIG. 1. These dressers 48 and 49 will be described in detail below. While these dressers are collectively referred to as the dressers 48 and 49 in FIGS. 1 and 2, a portion of a tip end thereof will be described as a dresser 3000.

Figure 38:
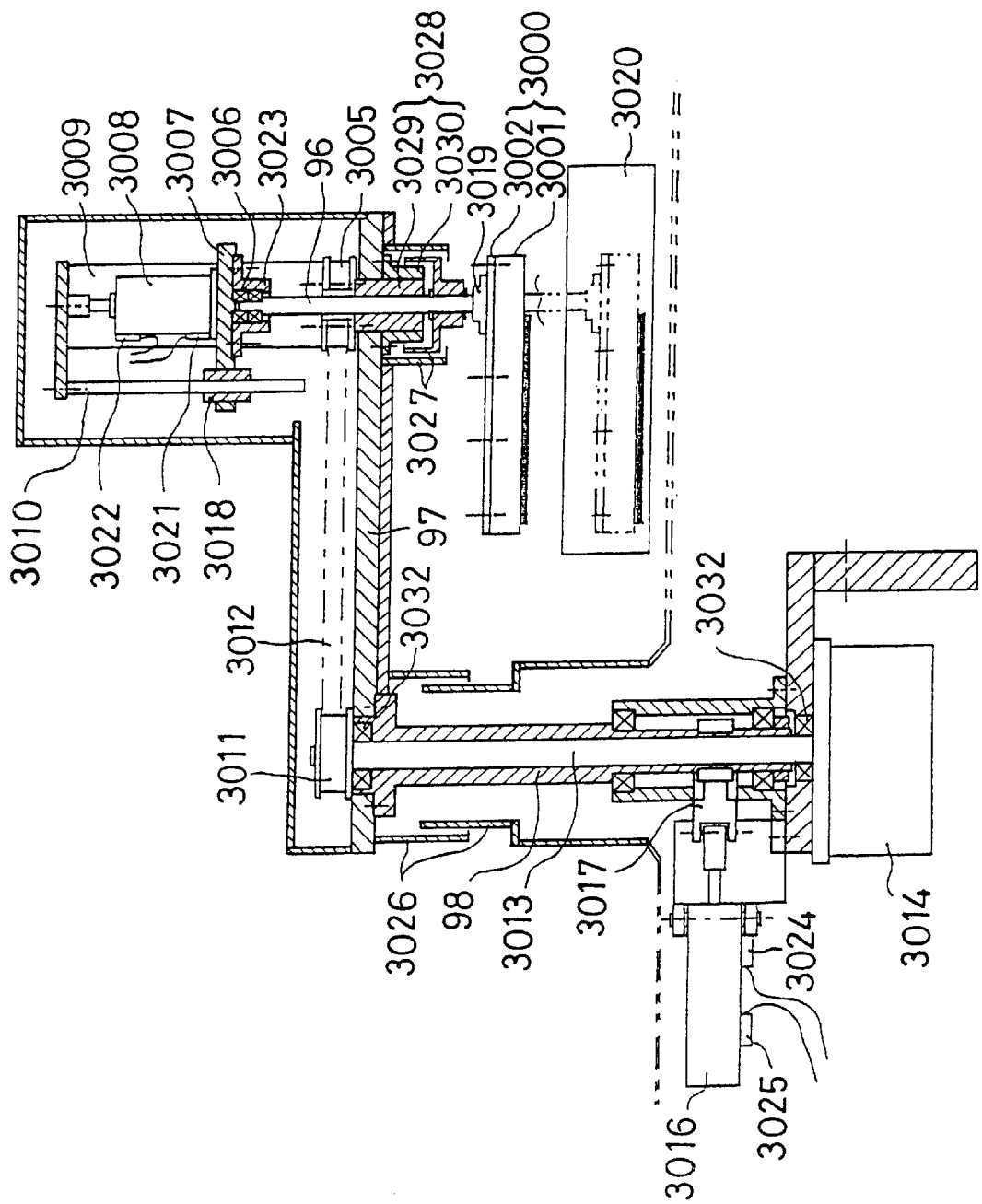
FIG. 38 is a vertical cross-sectional view of a dresser of a second turntable.
Figure 39:
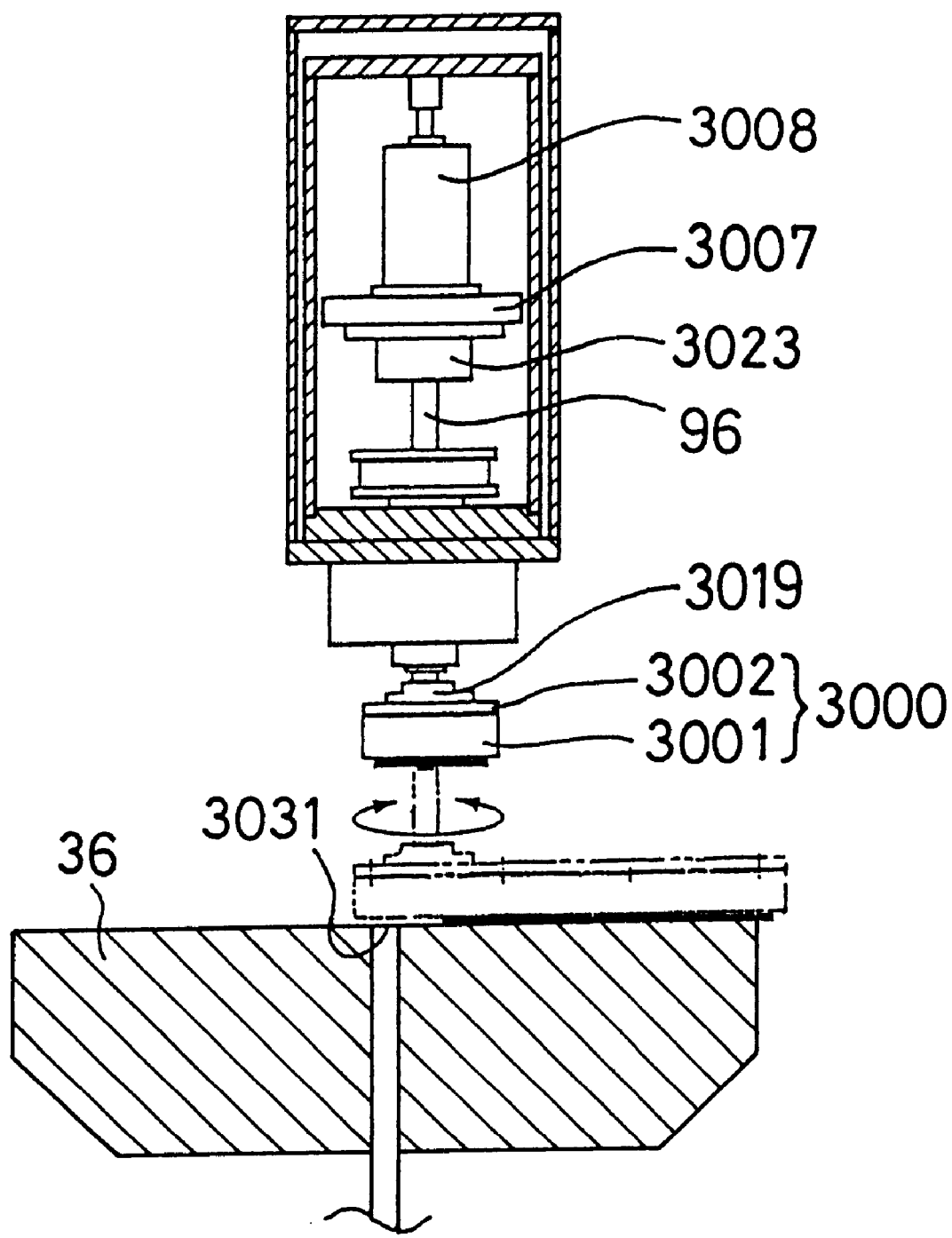
FIG. 39 is a side elevational view of the dresser of the second turntable.

FIG. 38 is a vertical cross-sectional view showing the structure of the dresser, and FIG. 39 is a side elevational view of the turntable and the dresser. While the dressers 48 and 49 shown in FIGS. 1 and 2 have circular plate facing the turntables, the dresser 3000 shown in FIGS. 38 and 39 has a rectangular plate facing the turntable.

The dresser 3000 is retracted in a water container 3020 while a semiconductor wafer is being polished. After the polishing of the semiconductor wafer is completed, the dresser 3000 is lifted by an air cylinder 3008. A mechanism for lifting and lowering the dresser 3000 will be described below. The dresser 3000 is coupled to the dresser drive shaft 96, which is splined, at an end of a brush fixing seat 3002 with a drive flange 3019 interposed therebetween. The dresser drive shaft 96 has an upper end supported by a bearing 3006 housed in a bearing case 3023 which is fastened to an air cylinder 3008 with a bracket 3007 interposed therebetween. The air cylinder 3008 is fixed to a lower surface of an upper portion of a base 3009 to provide a mechanism for transmitting vertical motion of the air cylinder 3008 to the dresser 3000. A guide 3010 for guiding vertical linear motion of the air cylinder 3008 is mounted on the base 3009. A slider 3018 that is linearly movable relatively on the guide 3010 is mounted on the bracket 3007 for guiding motion of the air cylinder 3008.

A rotary ball spline 3028 for guiding linear motion of vertical movable components ranging from the air cylinder 3008 to the dresser 3000 is mounted on the dresser drive shaft 96. The rotary ball spline 3028 comprises a spline ring 3029 and an outer flange ring 3030. The spline ring 3029 guides linear motion of the dresser drive shaft 96, and transmits rotary motion to the dresser drive shaft 96. The outer flange ring 3030 supports the rotation of the spline ring 3029. A pulley 3005 is mounted on the spline ring 3029. The pulley 3005, when rotated, rotates the spline ring 3029, whose rotation is transmitted to the dresser drive shaft 96.

When the dresser 3000 reaches an elevated position, a sensor 3021 for detecting the arrival of the dresser 3000 at the elevated position generates a signal. Thereafter, the dresser 3000 and the dresser head 97 are angularly moved to a dressing start position by a swinging mechanism which comprises an air cylinder 3016, a crank 3017 for converting linear motion of the air cylinder 3016 to rotary motion, and a hollow rotatable shaft 98 coupled to the dresser head 97 and rotatable by the rotary motion of the crank 3017. Thus, the swing mechanism converts the linear motion of the air cylinder 3016 to the rotary motion of the hollow rotatable shaft 98 through the crank 3017.

When the dresser 3000 reaches a dressing position, a terminal sensor 3024 mounted on the air cylinder 3016 generates a signal, and then the dresser 3000 is rotated about the dresser drive shaft 96. The dresser 3000 is rotated as follows: A rotatable shaft 3013 inserted in the hollow rotatable shaft 98 is connected to a motor 3014. When the motor 3014 is energized, the rotatable shaft 3013 is rotated. The rotatable shaft 3013 is supported by bearings 3032 disposed on respective opposite ends of the hollow shaft 98. When the rotatable shaft 3013 is rotated by the motor 3014, a pulley 3011 mounted on the upper end of the shaft 3013 is rotated, and the rotation of the pulley 3011 is transmitted via a timing belt 3012 to the pulley 3005. The rotation of the pulley 3005 is transmitted via the spline ring 3029 to the dresser drive shaft 96.

If the motor 3014 detects when the rotational speed of the dresser 3000 becomes steady, then the air cylinder 3008 lowers the dresser drive shaft 96 for the dresser 3000 to start dressing the polishing cloth. If a sensor 3022 for detecting the arrival of the dresser 3000 at a lowered position does not generate a signal, then it is determined that the dresser 3000 has not reached the proper lowered position, and an error is indicated. While the polishing cloth is being dressed, it is possible to introduce a liquid such as pure water or a chemical liquid from a dressing liquid supply port 3031 onto the turntable 36.

After the dressing process, the dresser 3000 is lifted. After the sensor 3021 for detecting the arrival of the dresser 3000 at the elevated position generates a signal, the rotation of the dresser 3000 is stopped. After the motor 3014 has confirmed the stoppage of the rotation, the dresser 3000 is angularly moved to a standby position. After a terminal sensor 3025 of the air cylinder 3016 generates a signal, the dresser 3000 is lowered into the water container 3020. Now, a series of dressing operation is finished.

The polishing cloth and the fixed abrasive grain plate (or a grinding stone) are replaceable. A brush body 3001 and the diamond dresser are also replaceable. The dresser 3000 comprises the brush body 3001 and the brush fixing seat 3002. The brush body 3001 is replaceable as an expendable element.

The rotatable shaft 98 and the rotary ball spline 3028 are associated with respective protective outer casings 3026 and 3027 each comprising a labyrinth mechanism for preventing liquids including pure water, a slurry and a chemical liquid from entering the interior of the protective outer casings 3026 and 3027 while the dresser 3000 is in use.

The portion of the dresser 3000 which faces the turntable is of an elongated shape. Since the dresser 3000 is slender and the rotatable shaft is positioned at an end thereof, the dresser 3000 has a smaller occupied area and an equivalent dressing area as compared with circular dressers.

Turntable

Figure 40:
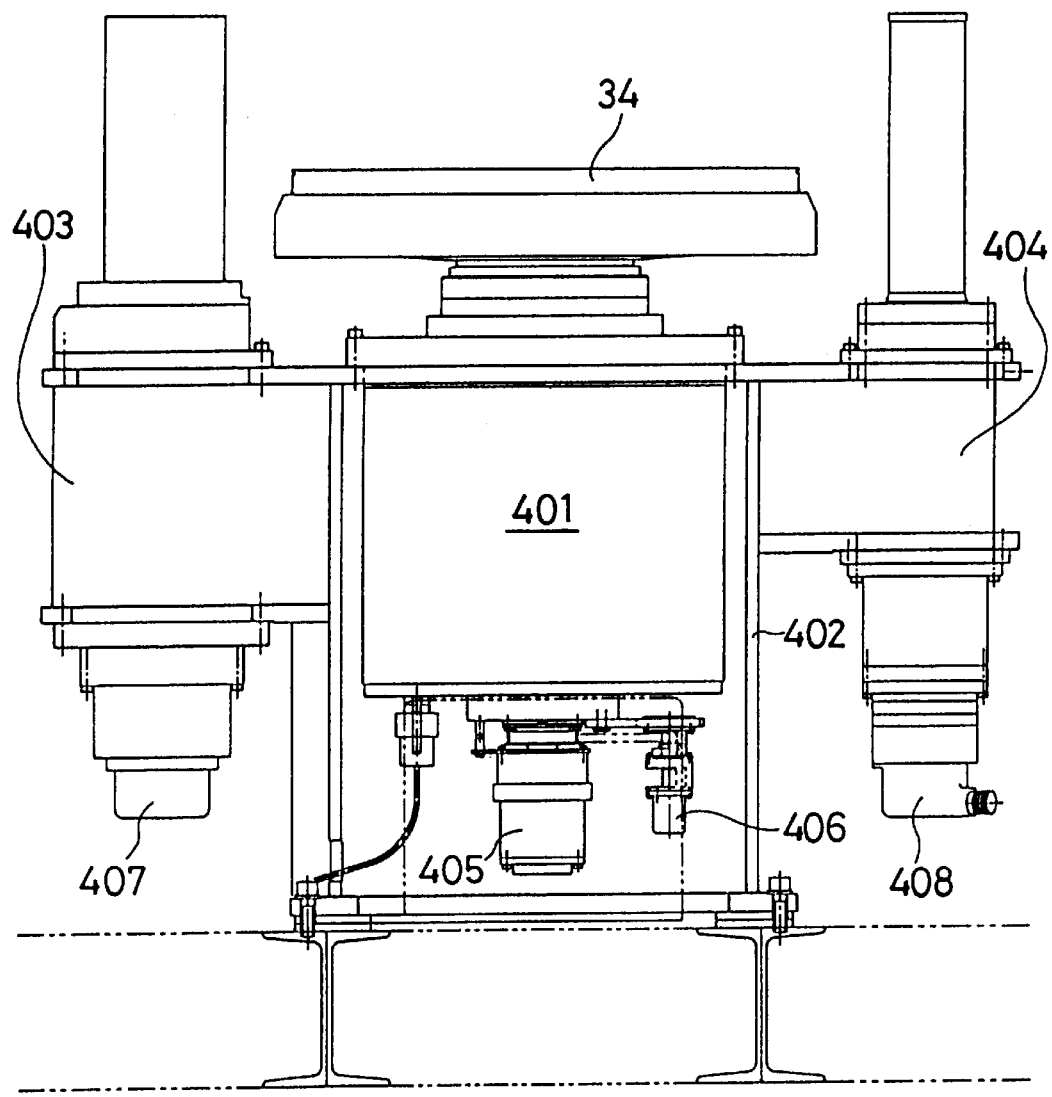
FIG. 40 is a front elevational view of a rotary-type turntable.

FIG. 40 is a front view of the turntable. The turntables 34 and 35 are disposed in the areas C and D, respectively. Depending on the polishing processes, in order to improve processing capability of two-stage polishing, the small-sized turntables 36 and 37 may be provided in the areas C and D, respectively as shown in FIG. 1. The polishing tables 34, 35, 36 and 37 may comprise two kinds of turntables, i.e. a rotating-type turntable and a scroll-type turntable. Both types can be incorporated in the same area, and various polishing processes can be selected.

The turntable shown in FIG. 40 comprises the rotating-type turntable. The rotating-type turntable 34 has a polishing surface whose radius is larger than the diameter of the semiconductor wafer, the turntable 34 and the semiconductor wafer are rotated in the same direction, and the semiconductor wafer is polished at the position spaced from the center of the turntable. In this manner, the relative velocity between the semiconductor wafer and the turntable can be equal at any point on the semiconductor wafer, if the turntable 34 and the semiconductor wafer are rotated at the same rotational speed.

As shown in FIG. 40, the turntable 34 is directly driven by a motor 401, and has such a structure that thrust and radial shaft loads thereof are supported by bearings of the motor 401. The motor 401 is accommodated in a motor housing 402 which is integral with a housing 403 that houses a swing shaft for angularly moving the top ring and a motor housing 404 that houses a swing shaft for angularly moving the dresser. The motor housing 402 may be directly mounted on a base which supports the polishing apparatus in its entirety or may be integral with such a base. The motor 401 has a hollow rotor with a plurality of pipes passing therethrough. The pipes in the hollow rotor are connected to a rotary joint 405 connected to the lower end of the hollow rotor.

The hollow rotor has a mechanism which can operate in synchronism with the rotation of the hollow rotor. An encoder 406 is coupled to the mechanism for measuring the rotational speed of the motor 401 at all times. A signal indicative of the measured rotational speed is supplied to a driver which controls the motor 401 for thereby enabling the motor 401 to rotate at a proper rotational speed. The end point of a polishing process can be detected by monitoring a current of the motor 401. The motor 401 has a stator case having a passage defined therein to allow a motor coolant to pass therethrough so that the motor 401 is continuously operated under a high load.

The turntable 34 may have a sensor for optically detecting an abnormal condition such as dislodgement of a semiconductor wafer from the top ring 32. When such an abnormal condition occurs, the motor 401 can immediately stop the turntable 34 in response to a signal from the sensor.

The turntable 34 and the motor 401 are detachably installed in the polishing apparatus. The turntable 34 may be of either the type in which a polishing cloth is attached to the turntable 34 or the type in which a polishing cloth is attached to a cartridge that can be removably mounted on the turntable 34. Whichever type the turntable 34 may be of, the turntable 34 has a surface plate which may be of either a flat, convex, or concave shape. If the turntable 34 is of the former type, then a polishing cloth is attached to the surface plate of the turntable 34. If the turntable 34 is of the latter type, then a polishing cloth or a fixed abrasive grain plate (grinding stone) is attached to the cartridge. If the turntable 34 is of the former type, then the surface plate may be made of stainless steel or ceramics. If the turntable 34 is of the latter type, then the surface plate shape, the polishing cloth, or the fixed abrasive grain plate may be changed simply by replacing the cartridge. If a cartridge type surface plate with a polishing cloth attached thereto is available for ready use, then the time required for replacing the polishing cloth on the surface plate can be shortened. The cartridge type surface plate may be of either a solid structure or a hollow honeycomb structure for reduced weight. The cartridge type surface plate of the hollow honeycomb structure can reduce the burden on the operator for cartridge replacement.

Turntable Cooling and Temperature Adjustment

The surface plate has in its lower portion a mechanism for adjusting the temperature of the surface plate. Temperature adjustment water is supplied through a pipe in the hollow shaft of the motor 401 to a table cooling chamber in the lower portion of the surface plate. The table cooling chamber has coolant passages disposed therein for uniformly cooling the entire surface of the turntable. The layout of the coolant passages differs depending on the surface plate that is used.

A pipe for supplying the temperature adjustment water to the polishing apparatus is combined with a temperature sensor. When the temperature of the temperature adjustment water deviates from an allowable range with respect to a preset temperature, the process is interlocked. A signal indicative of the detected temperature may be supplied to a temperature adjustment water control unit outside of the polishing apparatus for feedback control. The pipe for supplying the temperature adjustment water is also combined with a flow rate meter and a pressure gage, so that the process can be interlocked when the temperature adjustment water is supplied at an abnormal flow rate or under an abnormal pressure. A flow regulating valve and a pressure regulator are also provided for controlling the flow rate and the pressure of the temperature adjustment water within the polishing apparatus. According to another temperature control process, the temperature of the polishing surface on the turntable 34 is measured by a noncontact type temperature sensor, and a signal indicative of a measured temperature is sent to the temperature adjustment water control unit to perform feedback control.

Next, the turntable other than the turntable shown in FIG. 40 will be described.

Scroll-type Turntable

Figure 41:
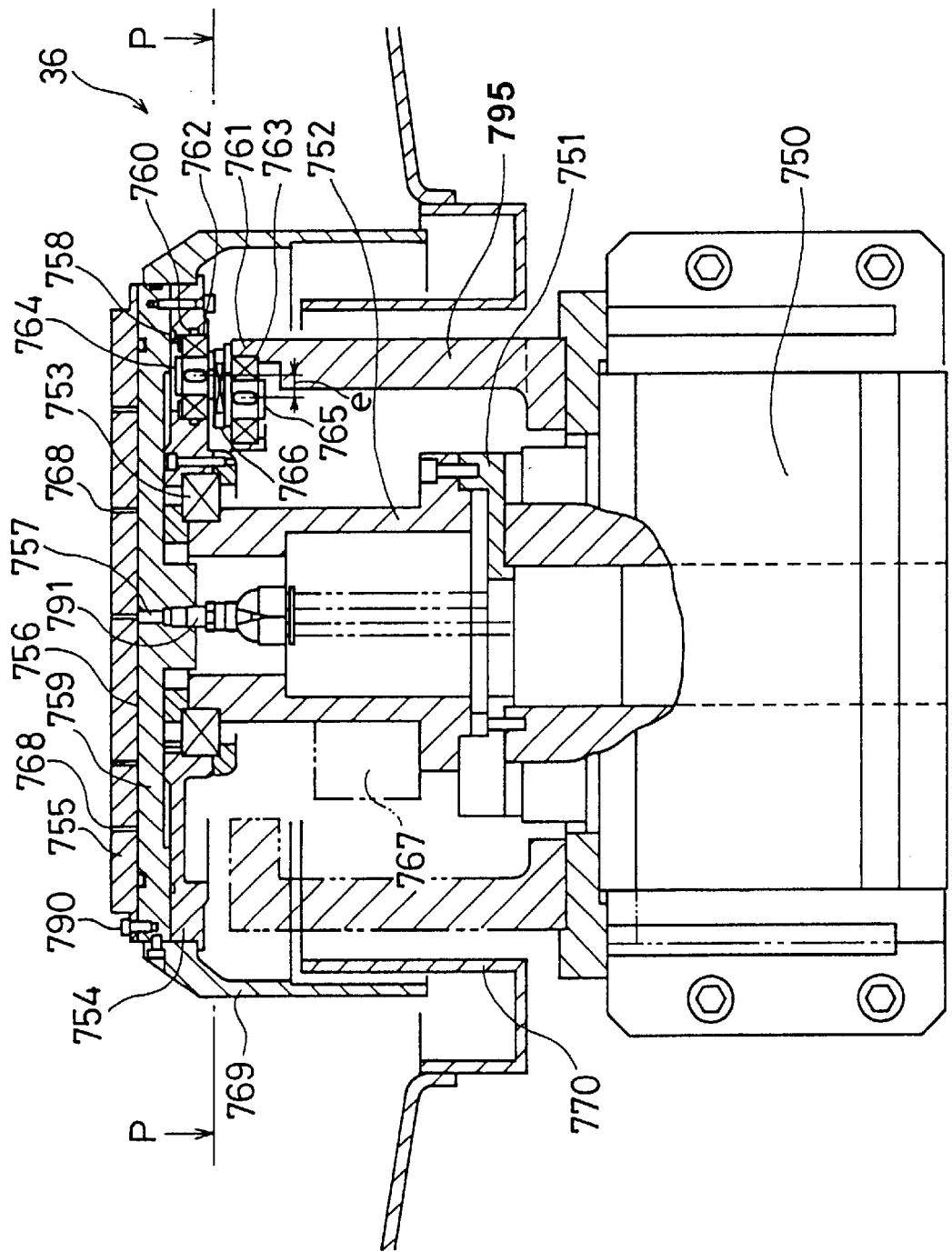
FIG. 41 is a vertical cross-sectional view of a scroll-type turntable.
Figure 42A:
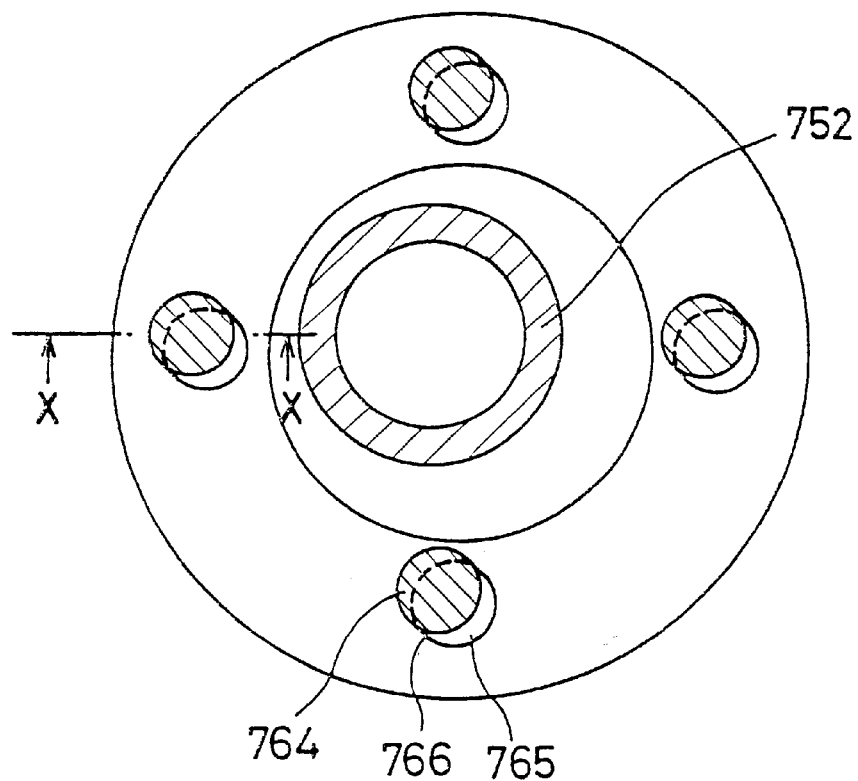
FIG. 42A is a cross-sectional view taken along line P—P of FIG. 41.
Figure 42B:
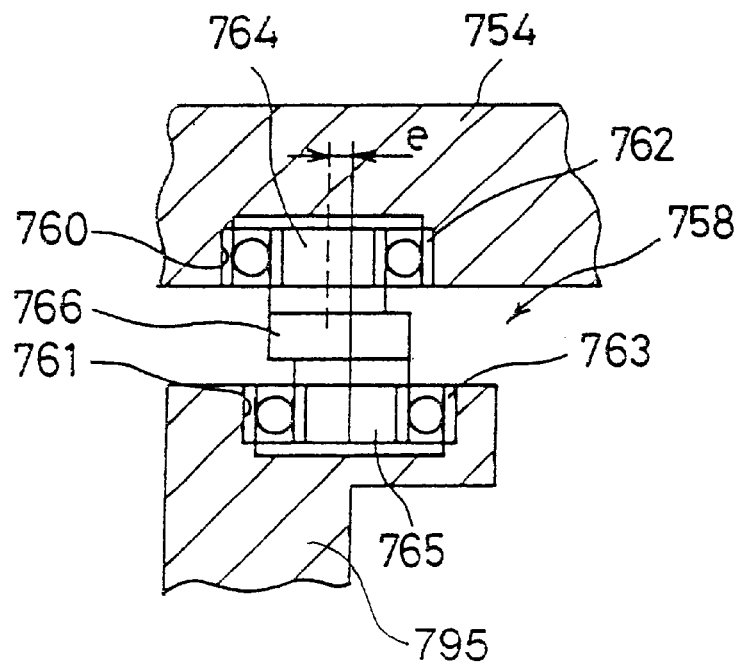
FIG. 42B is a cross-sectional view taken along line X—X of FIG. 42A.

FIG. 41 is a cross-sectional view showing the scroll-type second polishing turntable, FIG. 42A is a cross-sectional view taken along line P—P of FIG. 41, and FIG. 42B is a cross-sectional view taken along line X—X of FIG. 42A.

The scroll-type second turntable 36 has an upper flange 751 of a motor 750, and a hollow shaft 752 connected to the upper flange 751 by bolts. A set ring 754 is supported by the upper portion of the shaft 752 through a bearing 753. A table 759 is fixed to the set ring 754, and a polishing table 755 is fixed to the table 759 by bolts 790. The polishing table 755 may comprise a grinding stone (fixed abrasive plate) entirely, or may comprise a plate made of a corrosion-resistant metal such as stainless steel and a polishing cloth attached to the plate. In case of using the grinding stone or the polishing cloth, the polishing table 755 may have a flat upper surface or a slightly convex or concave upper surface. The shape of the upper surface of the polishing table 755 is selected depending on the kind of the semiconductor wafer 101 to be polished. The outer diameter of the polishing table 755 is set to a diameter having the diameter of the semiconductor wafer plus distance 2e (described below) or larger. That is, the diameter of the polishing table 755 is arranged such a diameter that when the polishing table 755 makes a translational motion, the semiconductor wafer does not project from the outer periphery of the polishing table 755. The translational motion may be called scroll motion or orbital motion.

The set ring 754 has three or more supporting portions 758 in a circumferential direction, and the table 759 is supported by the supporting portions 758. A plurality of recesses 760, 761 are formed at positions corresponding to the upper surface of the supporting portions 758 and the upper end of the cylindrical member 795 at angularly equal intervals in a circumferential direction, and bearings 762 and 763 are mounted in the recesses 760 and 761. As shown in FIGS. 41 and 42, a support member 766 having two shafts 764 and 765 whose central axes are spaced by "e" is supported by the bearings 762 and 763. Specifically, the two shafts 764 and 765 are inserted into the bearings 762 and 763, respectively. Thus, the polishing table 755 makes a translational motion along a circle having a radius "e" by the motor 750.

Further, the center of the shaft 752 is off-centered by "e" from the center of the motor 750. A balancer 767 is fixed to the shaft 752 for providing a balance to the load caused by eccentricity. The supply of the abrasive liquid onto the polishing table 755 is conducted through the insides of the motor 750 and the shaft 752, a through-hole 757 provided at the central portion of the table 759, and a coupling 791. The supplied abrasive liquid is once stored in a space 756 defined between the polishing table 755 and the table 759, and then supplied to the upper surface of the polishing table 755 through a plurality of through-holes 768 formed in the polishing table 755. The number and position of the through-holes 768 can be selected depending on the kind of processes. In the case where the polishing cloth is attached to the polishing table 755, the polishing cloth has through-holes at positions corresponding to the positions of the through-holes 768. In the case where the polishing table 755 is made of a grinding stone in entirety, the upper surface of the polishing table 755 has grid-like, spiral, or radial grooves, and the through-holes 768 may communicate with such grooves.

The supplied abrasive liquid may be selected from pure water, chemicals, or slurry, and, if necessary, more than one kind of the abrasive liquid can be supplied simultaneously, alternatively, or sequentially. In order to protect a mechanism for performing a translational motion from the abrasive liquid during polishing, a flinger or a thrower 769 is attached to the table 759, and forms a labyrinth mechanism together with a trough 770.

In the turntable having the above structure, the upper and lower bearings 762, 763 are axially interconnected by the support member 766 comprising a cranked joint having the upper and lower shafts 764, 765 that are fitted respectively in the upper and lower bearings 762, 763. The shafts 764, 765 and hence the upper and lower bearings 762, 763 have respective axes horizontally spaced from each other by a distance "e". The cylindrical member 795 for supporting the lower bearing 763 is fixed to the frame, and hence is stationary. When the motor 750 is energized, the shaft 752 is rotated by the radius of gyration (e) about the central axis of the motor 750, and thus the polishing table 755 makes a circulatory translational motion (scroll motion) through the cranked joint, and the semiconductor wafer 101 attached to the top ring 32 is pressed against a polishing surface of the polishing table 755. The semiconductor wafer 101 is polished by the abrasive liquid supplied through the through-hole 757, the space 756 and the through-holes 768. The semiconductor wafer 101 is polished by the relative circulatory translational motion having a radius "e" between the polishing surface of the polishing table 755 and the semiconductor wafer 101, and the semiconductor wafer 101 is uniformly polished over the entire surface of the semiconductor wafer. If a surface, to be polished, of the semiconductor wafer 101 and the polishing surface have the same positional relationship, then the polished semiconductor wafer is affected by a local difference in the polishing surface. In order to eliminate this influence, the top ring 32 is rotated at a low speed to prevent the semiconductor wafer from being polished at the same area on the polishing surface.

Overhang-type Turntable

Figure 43:
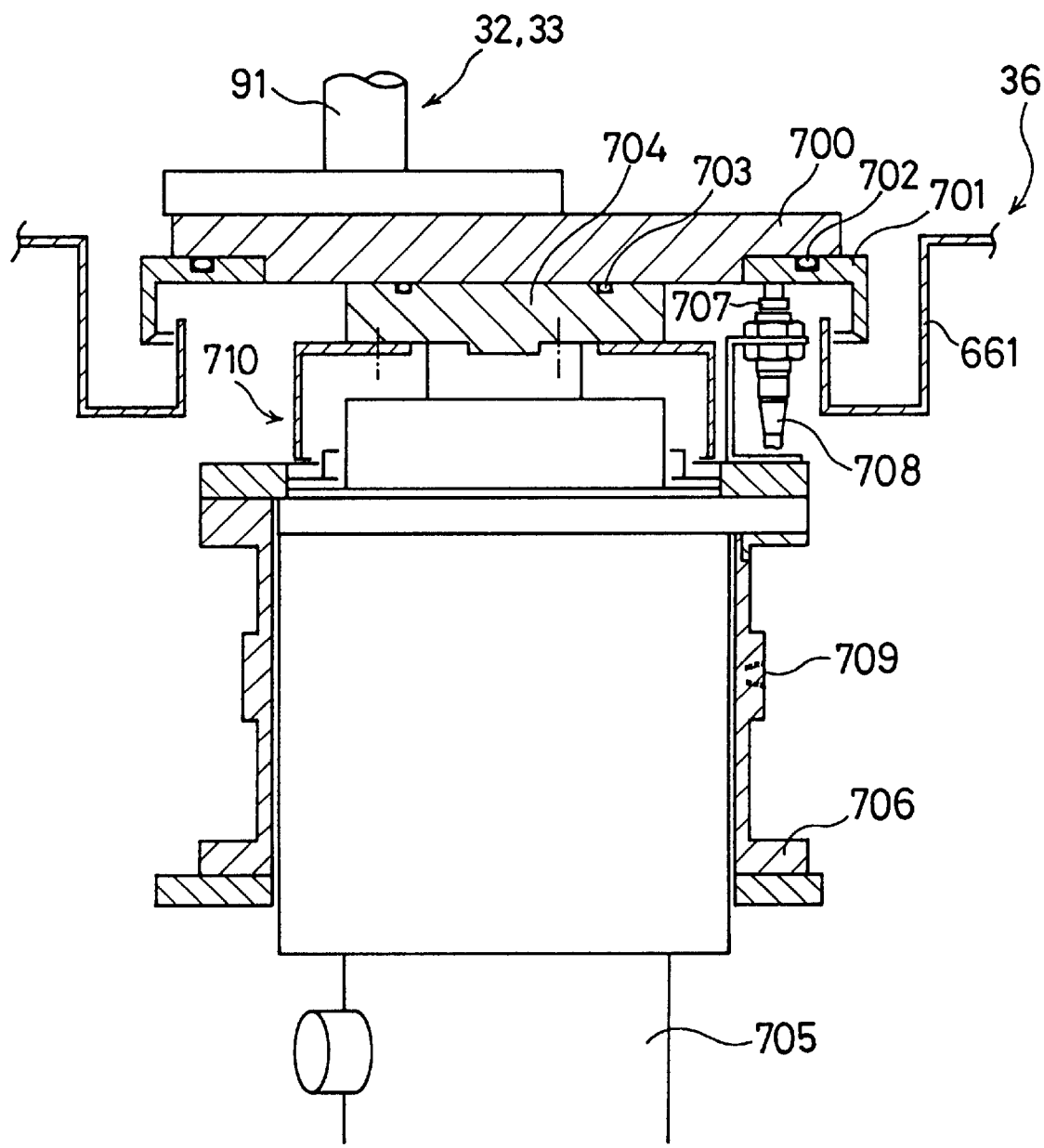
FIG. 43 is a vertical cross-sectional view of an overhanging-type turntable.

FIG. 43 is a cross-sectional view of the overhang-type second turntable. The overhang-type second turntable 36 has a plate 700 coupled to a motor 705 through a flange 704. The plate 700 is rotated by the motor 705. The rotational speed of the plate 700 is measured by counting the number of times in which a dog 707 attached to the plate 700 passes through a proximity switch 708, and is indicated. The overhang-type turntable is protected from the slurry or pure water used for polishing or dressing by a labyrinth 701, O-rings 702 and 703, and a second labyrinth 710 provided inside of the labyrinth 701. A vent port 709 is formed in the housing 706 so that high load polishing, or continuous polishing for a long period of time can be performed. That is, heat in the gap between the housing 706 and the motor 705 is discharged from the vent port 709, and the load of the motor 705 is reduced.

The overhang-type turntable has its center located in the diameter of the semiconductor wafer to be polished. By rotating the semiconductor wafer and the turntable in the same direction, the relative velocity of the semiconductor wafer and the turntable is equal at any point on the semiconductor wafer. The plate 700 is disposed on the upper surface of the turntable, and a polishing cloth or a grinding stone may be attached to the plate 700. The abrasive liquid, chemicals, or water can be supplied to the plate 700 from a nozzle or nozzles located above the plate 700.

Abrasive Liquid Supply Nozzle

An abrasive liquid supply nozzle is a device for supplying an abrasive liquid to the polishing surface such as the polishing cloth on the turntable.

FIGS. 44A, 44B, and 45 show the abrasive liquid supply nozzle. FIG. 44A is a plan view of the abrasive liquid supply nozzle, FIG. 44B is a side elevational view, partly in cross section, of the abrasive liquid supply nozzle, and FIG. 45 is a plan view showing the position of the abrasive liquid supply nozzle 40 with respect to the turntable 34.

As shown in FIG. 45, the abrasive liquid supply nozzle 40 can move to a supply position F for supplying the abrasive liquid onto the turntable 34, a first retracted position E, and a second retracted position D. The abrasive liquid supply nozzle 40 rotates about a rotatable shaft 3051 to bring the tip end of a hollow liquid supply arm 3050 to one of the positions.

A mechanism for rotating the abrasive liquid supply nozzle 40 will be described below.

The rotatable shaft 3051 is rotated when a swing arm 3052 attached to the lower end of the rotatable shaft 3051 is angularly moved about the axis of the rotatable shaft 3051. The swing arm 3052 and air cylinders 3053 and 3054 jointly constitute a link mechanism. When rods of the air cylinders 3053 and 3054 are extended and contracted linearly, the swing arm 3052 is angularly moved to rotate the rotatable shaft 3051 that is positioned at the center of rotation of the swing arm 3052. The air cylinder 3054 is fixed to a cylinder bracket 3056 fixed to a base 3055. The air cylinder 3053 is connected by a pin to the tip end of the rod of the air cylinder 3054 such that the air cylinder 3053 can rotate with respect to the end of the rod of the air cylinder 3054. The rotatable shaft 3051 is rotatably supported by bearings 3057 housed in a bearing case 3058.

Operation of the two air cylinders 3053 and 3054 will be described below.

When the tip end of the liquid supply arm 3050 is positioned over the turntable 34, e.g., at the center of the turntable 34, the rod of the air cylinder 3053 is extended, and the rod of the air cylinder 3054 is contracted. At this time, a position sensor 3066 of the air cylinder 3053 and a position sensor 3068 of the air cylinder 3054 generate respective signals. If such signals are not generated, then a control computer determines that the abrasive liquid supply nozzle 40 is not in a normal position, displays an error, and interlocks the process.

When the tip end of the liquid supply arm 3050 is located in the position E, both the rods of the air cylinders 3053 and 3054 are contracted. At this time, a position sensor 3067 of the air cylinder 3053 and the position sensor 3068 of the air cylinder 3054 generate respective signals for the control computer to recognize the position of the abrasive liquid supply nozzle 40.

When the tip end of the liquid supply arm 3050 is located in the position D, the rod of the air cylinder 3053 is contracted, and the rod of the air cylinder 3054 is extended. At this time, the position sensor 3067 of the air cylinder 3053 and a position sensor 3069 of the air cylinder 3054 also generate respective signals for the control computer to recognize the position of the abrasive liquid supply nozzle 40.

Next, a sensor 3064 attached to the liquid supply arm 3050 will be described below.

When a scattering prevention cover 3070 around the turntable 34 is installed in a normal position, the sensor 3064 senses a dog 3065 mounted on the scattering prevention cover 3070 directly below the sensor 3064, and generates a signal. Therefore, a failure to install the scattering prevention cover 3070 or a positional misalignment of the scattering prevention cover 3070 can easily be detected. Specifically, the scattering prevention cover 3070 is vertically movable, and is lowered when the turntable 34 is inspected and serviced for maintenance. If a semiconductor wafer were polished on the turntable 34 with the scattering prevention cover 3070 being lowered, then the abrasive liquid would be scattered around. Because of a signal generated by the sensor 3064, the motor for rotating the turntable 34 is prevented from being energized in error, and hence the abrasive liquid is prevented from being scattered around.

The liquid supply arm 3050 has an arm body 3059 on which a flinger 3060 is mounted as a protective mechanism for protecting a mechanism for rotating the rotatable shaft 3051 against liquids including an abrasive liquid, a chemical liquid, pure water, etc. The flinger 3060 and a polisher pan 3061 jointly constitute a labyrinth mechanism.

Operation of the liquid supply arm 3050 will be described below.

In the liquid supply position F, four tubes 3063 in the liquid supply arm 3050 are positioned in alignment with the center of rotation of the turntable 34, and one of the four tubes 3063 discharges the abrasive liquid. The discharged abrasive liquid drops onto the center of the turntable 34, spreads uniformly over the entire surface of the turntable 34 to thus cover the polishing surface thereon. The tubes 3063 are inserted in the hollow liquid supply arm 3050, and fixed thereto by a fixing member 3062 to direct the tip ends of the tubes 3063 perpendicularly to the turntable 34.

When the polishing surface is dressed, one of the four tubes 3063 discharges the dressing liquid. The discharged dressing liquid also drops perpendicularly onto the center of the turntable 34 and spreads uniformly over the entire polishing surface of the turntable 34.

With the liquid supply arm 3050, therefore, a liquid discharged from any of the tubes 3063 is supplied perpendicularly to the center of the turntable 34 exactly at the desired position on the polishing surface on the turntable 34.

Rather than directing the tip ends of the tubes 3063 perpendicularly downwardly toward the turntable 34, liquids can be supplied perpendicularly to the turntable 34 by regulating the flow rates of the liquids with flow rate regulating valves $V_1$ and $V_2$ disposed between liquid tanks $T_1$ and $T_2$ and the tubes, such that the liquids discharged from the tip ends of the tubes 3063 immediately flow perpendicularly to the turntable 34.

For replacing the polishing cloth on the turntable 34, the liquid supply arm 3050 is angularly moved to the first retracted position E by the link mechanism including the two air cylinders 3053 and 3054. Since the liquid supply arm 3050 is no longer present over the turntable 34, the polishing cloth thereon can easily be replaced. At this time, the tip ends of the tubes 3063 at the tip end of the liquid supply arm 3050 are positioned directly above a recess 3071 in the scattering prevention cover 3070. Any liquids discharged from the tubes 3063 at this time drop through the recess 3071 into a container positioned therebelow, and do not contaminate components surrounding the turntable 34.

The tubes 3063 may be connected to a source of pure water and cleaned by pure water flowing therethrough without contaminating surrounding components.

If a maintenance process that cannot be performed at the positions E and F, e.g., a process for measuring the rate of a discharged liquid or a process of inspecting components around the turntable is needed, then the liquid supply arm 3050 is moved to the second standby position D by the link mechanism. Since the liquid supply arm 3050 is no longer positioned above the turntable 34 and the scattering prevention cover 3070, the above maintenance process can easily be carried out.

In the above embodiment, the liquid supply arm 3050 is selectively stopped in the three positions by the link mechanism including the air cylinders 3053 and 3054, and the liquid supply arm 3050 may be stopped in at least one liquid supply position and at least one retracted position.

Figure 46:
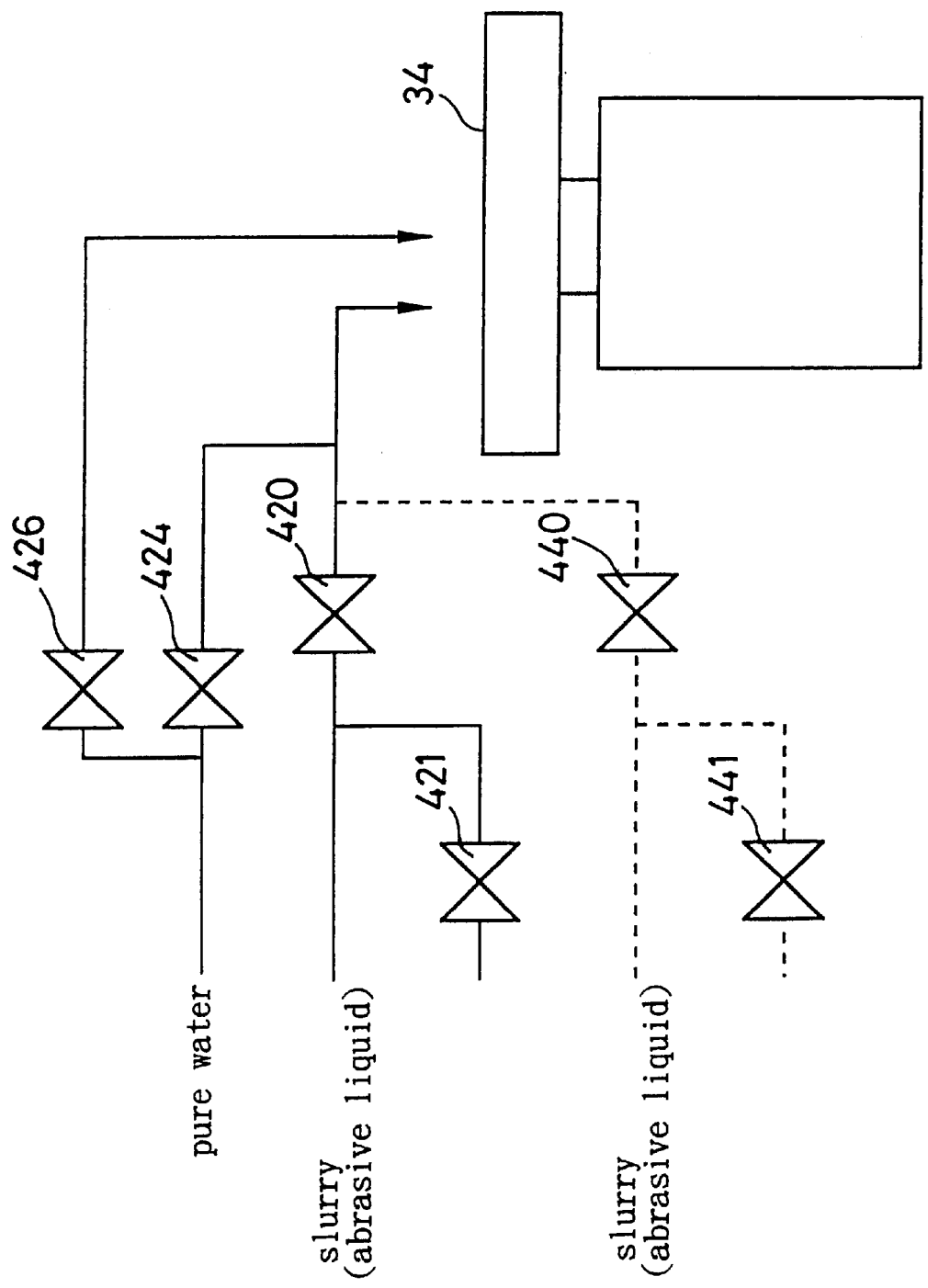
FIG. 46 is a schematic diagram showing an abrasive liquid supply system.
Figure 47:
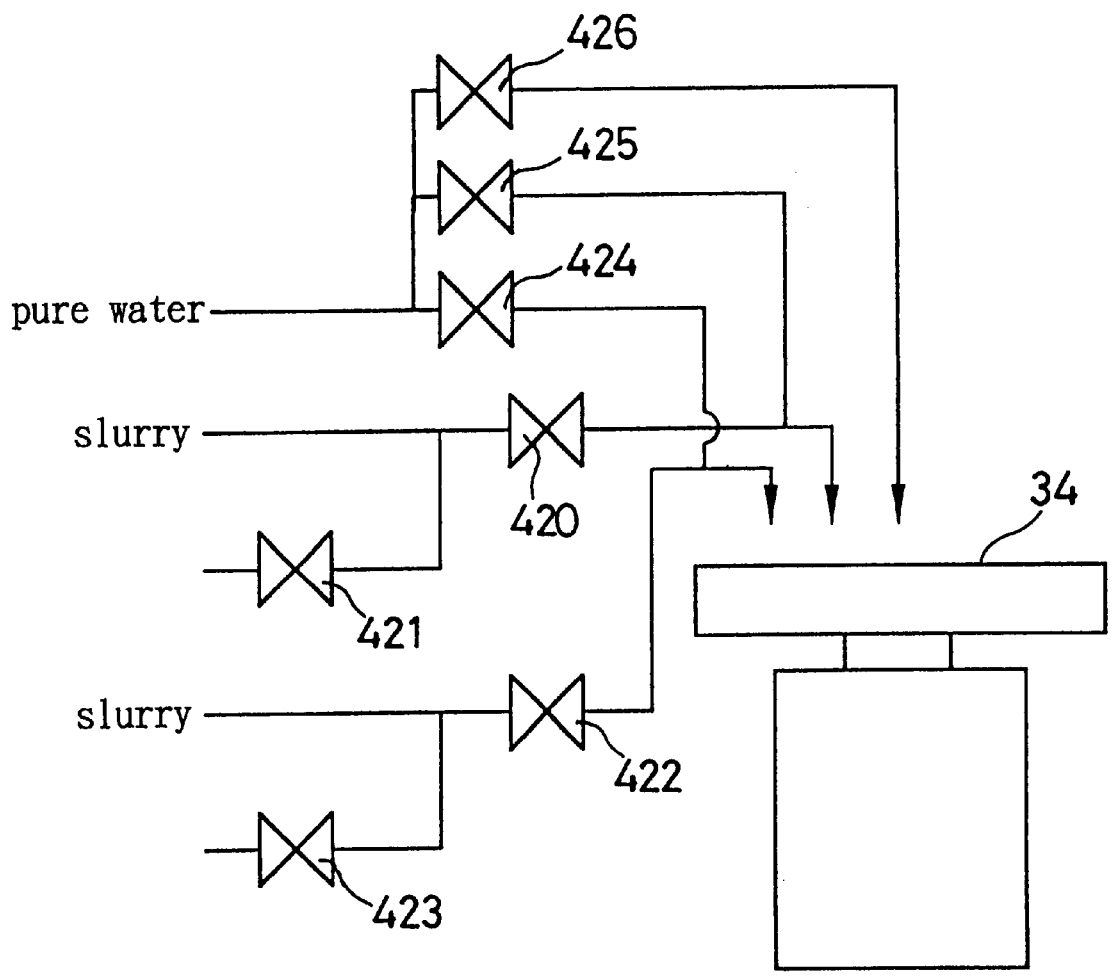
FIG. 47 is a schematic diagram showing another abrasive liquid supply system.
Figure 48:
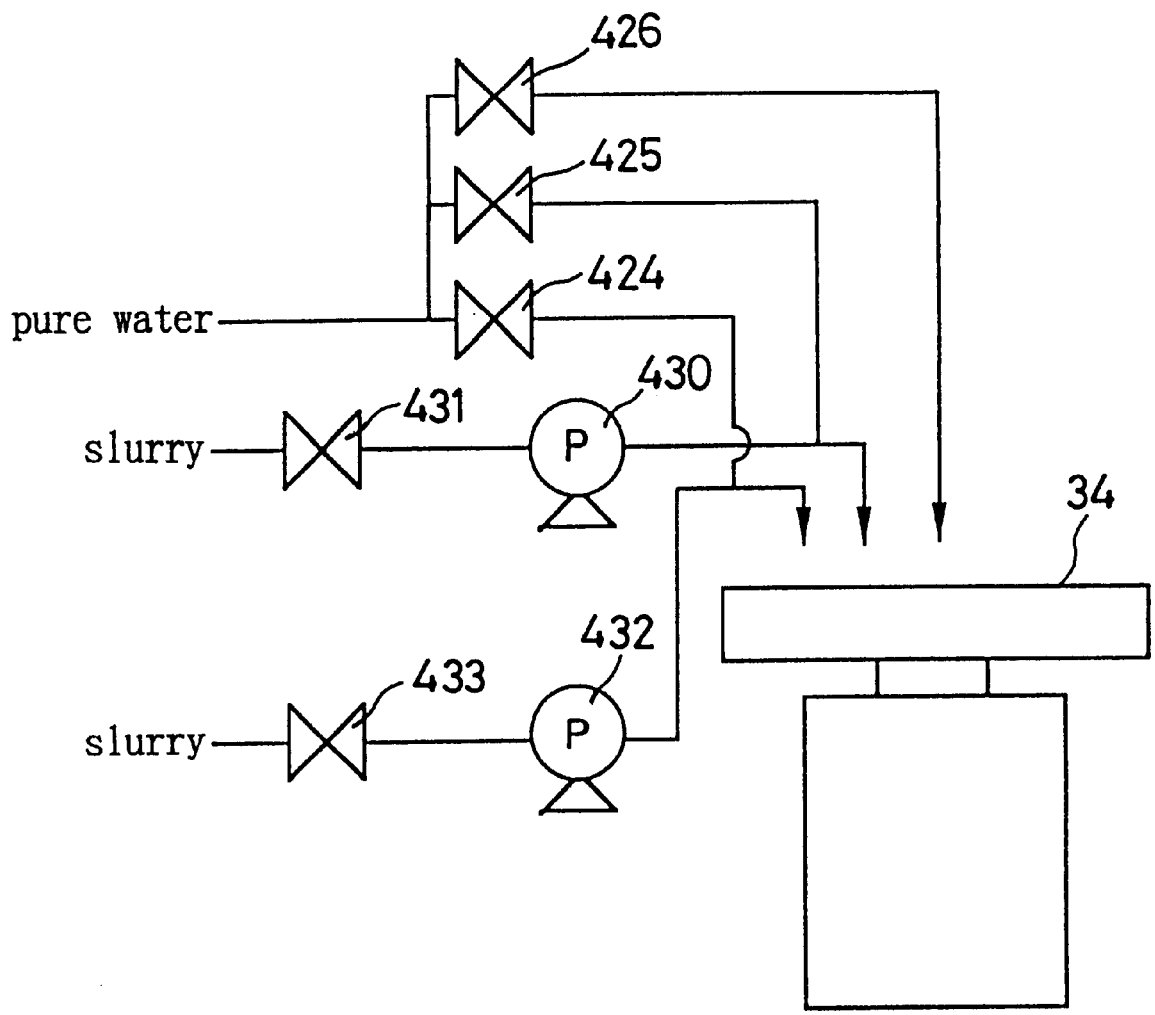
FIG. 48 is a schematic diagram showing still another abrasive liquid supply system.

FIGS. 46 through 48 show various abrasive liquid supply systems.

The polishing apparatus has a plurality of polishing surfaces to which a plurality of slurries or abrasive liquids can be supplied. There are a plurality of abrasive liquid supply systems including a system for stably supplying an abrasive liquid at a flow rate required for a polishing process from an external source, a system for supplying an abrasive liquid under a pressure which is not controlled at a constant level, at a flow rate which is not controlled at a constant level, and a system for drawing an abrasive liquid from an abrasive liquid tank installed outside of the polishing apparatus. If the abrasive liquid is supplied stably, then as shown in FIGS. 46 and 47, three-way valves are connected to primary inlet ports of supply lines for the abrasive liquid, and when no abrasive liquid is to be supplied to the polishing surface, a valve 420 out of the three-way valves is closed, and a valve 421 out of the three-way valves is opened to return the abrasive liquid outside of the polishing apparatus for circulation. When the abrasive liquid is to be supplied to the polishing surface, the valve 420 is opened and the valve 421 is closed.

In addition to the valves, pressure sensors are provided in the supply lines for the abrasive liquid to monitor the pressure of the abrasive liquid. If the pressure of the abrasive liquid is too high or no abrasive liquid is supplied, the detected pressure is used to interlock the process. Constant-rate valves may be provided downstream of the above valves for precisely controlling the flow rate of the abrasive liquid supplied to the polishing surface at positions near the polishing surface. The system may be constructed to control the constant-rate valves with electric signals to vary the flow rates of the abrasive liquid through the constant-rate valves, so that the flow rate of the supplied abrasive liquid may be varied each time a semiconductor wafer is polished, or a semiconductor wafer is polished in a stepwise manner by combining various rotational speeds and various flow rates.

After the polishing process, pure water may be supplied instead of the abrasive liquid to polish or clean the semiconductor wafer. Thus, pure water lines are provided to supply such pure water. The timing of supply of the pure water is controlled by opening and closing a valve 426. The pure water lines may be used to supply pure water to the polishing surface when the polishing cloth is to be dressed.

If the flow rate of the abrasive liquid to be supplied is not constant or the abrasive liquid is drawn from the tank disposed outside of the polishing apparatus, then as shown in FIG. 48, pumps 430 and 432 are provided in supply lines for the abrasive liquid. The pumps 430 and 432 should preferably comprise tubing pumps that are often used as medical equipment because they are small in size and can conveniently be used. The pumps 430 and 432 are effective to make the flow rate of the supplied abrasive liquid constant, vary the flow rate of the supplied abrasive liquid each time a semiconductor wafer is polished, or polish a semiconductor wafer in a stepwise manner by combining various rotational speeds and flow rates at different stages.

In order to mix two or more kinds of abrasive liquid or dilute the abrasive liquid with pure water immediately before the abrasive liquid is supplied to the polishing surface, valves 440 and 441 may be added as shown in FIG. 46. Constant-rate valves and pressure sensors may be incorporated in lines connected to these valves 440 and 441 for supplying the abrasive liquid at a freely varied concentration.

All the systems shown in FIGS. 46 through 48 include a flushing line and valves 424, 425 for removing any remaining abrasive liquid from the abrasive liquid supply lines with pure water so that such remaining abrasive liquid will not be dried and solidified. The valves 424 and 425 may be opened for a certain period of time to clean the supply lines each time the process of polishing a semiconductor wafer is finished, or at certain intervals while the polishing apparatus is waiting for a next process to begin.

Cleaning of the Semiconductor Wafer

FIG. 32 is a schematic view showing a cleaning operation of the semiconductor wafer and various devices for handling the semiconductor wafer. The semiconductor wafers which are transported by the rotary transporter 27, the pushers 30 and 30', the lifters 29 and 29', the top rings 32 and 33, and the reversing devices 28 and 28' are cleaned during their transportation conducted after polishing. The semiconductor wafer to which the abrasive liquid and the ground-off particles are attached during polishing is cleaned in an early stage, and unnecessary etching or oxidization by chemical component in the abrasive liquid is prevented. If the abrasive liquid or the ground-off particles are dried on the semiconductor wafer to adhere to the semiconductor wafer firmly, then they are difficult to be removed by cleaning. Thus, the semiconductor wafer is required to be transported to the cleaning apparatuses without being dried. The five units for transporting the semiconductor wafer are also required to be cleaned because they contact dirty semiconductor wafers.

The pusher 30 and 30' transport the semiconductor wafers between the top rings 32 and 33 and the rotary transporter 27, respectively. The semiconductor wafer to be polished is transported to the position above the pusher 30 or 30' by the rotary transporter 27. The pusher 30 or 30' transports the semiconductor wafer to the top ring 32 or 33. The semiconductor wafer which has been polished is transported form the top ring 32 or 33 to the rotary transporter 27 through the pusher 30 or 30'. The semiconductor wafer which has been polished has the abrasive liquid or the ground-off particles attached thereto, and hence the abrasive liquid or the ground-off particles tend to be attached to the pusher 30 or 30'. Therefore, if the pusher is not cleaned, the pusher contaminates subsequent semiconductor wafers to be polished. Further, if the pusher is not cleaned and is left as it is for a long period of time, the abrasive liquid or the ground-off particles are solidified to form large grains and such grains are attached to the semiconductor wafer. If the semiconductor wafer is polished in this state, the semiconductor wafer is damaged due to the attached grains. Therefore, it is necessary to clean the pusher 30 or 30', especially the stage of the pusher 30 or 30' for placing the semiconductor wafer thereon.

As shown in FIG. 32, a cleaning liquid such as pure water, chemicals, ionic water or ozone water is ejected from the spray nozzles 500. The cleaning is performed by ejecting the cleaning liquid from the nozzles 500, after the semiconductor wafer 101 which has been polished is received by the pusher 30 or 30', lowered, and then transferred to the rotary transporter 27 and further lowered until receiving a signal indicative of completion of lowering the pusher 30 or 30' from a sensor.

The rotary transporter 27 holds the semiconductor wafer thereon and transports the semiconductor wafer by its rotation between the transfer position with the lifter 29 or 29' and the transfer position with the pusher 30 or 30'. In the transfer of the semiconductor wafer after polishing, the semiconductor wafer to which the abrasive liquid or the ground-off particles are attached is transported, and hence the pins 201 and therearound are contaminated by the abrasive liquid or the ground-off particles. The semiconductor wafer which has been polished is transferred onto the pins 201 on the rotary transporter 27 by way of the pusher 30 or 30'. After the semiconductor wafer is transferred to the rotary transporter 27, a cleaning liquid such as pure water, chemicals, ionic water, or ozone water is supplied to the upper and lower surfaces of the semiconductor wafer to clean both surfaces of the semiconductor wafer. The spray nozzles 501, 502, 503 and 504 fixed to the polisher pans 80 and 80' or the partition wall 24 are used to supply the cleaning liquid, and the semiconductor wafer can be cleaned under a desired flow rate and a desired pressure of the cleaning liquid, and a desired angle of the nozzle. The cleaning of the upper and lower surfaces of the semiconductor wafer is simultaneously conducted, and an air operating valve for supplying a cleaning liquid may be shared. In this case, a pipe is branched at the downstream side of the outlet of the air operating valve, and the cleaning liquid from the branched pipes may be supplied to the upper and lower surfaces of the semiconductor wafer. Further, since the pattern surface of the semiconductor wafer faces downwardly, yield of the semiconductor wafer is improved if the lower surface of the semiconductor wafer is more intensively cleaned than the upper surface thereof.

Therefore, it is desirable that the nozzle for supplying to the lower surface of the semiconductor wafer can flow a larger amount of cleaning liquid than the nozzle for supplying to the upper surface of the semiconductor wafer, or the diameter of the pipe for supplying the cleaning liquid to the lower surface of the semiconductor wafer is larger than that of the pipe for supplying the cleaning liquid to the upper surface of the semiconductor wafer. It may also be possible that two air operating valves are discretely used for the upper surface and the lower surface of the semiconductor wafer.

Further, when the rotary transporter 27 does not hold the semiconductor wafer, the wafer support pins 201 may be cleaned by the above nozzle for cleaning the semiconductor wafer.

The lifters 29 and 29' transport the semiconductor wafer between the reversing device 28 and 28' and the rotary transporter 27, respectively. The semiconductor wafer to be polished is transferred to the reversing device 28 or 28' by the robot. The lifter 29 or 29' transfers the semiconductor wafer from the reversing device 28 or 28' to the rotary transporter 27. The semiconductor wafer which has been polished is transported by the rotary transporter 27 to the position above the lifter 29 or 29', and the semiconductor wafer is transferred to the reversing device 28 or 28' by the lifter 29 or 29'. The semiconductor wafer which has been polished is cleaned on the rotary transporter 27 so that the abrasive liquid or the ground-off particles may be removed. However, this cleaning is not sufficient to remove the abrasive liquid or the ground-off particles entirely, and thus the lifter 29 or 29' which transports the semiconductor wafer may be contaminated. Therefore, the stage 260 (see FIG. 30) for placing the semiconductor wafer thereon is required to be cleaned in the intervals between the transfer of the semiconductor wafer. In this case, the cleaning liquid such as pure water or chemicals may be sprayed from the spray nozzle 505. Particularly, it is effective to start cleaning of the polished semiconductor wafer 101 when the semiconductor wafer is transferred to the reversing device 28 or 28', the lifter 29 or 29' is lowered, and then the sensor 267 issues a signal indicative of the completion of lowering of the lifter 29 or 29'.

The top rings 32 and 33 are contaminated by the abrasive liquid or the ground-off particles in each polishing. Therefore, it is necessary that the top rings 32 and 33 are cleaned after removing the polished semiconductor wafer therefrom and before receiving a subsequent semiconductor wafer to be polished. After the semiconductor wafer is removed from the top ring 32 or 33, the wafer holding surface 32a or 33a is exposed. The wafer holding surface 32a or 33a is cleaned to remove the abrasive liquid or the ground-off particles before polishing the subsequent semiconductor wafer, thereby preventing the abrasive liquid or the ground-off particles from entering between the wafer holding surface 32a or 33a and the semiconductor wafer. As shown in FIG. 32, the cleaning liquid such as pure water, chemicals, ionic water, or ozone water is supplied from the spray nozzle 506 to the wafer holding surface 32a or 33a. Further, before the semiconductor wafer which has been polished is removed from the top ring 32 or 33 and transferred to the pusher 30 or 30', the pattern surface of the semiconductor wafer may be cleaned by the cleaning liquid supplied from the nozzle 506.

The reversing devices 28 and 28' reverse a semiconductor wafer during the transfer between the robot 20 and 21 and the lifter 30 and 30', respectively. Since the polished semiconductor wafer is subjected to only a simple cleaning operation before it is transported to the reversing device 28 or 28', while the semiconductor wafer stays in the reversing device 28 or 28', the cleaning liquid such as pure water, chemicals, ionic water, or ozone water is supplied to the semiconductor wafer from the spray nozzles 507 and 508. After the polished semiconductor wafer is transferred to the reversing device and reversed thereby, the semiconductor wafer faces the pattern surface upwardly. The reversed semiconductor wafer waits for the robot to which it will be transferred. In some cases, the reversed semiconductor wafer waits for the robot for a long period of time depending on processing time for polishing or cleaning. In such cases, the supply of the cleaning liquid is mainly to prevent the semiconductor wafer from being dried. Among the cleaning apparatuses 5, 6, 22 and 23, in the case where the cleaning time in one or more cleaning apparatuses is extremely longer than the polishing time, the semiconductor wafer 101 may stay in the stages 211 or 213 (see FIG. 31) on the rotary transporter 27. In this case also, the spray nozzles 503 and 504 may be used for supplying the cleaning liquid for preventing the semiconductor wafer on the rotary transporter 27 from being dried.

In the above, the cleaning in the rotary transporter and the various units around the rotary transporter has been described. In summary, the semiconductor wafer which has been polished is cleaned in the following sequence:

1) cleaning on the top ring 32 or 33
2) cleaning on the rotary transporter 27
3) cleaning in the reversing device 28 or 28'

In order to prevent the semiconductor wafer from being subjected to unnecessary etching or oxidization by the abrasive liquid, it is desirable that the cleaning by chemicals is conducted immediately after completing the polishing of the semiconductor wafer. Therefore, it is more effective to clean the semiconductor wafer on the top ring or the rotary transporter by chemicals than pure water.

In contrast thereto, cleaning in the reversing device is conducted for preventing the semiconductor wafer from being dried rather than cleaning, because the semiconductor wafer is cleaned beforehand to some degree.

Therefore, if semiconductor wafers are cleaned on the top ring and the rotary transporter with chemicals, and in the reversing device with pure water, then the semiconductor wafers can be cleaned optimally at a minimized cost.

If a certain time elapses to clean semiconductor wafers on the top ring and the rotary transporter, it directly affects the processing time for semiconductor wafers. However, the cleaning of semiconductor wafers in the reversing device during the waiting time does not affect the processing time of the polishing apparatus. Accordingly, it is preferable to apply cleaning water on the top ring and the rotary transporter intensively in a short time, and to clean semiconductor wafers in the reversing device with pure water at a rate enough to prevent the semiconductor wafers from being dried, e.g., to clean semiconductor wafers in the reversing device intermittently with pure water.

According to the present invention, the polishing apparatus can change transfer routes to comply with the required cleaning processes for maintaining a desired number of cleaning stages depending on various polishing processes without reducing the processing capability per unit installation area, and also to shorten the processing time of each of the cleaning processes by assigning the cleaning process which needs a long period of time to at least two cleaning apparatuses, for thereby increasing the number of processed workpieces per unit time, i.e., throughput.

Furthermore, it is possible to shorten the time required to transfer a workpiece to be polished, such as a semiconductor wafer, to the top ring, for thereby greatly increasing the number of processed workpieces per unit time, i.e., throughput.

Moreover, inasmuch as polished workpieces can wait while being processed in cleaning processes, a plurality of cleaning processes having different processing times can be performed parallel to each other on a plurality of polished workpieces. Specifically, the transfer routes will not be blocked by the cleaning processes which need a long period of time, and polished workpieces can be supplied uninterruptedly to the cleaning processes.

In addition, since chambers in which cleanliness of atmosphere is different from one another are separated by partitions, the atmosphere in a contaminated chamber is prevented from flowing into a clean chamber and hence from lowering the cleanliness in the clean chamber.

Although certain preferred embodiments of the present invention have been shown and described in detail, it should be understood that various changes and modifications may be made therein without departing from the scope of the appended claims.

What is claimed is:

1. A polishing apparatus comprising:
   a polishing section for polishing a workpiece, said polishing section being arranged to polish a workpiece while a surface thereof being polished is directed downwardly;
   a cleaning section including a plurality of cleaning apparatuses for cleaning a polished workpiece in plural-stage cleaning; and
   a reversing device for reversing a workpiece which has been polished and is to be cleaned;
   said cleaning section being arranged to clean the polished workpiece in first-stage cleaning while a polished surface thereof is directed upwardly.

2. A polishing apparatus according to claim 1, wherein in said first-stage cleaning, both surfaces of the workpiece are cleaned.

3. A polishing apparatus comprising:
   a loading and unloading section for supplying a workpiece to be polished and receiving a polished workpiece;
   a polishing section for polishing a workpiece; and
   a workpiece station having a workpiece support for holding a workpiece in a standby state after a workpiece to be polished is supplied from said loading and unloading section and before a polished workpiece is received by said loading and unloading section, wherein said workpiece support is provided with a detecting sensor for detecting whether or not a workpiece is present in said workpiece support.

4. A polishing apparatus according to claim 3, wherein said workpiece station has a nozzle for supplying a cleaning liquid to the workpiece in the standby state to prevent the workpiece from being dried.

5. A polishing apparatus according to claim 3, and further comprising:
   a turntable having a polishing surface; and
   a cassette for housing a plurality of workpieces, said workpiece station being disposed between said turntable and said cassette and having said workpiece support for holding the workpiece to be polished in the standby state before the workpiece is transferred to said turntable.

6. A polishing apparatus according to claim 5, wherein said workpiece station has said workpiece support for holding the polished workpiece in the standby state before the workpiece is transferred to said cassette.

7. A polishing apparatus according to claim 6, wherein said workpiece station includes at least two workpiece supports for holding the workpieces to be polished in a standby state and at least two workpiece supports for holding polished workpieces in a standby state, said two workpiece supports for holding the workpieces to be polished being spaced horizontally from each other, said two workpiece supports for holding the polished workpieces being disposed below said two workpiece supports for holding the workpieces to be polished.

8. A polishing apparatus according to claim 7, wherein said two workpiece supports for holding the polished workpieces are vertically spaced from each other and located at an intersection between areas where two transfer robots can transfer the workpieces.

9. A polishing apparatus according to claim 7, wherein said two workpiece supports for holding the polished workpieces are vertically spaced from each other as upper and lower workpiece supports, said upper workpiece support being capable of holding a workpiece which has been cleaned at least once by at least one of a plurality of cleaning apparatuses in a standby state, said lower workpiece support being capable of holding a workpiece to be cleaned by at least one of said plurality of cleaning apparatuses in a standby state.

10. A polishing apparatus according to claim 5, wherein said workpiece station has a shutter for separating an area including said cassette and an area including cleaning apparatuses from each other.

11. A polishing apparatus according to claim 3, wherein said workpiece station has at least one said workpiece support for dedicatedly holding the workpiece to be polished in a standby state and at least one said workpiece support for dedicatedly holding the polished workpiece in a standby state.

12. A polishing apparatus according to claim 3, wherein said detecting sensor comprises a transmission type light sensor.

13. A polishing apparatus comprising:
   a polishing section for polishing a workpiece;
   a plurality of cleaning apparatuses for cleaning the workpieces;

a robot for transferring the workpiece between said plurality of cleaning apparatuses; and a partition for partitioning said cleaning apparatuses and said robot such that while at least one of said cleaning apparatuses is in operation, an other of said cleaning apparatuses is capable of being serviced for maintenance.

14. A polishing apparatus according to claim 13, and further comprising:

a loading and unloading section for supplying a workpiece to be polished and receiving a polished workpiece; and chambers separated by partitions having respective openings for allowing the workpiece to pass therethrough, said loading and unloading section, said polishing section, and said cleaning apparatuses being housed in said chambers.

15. A polishing apparatus according to claim 14, wherein air pressures in said chambers are controllable independently of each other.

16. A polishing apparatus according to claim 14, wherein said loading and unloading section is capable of placing a plurality of cassettes for housing a plurality of workpieces to be polished, and has partitions separating the cassettes from each other.

17. A polishing apparatus according to claim 16, wherein said loading and unloading section is capable of placing at least four cassettes for housing a plurality of workpieces to be polished, and said polishing apparatus is capable of processing the workpieces housed in at least two of said four cassettes in parallel to each other.

18. A polishing apparatus according to claim 13, wherein a plurality of polishing sections, including said polishing section, are provided, said plurality of polishing sections being separated by at least one partition.

19. A polishing apparatus according to claim 18, wherein while at least one of said polishing sections is in operation, an other of said polishing sections is capable of being served for maintenance.

20. A polishing apparatus according to claim 13, further comprising a shutter between said robot and each of said cleaning apparatuses.

21. A polishing apparatus comprising:

a plurality of polishing tables having respective polishing surfaces;

a plurality of top rings for holding workpieces and pressing the workpieces against said polishing surfaces to polish the workpieces; and a plurality of cleaning apparatuses for cleaning polished workpieces;

said polishing surfaces including a polishing surface for primarily polishing the workpiece and a polishing surface for finish polishing the workpiece;

wherein at least one of said polishing surfaces comprises a polishing cloth, and at least one of said polishing surfaces comprises an abrading plate; and wherein a workpiece is polished in a first stage by the polishing surface comprising an abrading plate, and thereafter polished in a second stage by the polishing surface comprising a polishing cloth.

22. A polishing apparatus according to claim 21, wherein said polishing tables include at least two polishing tables having different diameters.

23. A polishing apparatus according to claim 21, further comprising a dresser for dressing said abrading plate.

24. A polishing apparatus according to claim 21, further comprising a dresser for dressing said polishing cloth.

25. A polishing apparatus according to claim 21, wherein the workpiece is cleaned between said first stage polishing and said second stage polishing.

26. A polishing apparatus according to claim 21, wherein at least one of said polishing tables comprises a rotating-type turntable.

27. A polishing apparatus comprising:

a loading and unloading section for supplying a workpiece to be polished and receiving a polished workpiece;

a polishing table having a polishing surface;

a top ring for holding a workpiece and pressing the workpiece against said polishing surface to polish the workpiece; and a workpiece station having a workpiece support for holding a workpiece in a standby state after a workpiece is supplied from said loading and unloading section and before a polished workpiece is received by said loading and unloading section, wherein said workpiece support comprises a guide block for centering the workpiece.

28. A polishing apparatus according to claim 27, wherein said guide block comprises a positioning taper for centering the workpiece.

29. A polishing apparatus comprising:

a loading and unloading section for supplying a workpiece to be polished and receiving a polished workpiece;

a polishing unit for polishing a workpiece;

a workpiece station having a workpiece support for holding a workpiece in a standby state after a workpiece to be polished is supplied from said loading and unloading section and before a polished workpiece is received by said loading and unloading section;

a robot for transferring the workpiece from said loading and unloading section to said workpiece station; and another robot for picking up the workpiece from said workpiece station.

* * * * *